(12) United States Patent
Chung

(10) Patent No.: US 8,576,602 B2
(45) Date of Patent: Nov. 5, 2013

(54) ONE-TIME PROGRAMMABLE MEMORIES USING POLYSILICON DIODES AS PROGRAM SELECTORS

(76) Inventor: Shine C. Chung, San Jose, CA (US)

( * ) Notice: Subject to any disclaimer, the term of this patent is extended or adjusted under 35 U.S.C. 154(b) by 147 days.

(21) Appl. No.: 13/026,664

(22) Filed: Feb. 14, 2011

(65) Prior Publication Data
US 2012/0044738 A1    Feb. 23, 2012

Related U.S. Application Data

(60) Provisional application No. 61/375,653, filed on Aug. 20, 2010, provisional application No. 61/375,660, filed on Aug. 20, 2010.

(51) Int. Cl.
*G11C 17/00* (2006.01)

(52) U.S. Cl.
USPC .............................. 365/96; 365/94; 365/225.7

(58) Field of Classification Search
USPC .................................. 365/84, 96, 100, 225.7
See application file for complete search history.

(56) References Cited

U.S. PATENT DOCUMENTS

| | | | |
|---|---|---|---|
| 3,198,670 A | 8/1965 | Nissim | |
| 6,243,864 B1 | 6/2001 | Odani et al. | |
| 6,400,540 B1 | 6/2002 | Chang | |
| 6,405,160 B1 | 6/2002 | Djaja et al. | |
| 6,483,734 B1 | 11/2002 | Sharma et al. | |
| 6,813,705 B2 | 11/2004 | Duesterwald et al. | |
| 6,970,988 B1 | 11/2005 | Chung | |
| 7,212,432 B2 | 5/2007 | Ferrant et al. | |
| 7,391,064 B1 | 6/2008 | Tripsas et al. | |
| 7,461,371 B2 | 12/2008 | Luo et al. | |
| 7,696,017 B1 | 4/2010 | Tripsas et al. | |
| 7,764,532 B2 * | 7/2010 | Kurjanowicz et al. | 365/96 |
| 7,802,057 B2 | 9/2010 | Iyer et al. | |
| 7,833,823 B2 | 11/2010 | Klersy | |

(Continued)

FOREIGN PATENT DOCUMENTS

| CN | 101057330 A | 10/2007 |
|---|---|---|
| CN | 101483062 A | 7/2009 |

OTHER PUBLICATIONS

Office Action for U.S. Appl. No. 13/397,673, mailed Dec. 18, 2012.

(Continued)

*Primary Examiner* — Gene Auduong

(57) ABSTRACT

Polysilicon diodes fabricated in standard CMOS logic processes can be used as program selectors for One-Time Programmable (OTP) devices, using electrical fuse, contact/via fuse, contact/via anti-fuse, or gate-oxide breakdown anti-fuse etc. as OTP element The diode can be constructed by P+/N+ implants on a polysilicon as a program selector. The OTP device has an OTP element coupled to a polysilicon diode. The OTP devices can be used to construct a two-dimensional OTP memory with the N-terminals of the diodes in a row connected as a wordline and the OTP elements in a column connected as a bitline. By applying a high voltage between a selected bitline and a selected wordline to turn on a diode in a selected cell for suitable duration of time, a current flows through an OTP element may change the resistance state. The cell data in the OTP memory can also be read by turning on a selected wordline and to couple a selected bitline to a sense amplifier. The wordlines may have high-resistivity local wordlines coupled to low-resistivity global wordlines through conductive contact(s) or via(s).

21 Claims, 34 Drawing Sheets

(56) References Cited

U.S. PATENT DOCUMENTS

| | | | |
|---|---|---|---|
| 7,889,204 B2 | 2/2011 | Hansen et al. | |
| 8,089,137 B2 | 1/2012 | Lung et al. | |
| 8,168,538 B2 | 5/2012 | Chen et al. | |
| 8,179,711 B2 | 5/2012 | Kim et al. | |
| 8,183,665 B2 | 5/2012 | Bertin et al. | |
| 8,217,490 B2 | 7/2012 | Bertin et al. | |
| 8,482,972 B2 | 7/2013 | Chung | |
| 8,488,359 B2 | 7/2013 | Chung | |
| 8,488,364 B2 | 7/2013 | Chung | |
| 8,514,606 B2 | 8/2013 | Chung | |
| 2003/0135709 A1 | 7/2003 | Niles et al. | |
| 2003/0169625 A1 | 9/2003 | Hush et al. | |
| 2004/0057271 A1 | 3/2004 | Parkinson | |
| 2004/0113183 A1 | 6/2004 | Karpov et al. | |
| 2005/0060500 A1 | 3/2005 | Luo et al. | |
| 2005/0146962 A1 | 7/2005 | Schreck | |
| 2006/0072357 A1 | 4/2006 | Wicker | |
| 2006/0092689 A1 | 5/2006 | Braun et al. | |
| 2006/0104111 A1 | 5/2006 | Tripsas et al. | |
| 2006/0129782 A1 | 6/2006 | Bansai et al. | |
| 2007/0081377 A1 | 4/2007 | Zheng et al. | |
| 2007/0133341 A1 | 6/2007 | Lee et al. | |
| 2008/0220560 A1 | 9/2008 | Klersy | |
| 2009/0055617 A1 | 2/2009 | Bansai et al. | |
| 2009/0168493 A1 | 7/2009 | Kim et al. | |
| 2009/0172315 A1 | 7/2009 | Iyer et al. | |
| 2009/0180310 A1 | 7/2009 | Shimomura et al. | |
| 2009/0194839 A1 | 8/2009 | Bertin et al. | |
| 2010/0091546 A1 | 4/2010 | Liu et al. | |
| 2010/0142254 A1 | 6/2010 | Choi et al. | |
| 2010/0171086 A1 | 7/2010 | Lung et al. | |
| 2010/0232203 A1 | 9/2010 | Chung et al. | |
| 2010/0277967 A1 | 11/2010 | Lee et al. | |
| 2010/0301304 A1 | 12/2010 | Chen et al. | |
| 2011/0128772 A1 | 6/2011 | Kim et al. | |
| 2011/0145777 A1 | 6/2011 | Iyer et al. | |
| 2011/0260289 A1 | 10/2011 | Oyamada | |
| 2011/0297912 A1 | 12/2011 | Samachisa et al. | |
| 2011/0312166 A1 | 12/2011 | Yedinak et al. | |
| 2012/0044736 A1 | 2/2012 | Chung | |
| 2012/0044737 A1 | 2/2012 | Chung | |
| 2012/0044739 A1* | 2/2012 | Chung | 365/96 |
| 2012/0044740 A1* | 2/2012 | Chung | 365/96 |
| 2012/0044743 A1 | 2/2012 | Chung | |
| 2012/0044744 A1 | 2/2012 | Chung | |
| 2012/0044745 A1 | 2/2012 | Chung | |
| 2012/0044746 A1 | 2/2012 | Chung | |
| 2012/0044747 A1 | 2/2012 | Chung | |
| 2012/0044748 A1 | 2/2012 | Chung | |
| 2012/0044753 A1 | 2/2012 | Chung | |
| 2012/0044756 A1 | 2/2012 | Chung | |
| 2012/0044757 A1 | 2/2012 | Chung | |
| 2012/0044758 A1 | 2/2012 | Chung | |
| 2012/0047322 A1 | 2/2012 | Chung | |
| 2012/0106231 A1 | 5/2012 | Chung | |
| 2012/0147653 A1 | 6/2012 | Chung | |
| 2012/0147657 A1 | 6/2012 | Sekar et al. | |
| 2012/0209888 A1 | 8/2012 | Chung | |
| 2012/0224406 A1 | 9/2012 | Chung | |
| 2012/0314472 A1 | 12/2012 | Chung | |
| 2012/0314473 A1 | 12/2012 | Chung | |
| 2012/0320656 A1 | 12/2012 | Chung | |
| 2012/0320657 A1 | 12/2012 | Chung | |
| 2013/0148409 A1 | 6/2013 | Chung | |
| 2013/0200488 A1 | 8/2013 | Chung | |
| 2013/0201745 A1 | 8/2013 | Chung | |
| 2013/0201746 A1 | 8/2013 | Chung | |
| 2013/0201748 A1 | 8/2013 | Chung | |
| 2013/0201749 A1 | 8/2013 | Chung | |
| 2013/0215663 A1 | 8/2013 | Chung | |

OTHER PUBLICATIONS

Office Action for U.S. Appl. No. 13/026,840, mailed Dec. 31, 2012.
Office Action for U.S. Appl. No. 13/026,852, mailed Jan. 14, 2013.
Office Action for U.S. Appl. No. 13/026,783, mailed Sep. 27, 2012.
Restriction Requirement for U.S. Appl. No. 13/026,835, mailed Dec. 12, 2012.
U.S. Appl. No. 13/471,704, filed May 15, 2012.
U.S. Appl. No. 13/026,650, filed Jan. 14, 2011.
U.S. Appl. No. 13/026,656, filed Feb. 14, 2011.
U.S. Appl. No. 13/026,678, filed Feb. 14, 2011.
U.S. Appl. No. 13/026,692, filed Feb. 14, 2011.
U.S. Appl. No. 13/026,704, filed Feb. 14, 2011.
U.S. Appl. No. 13/026,717, filed Feb. 14, 2011.
U.S. Appl. No. 13/026,725, filed Feb. 14, 2011.
U.S. Appl. No. 13/026,752, filed Feb. 14, 2011.
U.S. Appl. No. 13/026,771, filed Feb. 14, 2011.
U.S. Appl. No. 13/026,783, filed Feb. 14, 2011.
U.S. Appl. No. 13/026,835, filed Feb. 14, 2011.
U.S. Appl. No. 13/026,840, filed Feb. 14, 2011.
U.S. Appl. No. 13/026,852, filed Feb. 14, 2011.
U.S. Appl. No. 13/214,198, filed Aug. 21, 2011.
U.S. Appl. No. 13/214,183, filed Aug. 20, 2011.
U.S. Appl. No. 13/288,843, filed Nov. 3, 2011.
U.S. Appl. No. 13/314,444, filed Dec. 8, 2011.
U.S. Appl. No. 13/397,673, filed Feb. 15, 2012.
U.S. Appl. No. 13/571,797, filed Aug. 10, 2012.
U.S. Appl. No. 13/590,044, filed Aug. 20. 2012.
U.S. Appl. No. 13/590,047, filed Aug. 20. 2012.
U.S. Appl. No. 13/590,049, filed Aug. 20. 2012.
U.S. Appl. No. 13/590,050, filed Aug. 20. 2012.
U.S. Appl. No. 13/678,539, filed Nov. 15, 2012.
U.S. Appl. No. 13/678,544, filed Nov. 15, 2012.
U.S. Appl. No. 13/678,541, filed Nov. 15, 2012.
U.S. Appl. No. 13/678,543, filed Nov. 15, 2012.
Ahn, S.J. et al, "Highly Reliable 50nm Contact Cell Technology for 256Mb PRAM," IEEE VLSI Tech Symp., Jun. 2005, pp. 98-99.
Alavi, Mohsen, et al., "A PROM Element Based on Salicide Allgomeration of Poly Fuses in a CMOS Logic Process," IEEE IEDM, 97, pp. 855-858.
Andre, T. W. et al., "A 4-Mb 0.18um 1T1MTJ Toggle MRAM With Balanced Three Input Sensing Scheme and Locally Mirrored Unidirectional Write Drivers," IEEE J. of Solid-State Circuits, vol. 40, No. 1, Jan. 2005, pp. 301-309.
Ang, Boon et al., "NiSi Polysilicon Fuse Reliability in 65nm Logic CMOS Technology," IEEE Trans. on Dev. Mat. Rel. vol. 7, No. 2, Jun. 2007, pp. 298-303.
Aziz, A. et al., "Lateral Polysilicon n+p. Diodes: Effect of the Grain boundaries and of the p-Implemented Doping Level on the I-V and C-V Characteristics, "Springer Proceedings in Physics, vol. 54, 1991, pp. 318-322.
Aziz, A. et al., "Lateral Polysilicon PN Diodes: Current-Voltage Characteristics Simulation Between 200K and 400K a Numerical Approach," IEEE Trans. On Elec. Dev., vol. 41, No. 2, Feb. 1994, pp. 204-211.
Banerjee, Kaustav et al., "High Current Effects in Silicide Films for Sub-0.25um VLSI Technologies," IEEE 36th IRPS, 1998, pp. 284-292.
Bedeschi, F. et al., "4-Mb MOSFET-Selected uTrench Phase-Change Memory Experimental Chip," IEEE J. of Solid-State Circuits, vol. 40, No. 7, Jul. 2005, pp. 1557-1565.
Bedeschi, F. et al., "A Bipolar-Selected Phase Change Memory Featuring Multi-Level Cell Storage," IEEE J. Sol. Stat. Cir., vol. 44, No. 1, Jan. 2009, pp. 217-227.
Bedeschi, F. et al., "A Fully Symmetrical Sense Amplifier for Non-volatile Memories," IEEE. Int. Symp. On Circuits and Systems, (ISCAS), vol. 2, 2004, pp. 625-628.
Bedeschi, F. et al., "An 8Mb Demonstrator for High-Density 1.8V Phase-Change Memories," VLIS Cir. Symp, Jun. 2004, pp. 442-445.
Bedeschi, F. et al., "Set and Reset Pulse Characterization in BJT-Selected Phase-Change Memory," IEEE Int. Symp. On Circuits and Systems (ISCAS), 2005, pp. 1270-1273.
Braganca, P. M. et al., "A Three-Terminal Approach to Developing Spin-Torque Written Magnetic Random Access Memory Cells," IEEE Trans. on Nano. vol. 8, No. 2, Mar. 2009, pp. 190-195.

(56) References Cited

OTHER PUBLICATIONS

Cagli, C. et al., "Evidence for threshold switching in the set process of NiO-based RRAM and physical modeling for set, reset, retention and disturb prediction," IEEE IEDM, 2008, pp. 1-4.
Chan, W. T. et al., "CMOS Compatible Zero-Mask One-Time Programmable (OTP) Memory Design," Proc. Int. Conf. Solid State Integr. Cir. Tech., Beijing, China, Oct. 20-23, 2008. pp. 861-864.
Chan, Wan Tim, et al., "CMOS Compatible Zero-Mask One Time Programmable Memory Design", Master Thesis, Hong-Kong University of Science and Technologies, 2008.
Chang, Meng-Fan et al., "Circuit Design Challenges in Embedded Memory and Resistive RAM (RRAM) for Mobile SoC and 3D-IC", Design Automation Conference (ASP-DAC), 16th Asia and South Pacific, 2011, pp. 197-203.
Cheng, Yu-Hsing et al., "Failure Analysis and Optimization of Metal Fuses for Post Package Trimming," IEEE 45th IRPS, 2007, pp. 616-617.
Chiu, Pi-Feng et al., "A Low Store Energy, Low VDDmin, Nonvolatile 8T2R SRAM with 3D Stacked RRAM Devices for Low Power Mobile Applications," IEEE VLSI Cir./Tech Symp., Jun. 2010, pp. 229-230.
Cho, Woo Yeong et al., "A 0.18um 3.0V 64Mb Non-Volatile Phase-Transition Random-Access Memory (PRAM)," ISSCC, Feb. 2004, Sec. 2-1.
Choi, Sang-Jun et al., "Improvement of CBRAM Resistance Window by Scaling Down Electrode Size in Pure-GeTe Film," IEEE Elec. Dev., vol. 30, No. 2, Feb. 2009, pp. 120-122.
Choi, Youngdon et al., "A 20nm 1.8V 8Gb PRAM with 40MB/s Program Bandwidth," IEEE ISSCC, 2012, pp. 46-47.
Chung, S. et al., "A 1.25um$^2$ Cell 32Kb Electrical Fuse Memory in 32nm CMOS with 700mV Vddmin and Parallel/Serial Interface," VLSI Cir. Symp., Jun. 2009, pp. 30-31.
Chung, S. et al., "A 512×8 Electrical Fuse Memory with 15um$^2$ Cells Using 8-sq Asymmetrical Fuse and Core Devices in 90nm CMOS," VLSI Cir. Symp., Jun. 2007, pp. 74-75.
Crowley, Matthew et al., "512Mb PROM with 8 Layers of Antifuse/Diode Cells," IEEE ISSCC 2003, Sec. 16.4.
De Sandre, Guido et al., "A 4Mb LV MOS-Selected Embedded Phase Change Memory in 90nm Standard CMOS Technology," IEEE J. Sol. Stat. Cir, vol. 46. No. 1, Jan. 2011, pp. 52-63.
De Sandre, Guido et al., "A 90nm 4Mb Embedded Phase-Change Memory with 1.2V 12ns Read Access Time and 1MB/s Write Throughput," ISSCC 2010, Sec. 14.7.
Desikan, Rajagopalan et al., "On-Chip MRAM as a High-Bandwidth Low-Latency Replacement for DRAM Physical Memories," Tech Report TR-02-47, Dept. Of Computer Science, University of Texas, Austin, Sep. 27, 2002, 18 pages.
Dietrich, Stefan et al., "A Nonvolatile 2-Mbit CBRAM Memory Core Featuring Advanced Read and Program Control," IEEE J. of Solid-Stat Cir., vol. 42, No. 4, Apr. 2007, pp. 839-845.
Dion, Michael J., "Reservoir Modeling for Electromigration Improvement of Metal Systems with Refractory Barriers," IEEE 39th IRPS, 2001, pp. 327-333.
Doorn, T. S. et al., "Ultra-fast Programming of Silicided Polysilicon Fuses Based on New Insights in the Programming Physics," IEEE IEDM, 2005, pp. 667-670.
Doorn, T. S., "Detailed Qualitative Model for the Programming Physics of Silicided Polysilicon Fuses," IEEE Trans. on Elec. Dev. vol. 54, No. 12, Dec. 2007, pp. 3285-3291.
Durlam, M. et al., "A 1-Mbit MRAM Based on 1T1MTJ Bit Cell Integrated With Copper Interconnects," IEEE J. of Solid-State Circuits, vol. 38, No. 5, May 2003, pp. 769-773.
Engel, B. et al., "The Science and Technology of Magnetoresistive Tunnel Memory," IEEE Tran. on Nanotechnology, vol. 1, No. 1, Mar. 2002, pp. 32-38.
Engel, B.N. et al., "A 4Mb Toggle MRAM Based on a Novel bit and Switching Method," IEEE Trans. on Mag. vol. 41, No. 1, Jan. 2005, pp. 132-136.
Fellner, Johannes, et al., "Lifetime Study for a Poly Fuse in a 0.35um Polycide CMOS Process," IEEE 43rd IRPS, 2005, pp. 446-449.

Gao, B. et al., "Oxide-Based RRAM: Uniformity Improvement Using A New Material-Oriented Methodology," IEEE VLSI Tech. Symp., Jun. 2009, pp. 30-31.
Gao, B. et al., "Oxide-Based RRAM Switching Mechanism: A New Ion-Transport-Recombination Model," IEDM, Dec. 2008, pp. 563-566.
Gill, M. et al., "Ovonic Unified Memory-A High Performance Nonvolatile Memory Technology for Stand-Alone Memory and Embedded Applications," IEEE, ISSCC Dig. of Tech. Paper, Feb. 2002, pp. 202-203.
Gogl, D. et al., "A 16-Mb MRAM Featuring Bootstrapped Write Drivers," IEEE J. of Solid-State Circuits, vol. 40, No. 4, Apr. 2005, pp. 902-908.
Gopalan, C. et al., Demonstration of Conductive Bridging Random Access Memory (CBRAM) in Logic CMOS Process, IEEE Int. Memory Workshop, 2010, pp. 1-4.
Ha, Daewon and Kim, Kinam, "Recent Advances in High Density Phase Change Memory (PRAM)," IEEE VLSI Tech. Symp. Jun. 2007.
Hosoi, Y. et al., "High Speed Unipolar Switching Resistance RAM (RRAM) Technology," IEEE IEDM, Dec. 2006, pp. 1-4.
Hosomi, M. et al., "A Novel Nonvolatile Memory with Spin Torque Transfer Magnetization Switching: Spin-RAM," IEEE IEDM Dig. of Tech. Paper, Dec. 2005, pp. 459-463.
Huang, Chia-En et al., "A New CMOS Logic Anti-Fuse Cell with Programmable Contact," IEEE IEDM Tech. Dig. 2007, pp. 48-51.
Im, Jay et al., "Characterization of Silicided Polysilicon Fuse Implemented in 65nm CMOS Technology,"7th Annual Non-Volatile Memory Technology Symp, (NVMTS) 2006, pp. 55-57.
Jin, Li-Yan et al., "Low-Area 1-Kb Multi-Bit OTP IP Design," IEEE 8th Int. Conf. On ASIC (ASICON), 2009, pp. 629-632.
Johnson, Mark et al., "512Mb PROM with a Three-Dimensional Array of Diode/Antifuse Memory Cells," IEEE J. of Sol. Stat. Cir., vol. 38, No. 11, Nov. 2003, pp. 1920-1928.
Kalnitsy, Alexander et al., "CoSi$^2$ Integrated Fuses on Poly Silicon for Low Voltage 0.18um CMOS Applications," IEEE IEDM 1999, pp. 765-768.
Kang, Han-Byul et al., "Electromigration of NiSi Poly Gated Electrical Fuse and Its Resistance Behaviors Induced by High Temperature," IEEE IRPS, 2010, pp. 265-270.
Kang, Sangbeom et al., "A 0.1um 1.8V 256Mb Phase-Change Random Access Memory (PRAM) with 66Mhz Synchronous Burst-Read," IEEE J. of Sol. Stat. Cir., vol. 42, No. 1, Jan. 2007, pp. 210-218.
Kawhara, T. et al., "2Mb Spin-Transfer Torque RAM (SPRAM) with Bit-by-Bit Bidirectional Current Write and Parallelizing-Direction Current Read," IEEE ISSCC Dig. of Tech. Paper, Feb. 2007, pp. 480-481.
Ker, Ming-Dou et al., "High-Current Characterization of Polysilicon Diode for Electrostatic Discharge Protection in Sub-Quarter-Micron Complementary Metal Oxide Semiconductor Technology," Jpn. J. Appl. Phys. vol. 42 (2003) pp. 3377-3378.
Ker, Ming-Dou et al., "Ultra-High-Voltage Charge Pump Circuit in Low-Voltage Bulk CMOS Processes With Polysilicon Diodes," IEEE Trans. on Cir. And Sys.-II: Exp. Brief., vol. 54, No. 1, Jan. 2007, pp. 47-51.
Kim, Deok-Kee et al., "An Investigation of Electrical Current Induced Phase Transitions in the NiPtSi/Polysilicon System," J. App. Phy. 103, 073708 (2008).
Kim, I. S. et al., "High Performance PRAM Cell Scalable to sub-20nm Technology with below 4F2 Cell Size, Extendable to DRAM Applications," IEEE VLSI Tech Symp., Jun. 2010, pp. 203-204.
Kim, Jinbong et al., "3-Transistor Antifuse OTP ROM Array Using Standard CMOS Process," IEEE VLSI Cir. Symposium, Jun. 2003, pp. 239-242.
Kim, O. et al., "CMOS trimming circuit based on polysilicon fusing," Elec. Lett. vol. 34, No. 4, pp. 355-356, Feb. 1998.
Klee, V. et al., "A 0.13um Logic-Based Embedded DRAM Technology with Electrical Fuses, Cu Interconnect in SiLK, sub-7ns Random Access Time and its Extension to the 0.10um Generation," IEEE IEDM, 2001, pp. 407-410.

(56) References Cited

OTHER PUBLICATIONS

Kothandaramam, C. et al., "Electrically programmable fuse (eFUSE) using electromigration in silicides," IEEE Elec. Dev. Lett., vol. 23, No. 9, pp. 523-525, Sep. 2002.

Kulkarni, S. et al., "High-Density 3-D Metal-Fuse PROM Featuring 1.37um$^2$ 1T1R Bit Cell in 32nm High-K Metal-Gate CMOS Technology," VLSI Cir. Symp., Jun. 2009 pp. 28-29.

Kulkarni, S. et al., "A 4Kb Metal-Fuse OTP-ROM Macro Featuring a 2V Programmable 1.37um2 1T1R Bit Cell in 32nm High-K Metal-Gate CMOS," IEEE J. of Sol. Stat. Cir, vol., 45, No. 4, Apr. 2010, pp. 863-868.

Kund, Michael et al., "Conductive Bridging RAM (CBRAM): An Emerging Non-Volatile Memory Technology Scalable to Sub 20nm," IEEE IEDM 2005, pp. 754-757.

Lai, Han-Chao et al., "A 0.26um$^2$ U-Shaped Nitride-Based Programming Cell on Pure 90nm CMOS Technology," IEEE Elec. Dev. Lett. vol. 28, No. 9, Sep. 2007, pp. 837-839.

Lai, S., "Current Status of the Phase Change Memory and Its Future," IEEE IEDM Dig. of Tech. Paper, Dec. 2003, pp. 255-258.

Lee, H.Y. et al., "Low Power and High Speed Bipolar Switching with A Thin Reactive Ti Buffer Layer in Robust HfO2 Based RRAM," IEEE IEDM, 2008, pp. 1-4.

Lee, K.J., et al., "A 90nm 1.8V 512Mb Diode-Switch PRAM with 266MB/s Read Throughout," IEEE ISSCC, Dig. of Tech. Paper, Feb. 2007, 3 pgs.

Lee, Kwang-Jin et al., "A 90nm 1.8V 512Mb Diode-Switch PRAM with 266MB/s Read Throughput," IEEE J. of Sol. Stat. Cir., vol. 43, No. 1, Jan. 2008, pp. 150-162.

Lee, M.-J. et al., "Stack Friendly all-Oxide 3D RRAM Using GaInZnO Peripheral TFT Realized Over Glass Substrates," IEDM, Dec. 2008. pp. 1-4.

Lee, Man Chiu et al., "OTP Memory for Low Cost Passive RFID Tags," IEEE Conf. on Electron Devices and Solid-State Circuits (EDSSC), 2007, pp. 633-636.

Liaw, Corvin et al., "The Conductive Bridging Random Access Memory (CBRAM): A Non-volatile Multi-Level Memory Technology," 37$^{th}$ European Solid-State Device Research Conference (ESSDERC), 2007, pp. 226-229.

Lim, Kyunam et al., "Bit Line Coupling Scheme and Electrical Fuse Circuit for Reliable Operation of High Density Dram," IEEE VLSI Cir. Symp. Jun. 2001, pp. 33-34.

Maffitt, T. et al., "Design Considerations for MRAM," IBM J. Res. & Dev., vol. 50, No. 1, Jan. 2006, pp. 25-39.

Meng, X.Z. et al., "Reliability Concept for Electrical Fuses," IEE Proc.-Sci Meas. Technol., vol. 144, No. 2, Mar. 1997, pp. 87-92.

Min, Byung-Jun et al., "An Embedded Non-volatile FRAM with Electrical Fuse Repair Scheme and One Time Programming Scheme for High Performance Smart Cards," IEEE CICC, Nov. 2005, pp. 255-258.

Mojumder, N. N. et al., "Three-Terminal Dual-Pillar STT-MRAM for High Performance Robust Memory Applications," IEEE Trans. Elec. Dev. vol. 58, No. 5, May. 2011, pp. 1508-1516.

Morimoto, T. et al., "A NiSi Salicide Technology for Advanced Logic Devices," IEEE IEDM, Dec., 1991, pp. 653-656.

Neale, Ron, "PCM Progress Report No. 6 Afterthoughts," http://www.eetimes.com/General/PrintView/4236240, Feb. 13, 2012, 5 pages.

Nebashi, R. et al., "A 90nm 12ns 32Mb 2T1MTJ MRAM," IEEE ISSCC Dig. of Tech. Paper, Sess. 27.4, Feb. 2009, 3 pages.

Ng, K.P. et al., "Diode-Base Gate Oxide Anti-Fuse One-Time Programmable Memory Array in Standard CMOS Process," IEEE Int. Conf. of Elect. Dev. & Solid-Stat Cir. (EDSSC), Dec. 2009, pp. 457-460.

Ohbayashi, Shigeki et al., "A 65nm Embedded SRAM With Wafer Level Burn-In Mode, Leak-Bit Redundancy and Cu E-Trim Fuse for Known Good Die," IEEE J. of Solid. Stat. Cir., vol. 43, No. 1, Jan. 2008, pp. 96-108.

Oh, G. H. et al. "Parallel Multi-Confined (PMC) Cell Technology for High Density MLC PRAM," IEEE VLSI Tech. Symp., Jun. 2009, pp. 220-221.

Oh, J. H. et al., "Full Integration of Highly Manufacturable 512Mb PRAM Based on 90nm Technology," IEEE IEDM Dig. of Tech. Paper, Dec. 2006, pp. 1-4.

Osada, K. et al., "Phase Change RAM Operated with 1.5V CMOS as Low Cost Embedded Memory," IEEE CICC, Nov. 2005, pp. 431-434.

Park, Don et al., "Study on Reliability of Metal Fuse for Sub-100nm Technology," IEEE Int. Symp. On Semiconductor Manufacturing (ISSM), 2005, pp. 420-421.

Park, Jongwoo et al., "Phase Transformation of Programmed NiSi Electrical Fuse: Diffusion, Agglomeration, and Thermal Stability," 18$^{th}$ IEEE Int. Symp. On Physical and Failure Analysis of Integrated Circuits, (IPFA), 2011, pp. 1-7.

Park, Young-Bae et al., "Design of an eFuse OTP Memory of 8 Bits Based on a 0.35um BCD Process," Mobile It Convergence (ICMIC), 2011 Int. Conf. on, pp. 137-139.

Pellizzer, F. et al., "Novel uTrench Phase-Change Memory Cell for Embedded and Stand-alone Non-Volatile Memory Applications," IEEE VLSI Tech Symp. Jun. 2004, pp. 18-19.

Peng, J. et al., "A Novel Embedded OTP NVM Using Standard Foundry CMOS Logic Technology," IEEE 21$^{st}$ Non-Volatile Semiconductor Memory Workshop (NVSMW) 2006, pp. 24-26.

Rizzolo, R. F. et al., "IBM System z9 eFUSE applications and methodology," IBM J. RES. & DEV. vol. 51 No. ½ Jan./Mar. 2007, pp. 65-75.

Robson, Norm et al., "Electrically Programmable Fuse (eFuse) from Memory Redundancy to Autonomic Chips," IEEE CICC, 2007, pp. 799-804.

Russo, U. et al., "Conductive-Filament Switching Analysis and Self-Accelerated Thermal Dissolution Model for Reset in NiO-based RRAM," IEDM, Dec. 2007, pp. 775-778.

Safran, J. et al., "A Compact eFUSE Programmable Array Memory for SOI CMOS," VLSI Cir. Symp. Jun. 2007, pp. 72-73.

Sasaki, Takahiko et al., "Metal-Segregate-Quench Programming of Electrical Fuse," IEEE 43$^{rd}$ IRPS, 2005, pp. 347-351.

Schrogmeier, P. et al., "Time Discrete Voltage Sensing and Iterative Programming Control for a 4F$^2$ Multilevel CBRAM," VLSI Cir. Symp., Jun. 2007, pp. 186-187.

Sheu, Shyh-Shyuan et al., "A 5ns Fast Write Multi-Level Non-Volatile 1K-bits RRAM Memory with Advance Write Scheme," VLSI Cir. Symp., Jun. 2009, pp. 82-83.

Sheu, Shyh-Shyuan et al., "Fast-Write Resistive RAM (RRAM) for Embedded . Applications," IEEE Design & Test of Computers, Jan./Feb. 2011, pp. 64-71.

Shi, Min et al. "Zero-Mask Contact Fuse for One-Time-Programmable Memory in Standard CMOS Processes," IEEE Dev. Lett. vol. 32, No. 7, Jul. 2011, pp. 955-957.

Song, Y. J. et al., "Highly Reliable 256Mb PRAM with Advanced Ring Contact Technology and Novel Encapsulating Technology," IEEE VLSI Tech Symp., Jun. 2006, pp. 153-154.

Suto, Hiroyuki et al., "Programming Conditions for Silicided Poly-Si or Copper Electrically Programmable Fuses," IEEE IIRW Final Report, 2007, pp. 84-89.

Suto, Hiroyuki et al., "Study of Electrically Programmable Fuses Through Series es of I-V Measurements," IEEE IIRW Final Report, 2006, pp. 83-86.

Suto, Hiroyuki et al., "Systematic Study of the Dopant-Dependent Properties of Electrically Programmable Fuses With Silicide Poly-Si Links Through a Series of I-V Measurements," IEEE Trans. on Dev. Mat. Rel. vol. 7, No. 2, Jun. 2007, pp. 285-297.

Takaoka, H. et al., A Novel Via-fuse Technology Featuring Highly Stable Blow Operation with Large On-off Ratio for 32nm Node and Beyond, IEDM, 2007, pp. 43-46.

Tehrani, S. et al., "Magnetoresistive Random Access Memory Using Magnetic Tunnel Junction," Proc. of IEEE, vol. 91, No. 5, May 2003, pp. 703-714.

Tehrani, S. "Status and Outlook of MRAM Memory Technology," IEEE IEDM Dig. of Tech Paper., Dec. 2006, pp. 1-4.

Teichmann, J. et al., "One Time Programming (OTP) with Zener Diodes in CMOS Processes," 33$^{rd}$ Conf. on European Solid-State Device Research (ESSDERC), 2003, pp. 433-436.

Tian, C. et al., "Reliability Investigation of NiPtSi Electrical Fuse with Different Programming Mechanisms," IEEE IIRW Final Report, 2007, pp. 90-93.

(56) References Cited

OTHER PUBLICATIONS

Tian, C. et al., "Reliability Qualification of CoSi$_2$ Electrical Fuse for 90nm Technology," IEEE 44$^{th}$ IRPS, 2006, pp. 392-397.
Tian, Chunyan et al., "Reliability Investigation of NiPtSi Electrical Fuse with Different Programming Mechanisms," IEEE Trans. on Dev. Mat. Rel. vol. 8, No. 3, Sep. 2008, pp. 536-542.
Tonti, W. R. et al., "Product Specific Sub-Micron E-Fuse Reliability and Design Qualification," IEEE IIRW Final Report, 2003, pp. 36-40.
Tonti, W. R., "Reliability and Design Qualification of a Sub-Micro Tungsten Silicide E-Fuse," IEEE IRPS Proceedings, 2004, pp. 152-156.
Tonti, W. R., "Reliability, Design Qualification, and Prognostic Opportunity of in Die E-Fuse," IEEE Conference on Prognostics and Health Management (PHM), 2011, pp. 1-7.
Ueda, T. et al., "A Novel Cu Electrical Fuse Structure and Blowing Scheme utilizing Crack-assisted Mode for 90-45nm-node and beyond," IEEE VLSI Tech. Sym., Jun. 2006, 2 pages.
Ulman, G. et al., "A Commercial Field-Programmable Dense eFUSE Array Memory with 00.999% Sense Yield for 45nm SOI CMOS", ISSCC 2008/Session 22/Variation Compensation and Measurement/ 22.4, 2008 IEEE International Solid-State Circuits Conference, pp. 406-407.
Vimercati, Daniele et al., "A 45nm 1Gbit 1.8V PCM for Wireless and Embedded Applications," IEEE ISSCC Feb. 2010, 26 pages.
Vinson, J. E., "NiCr Fuse Reliability—A New Approach," Southcon/ 94, Conference Record, 1994, pp. 250-255.
Walko, J., "Ovshinsky's Memories," IEE Review, Issue 11, Nov. 2005, pp. 42-45.
Wang, J. P. et al., "The Understanding of Resistive Switching Mechansim in HfO2-Based Resistive Random Access Memory," IEDM, 2011, pp. 12.1.1-12.1.4.
Wikipedia, "Programmable read-only memory", http://en.wikipedia. org/wiki/Programmable_read-only_memory, downloaded Jan. 31, 2010, 4 pages.
Worledge, D.C., "Single-Domain Model for Toggle MRAM," IBM J. Res. & Dev. vol. 50, No. 1, Jan. 2006, pp. 69-79.
Wu, Kuei-Sheng et al., "The Improvement of Electrical Programmable Fuse with Salicide-Block Dielectrical Film in 40nm CMOS Technology," Interconnect Technology Conference (IITC), 2010 Int. pp. 1-3.
Wu, Kuei-Sheng et al., "Investigation of Electrical Programmable Metal Fuse in 28nm and beyond CMOS Technology," IEEE International Interconnect Technology Conference and 2011 Materials for Advanced Metallization (IITC/MAM), 2011, pp. 1-3.
Yin, M. et al., "Enhancement of Endurance for Cu$_x$O based RRAM Cell," 9$^{th}$ Int. Conf. on Solid-State and Integrated-Circuit Technology (ICSICT) 2008, pp. 917-920.
Zhu, Jian-Gang, "Magnetoresistive Random Access Memory: The Path to Competitiveness and Scalability," Proc. Of IEEE, vol. 96, No. 11, Nov. 2008, pp. 1786-1798.
Zhuang, W. W. et al., "Novell Colossal Magnetonresistive Thin Film Nonvolatile Resistance Random Access Memory (RRAM)," IEEE IEDM 2002, pp. 193-196.
U.S. Appl. No. 13/026,664, Notice of Allowance mailed Sep. 18, 2012.
Office Action for U.S. Appl. No. 13/471,704 mailed Jul. 31, 2012.
Notice of Allowance for U.S. Appl. No. 13/471,704 mailed Oct. 18, 2012.
Notice of Allowance for U.S. Appl. No. 13/026,678 mailed Sep. 19, 2012.
Office Action for U.S. Appl. No. 13/026,783 mailed Sep. 27, 2012.
Office Action for U.S. Appl. No. 13/026,717 mailed Oct. 25, 2012.
Office Action for U.S. Appl. No. 13/026,650 mailed Nov. 9, 2012.
Office Action for U.S. Appl. No. 13/026,692 mailed Nov. 9, 2012.
Office Action for U.S. Appl. No. 13/026,752 mailed Nov. 9, 2012.
Office Action for U.S. Appl. No. 13/026,656 mailed Nov. 13, 2012.
Office Action for U.S. Appl. No. 13/026,704 mailed Nov. 23, 2012.
Notice of Allowance for U.S. Appl. No. 13/026,852, mailed May 10, 2013.
Notice of Allowance for U.S. Appl. No. 13/026,717, mailed May 15, 2013.
Notice of Allowance for U.S. Appl. No. 13/471,704, mailed May 22, 2013.
Notice of Allowance for U.S. Appl. No. 13/026,678, mailed May 28, 2013.
Notice of Allowance for U.S. Appl. No. 13/026,650, mailed May 30, 2013.
Notice of Allowance for U.S. Appl. No. 13/026,656, mailed Apr. 22, 2013.
Jagasivamani et al., "Development of a Low-Power SRAM Compiler", IEEE Press, 2001, pp. 498-501.
Liu et al., "A Flexible Embedded SRAM Compiler", IEEE Press, 2002, 3 pgs.
Sundrararajan, "OSUSPRAM: Design of a Single Port SRAM Compiler in NCSU FREEPDK45 Process", Mater of Science in Electrical Engineering, Oklahoma State University, Jul. 2010, 117 pgs.
Notice of Allowance for U.S. Appl. No. 13/026,704, mailed Apr. 30, 2013.
Restriction Requirement for U.S. Appl. No. 13/314,444, mailed Jun. 7, 2013.
Restriction Requirement for U.S. Appl. No. 13/214,198, mailed Jun. 13, 2013.
Notice of Allowance for U.S. Appl. No. 13/026,840, mailed Jun. 13, 2013.
Restriction Requirement for U.S. Appl. No. 13/026,771, mailed Jun. 13, 2013.
Notice of Allowance for U.S. Appl. No. 13/026,752, mailed Jul. 1, 2013.
Restriction Requirement for U.S. Appl. No. 13/678,543, mailed Jul. 8, 2013.
Office Action for U.S. Appl. No. 13/026,725, mailed Jul. 19, 2013.
Notice of Allowance for U.S. Appl. No. 13/026,692, mailed Jul. 23, 2013.
Notice of Allowance for U.S. Appl. No. 13/397,673, mailed Jul. 30, 2013.
Notice of Allowance for U.S. Appl. No. 13/026,704, mailed Aug. 2, 2013.
Notice of Allowance for U.S. Appl. No. 13/026,783, mailed Aug. 5, 2013.
Office Action for U.S. Appl. No. 13/214,198, mailed Aug. 6, 2013.
Office action for Chinese Patent Application No. 201110279954.7, mailed Jul. 1, 2013.
Shen et al., "High-K Metal Gate Contact RRAM (CRRAM) in Pure 28 nm CMOS Logic Process", Electron Devices Meeting (IEDM), 2012 IEEE International, Dec. 2012, 4 pgs.
Tseng et al., "A New High-Density and Ultrasmall-Cell Size Contact RRAM (CR-RAM) with Fully CMOS-Logic-Compatible Technology and Circuits", IEEE Transactions on Electronic Devices, vol. 58, Issue 1, Jan. 2011, 6 pgs.

\* cited by examiner

| Condition1 | BL0=H | BL1=L |  | Condition 2 | BL0=Z | BL1=L |
|---|---|---|---|---|---|---|
| WL0N=H/Z | X | 1 |  | WL0N=H/L/Z | X | 1 |
| WL0P=H |  |  |  | WL0P=H |  |  |
| WL1N=H/Z | X | X |  | WL1N=H/L/Z | X | X |
| WL1P=L/Z |  |  |  | WL1P=L/Z |  |  |

| Condition1 | BL0=L | BL1=H |  | Condition 2 | BL0=Z | BL1=H |
|---|---|---|---|---|---|---|
| WL0N=L | X | 0 |  | WL0N=L | X | 0 |
| WL0P=L/Z |  |  |  | WL0P=H/L/Z |  |  |
| WL1N=H/Z | X | X |  | WL1N=H/Z | X | X |
| WL1P=L/Z |  |  |  | WL1P=H/L/Z |  |  |

ONE-TIME PROGRAMMABLE MEMORIES USING POLYSILICON DIODES AS PROGRAM SELECTORS

CROSS-REFERENCE TO RELATED APPLICATIONS

This application claims priority benefit of U.S. Provisional Patent Application No. 61/375,653, filed on Aug. 20, 2010 and entitled "Circuit and System of Using Junction Diode As Program Selector for Resistive Devices in CMOS Logic Processes," which is hereby incorporated herein by reference; and U.S. Provisional Patent Application No. 61/375,660, filed on Aug. 20, 2010 and entitled "Circuit and System of Using Polysilicon Diode As Program Selector for Resistive Devices in CMOS Logic Processes," which is hereby incorporated herein by reference.

BACKGROUND OF THE INVENTION

1. Field of the Invention

The present invention relates to programmable memory devices, such as programmable resistive devices for use in memory arrays.

2. Description of the Related Art

A programmable resistive device is generally referred to a device's resistance states that may change after means of programming. Resistance states can also be determined by resistance values. For example, a resistive device can be a One-Time Programmable (OTP) device, such as electrical fuse, and the programming means can apply a high voltage to induce a high current to flow through the OTP element, such as fuse. When a high current flows through an OTP element by turning on a program selector, the OTP element can be programmed, or burned into a high or low resistance state (depending on either fuse or anti-fuse).

An electrical fuse is a common OTP which is a programmable resistive device that can be constructed from a segment of interconnect, such as polysilicon, silicided polysilicon, silicide, metal, metal alloy, or some combination thereof. The metal can be aluminum, copper, or other transition metals. One of the most commonly used electrical fuses is a CMOS gate, fabricated in silicided polysilicon, used as interconnect. The electrical fuse can also be one or more contacts or vias instead of a segment of interconnect. A high current may blow the contact(s) or via(s) into a very high resistance state. The electrical fuse can be an anti-fuse, where a high voltage makes the resistance lower, instead of higher. The anti-fuse can consist of one or more contacts or vias with an insulator in between. The anti-fuse can also be a CMOS gate coupled to a CMOS body with a thin gate oxide as insulator.

The programmable resistive device can be a reversible resistive device that can be programmed into a digital logic value "0" or "1" repetitively and reversibly. The programmable resistive device can be fabricated from phase change material, such as Germanium (Ge), Antimony (Sb), and Tellurium (Te) with composition $Ge_2Sb_2Te_5$, (GST-225) or GeSbTe-like materials including compositions of Indium (In), Tin (Sn), or Selenium (Se). The phase change material can be programmed into a high resistance amorphous state or a low resistance crystalline state by applying a short and high voltage pulse or a long and low voltage pulse, respectively. The reversible resistive device can be a Resistive RAM (RRAM) with cells fabricated from metal oxides between electrodes, such as Pt/NiO/Pt, TiN/TiOx/HfO2/TiN, TiN/ZnO/Pt. The resistance states can be changed reversibly and determined by polarity, magnitude, duration, or voltage/current-limit of pulse(s) to generate or annihilate conductive filaments. Another programmable resistive device similar to RRAM is a Conductive Bridge RAM (CBRAM) that is based on electrochemical deposition and removal of metal ions in a thin solid-state electrolyte film. The electrodes can be oxidizable anode and an inert cathode and the electrolyte can be Ag- or Cu-doped chalcogenide glass such as GeSe or GeS, etc. The resistance states can be changed reversibly and determined by polarity, magnitude, duration, or voltage/current-limit of pulse(s) to generate or annihilate conductive bridges. The programmable resistive device can be an MRAM (Magnetic RAM) with cells fabricated from magnetic multi-layer stacks that construct a Magnetic Tunnel Junction (MTJ). In a Spin Transfer Torque MRAM (STT-MRAM) the direction of currents applied to a MTJ determines parallel or anti-parallel states, and hence low or high resistance states.

A conventional programmable resistive memory cell is shown in FIG. 1. The cell 10 consists of a resistive element 11 and an NMOS program selector 12. The resistive element 11 is coupled to the drain of the NMOS 12 at one end, and to a positive voltage V+ at the other end. The gate of the NMOS 12 is coupled to a select signal (Sel), and the source is coupled to a negative voltage V−. When a high voltage is applied to V+ and a low voltage to V−, the resistive device 10 can be programmed by raising the select signal (Sel) to turn on the NMOS 12. One of the most common resistive elements is a silicided polysilicon, the same material and fabricated at the same time as a MOS gate. The size of the NMOS 12, as program selector, needs to be large enough to deliver the required program current for a few microseconds. The program current for a silicided polysilicon is normally between a few milliamps for a fuse with width of 40 nm to about 20 mA for a fuse with width about 0.6 um. As a result, the cell size of an electrical fuse using silicided polysilicon tends to be very large.

Another conventional programmable resistive device 20 for Phase Change Memory (PCM) is shown in FIG. 2(a). The PCM cell 20 has a phase change film 21 and a bipolar transistor 22 as program selector with P+ emitter 23, N-base 27, and P-sub collector 25. The phase change film 21 is coupled to the emitter 23 of the bipolar transistor 22 in a ring shape, and to a positive voltage V+ at the other. The N-type base 27 of bipolar transistor 22 is coupled to a negative voltage V−. The collector 25 is coupled to ground. By applying a proper voltage between V+ and V− for a proper duration of time, the phase change film 21 can be programmed into high or low resistance states, depending on voltage and duration. Conventionally, to program a phase-change memory to a high resistance state (or reset state) requires about 3V for 50 ns and consumes about 300 uA of current, or to program a phase-change memory to a low resistance state (or set state) requires about 2V for 300 ns and consumes about 100 uA of current.

FIG. 2(b) shows a cross section of a conventional bipolar transistor 22. The bipolar transistor 22 includes a P+ active region 23, a shallow N well 24, an N+ active region 27, a P-type substrate 25, and a Shallow Trench Isolation (STI) 26 for device isolation. The P+ active region 23 and N+ active region 27 couple to the N well 24 are the P and N terminals of the emitter-base diode of the bipolar transistor 22, while the P-substrate 25 is the collector of the bipolar transistor 22. This cell configuration requires an N well 24 be shallower than the STI 26 to properly isolate cells from each other and needs 3-4 more masking operations over the standard CMOS logic processes which makes it more costly to fabricate.

Another programmable resistive device 20' for Phase Change Memory (PCM) is shown in FIG. 2(c). The PCM cell 20' has a phase change film 21' and a diode 22'. The phase change film 21' is coupled between an anode of the diode 22' and a positive voltage V+. A cathode of the diode 22' is coupled to a negative voltage V−. By applying a proper voltage between V+ and V− for a proper duration of time, the phase change film 21' can be programmed into high or low resistance states, depending on voltage and duration. As an example of use of a diode as program selector for each PCM cell as shown in FIG. 2(*c*), see Kwang-Jin Lee et al., "A 90 nm 1.8V 512 Mb Diode-Switch PRAM with 266 MB/s Read Throughput," International Solid-State Circuit Conference, 2007, pp. 472-273. Though this technology can reduce the PCM cell size to only $6.8F^2$ (F stands for feature size), the diode requires very complicated process steps, such as Selective Epitaxial Growth (SEG), to fabricate, which would be very costly for embedded PCM applications.

FIGS. 3(*a*) and 3(*b*) show several embodiments of an electrical fuse element 80 and 84, respectively, fabricated from an interconnect. The interconnect serves as a particular type of resistive element. The resistive element has three parts: anode, cathode, and body. The anode and cathode provide contacts for the resistive element to be connected to other parts of circuits so that a current can flow from the anode to cathode through the body. The body width determines the current density and hence the electro-migration threshold for a program current. FIG. 3(*a*) shows a conventional electrical fuse element 80 with an anode 81, a cathode 82, and a body 83. This embodiment has a large symmetrical anode and cathode. FIG. 3(*b*) shows another conventional electrical fuse element 84 with an anode 85, a cathode 86, and a body 87. This embodiment has an asymmetrical shape with a large anode and a small cathode to enhance the electro-migration effect based on polarity and reservoir effects. The polarity effect means that the electro-migration always starts from the cathode. The reservoir effect means that a smaller cathode makes electro-migration easier because the smaller area has lesser ions to replenish voids when the electro-migration occurs. The fuse elements 80, 84 in FIGS. 3(*a*) and 3(*b*) are relatively large structures which makes them unsuitable for some applications.

FIGS. 4(*a*) and 4(*b*) show programming a conventional MRAM cell 210 into parallel (or state 0) and anti-parallel (or state 1) by current directions. The MRAM cell 210 consists of a Magnetic Tunnel Junction (MTJ) 211 and an NMOS program selector 218. The MTJ 211 has multiple layers of ferromagnetic or anti-ferromagnetic stacks with metal oxide, such as $Al_2O_3$ or MgO, as an insulator in between. The MTJ 211 includes a free layer stack 212 on top and a fixed layer stack 213 underneath. By applying a proper current to the MTJ 211 with the program selector CMOS 218 turned on, the free layer stack 212 can be aligned into parallel or anti-parallel to the fixed layer stack 213 depending on the current flowing into or out of the fixed layer stack 213, respectively. Thus, the magnetic states can be programmed and the resultant states can be determined by resistance values, lower resistance for parallel and higher resistance for anti-parallel states. The resistances in state 0 or 1 are about 5 KΩ or 10 KΩ, respectively, and the program currents are about +/−100-200 μA. One example of programming an MRAM cell is described in T. Kawahara, "2 Mb Spin-Transfer Torque RAM with Bit-by-Bit Bidirectional Current Write and Parallelizing-Direction Current Read," International Solid-State Circuit Conference, 2007, pp. 480-481.

A diode can also be fabricated from polysilicon. FIG. 5(*a*) shows a cross section of a polysilicon diode. To form the polysilicon diode, the polysilicon is implanted by N+ at one end and P+ at the other end with a spacing Lc in between that has intrinsic doping level. The intrinsic doping level only means not intentionally doping any dopants but can be slightly N-type or P-type due to out diffusion or contamination. A silicide block layer is applied to block silicide formation on the surface of the polysilicon to thus prevent a short circuit. The two ends of P+ and N+ in polysilicon are further brought out as P and N terminals of a diode with contacts. As an example of a polysilicon diode see Ming-Dou Ker et al., "Ultra High-Voltage Charge Pump Circuit in Low-Voltage Bulk CMOS Processes with Polysilicon Diodes," IEEE Transaction of Circuit and System-II, Vol. 54, No. 1, January 2007, pp. 47-51.

FIG. 5(*b*) shows current verses voltage characteristics of a polysilicon diode, such as shown in FIG. 5(*a*). The current verses voltage curves show useful diode behavior such as a threshold voltage of about 0.6V and a leakage current of less than 1 nA. By varying the spacing Lc, the breakdown voltage and leakage current for the polysilicon diode can be adjusted accordingly.

SUMMARY OF THE INVENTION

Embodiments of One-Time Programmable (OTP) memories using polysilicon diodes as program selectors are disclosed. In one embodiment, polysilicon diodes fabricated in standard CMOS logic processes can be used as program selectors for One-Time Programmable (OTP) devices, using electrical fuse, contact/via fuse, contact/via anti-fuse, or gate-oxide breakdown anti-fuse etc. as OTP element The diodes can be constructed by P+/N+ implants on a polysilicon as a program selector. The OTP device has an OTP element coupled to a polysilicon diode. The OTP devices can be used to construct a two-dimensional OTP memory with the N-terminals of the diodes in a row connected as a wordline and the OTP elements in a column connected as a bitline. By applying a high voltage between a selected bitline and a selected wordline to turn on a diode in a selected cell for suitable duration of time, a current flows through an OTP element may change the resistance state. The cell data in the OTP memory can also be read by turning on a selected wordline and to couple a selected bitline to a sense amplifier. The wordlines may have high-resistivity local wordlines coupled to low-resistivity global wordlines through conductive contact(s) or via(s). The OTP memory can also be included within an electronic system.

Advantageously, the same polysilicon can be used to create CMOS gates in standard CMOS logic processes. By using polysilicon diodes in standard CMOS processes, a small cell size can be achieved, without incurring any special processing or masks. Thus, costs can be reduced substantially for variously applications, such as embedded applications.

The invention can be implemented in numerous ways, including as a method, system, device, or apparatus (including graphical user interface and computer readable medium). Several embodiments of the invention are discussed below.

As a One-Time Programmable (OTP) memory, one embodiment of the invention can, for example, include at least: a plurality of OTP cells, each including an OTP element and a diode as program selector constructed from a polysilicon structure having a first terminal from a first region with a first type of dopant, and a second terminal from a second region with a second type of dopant, the first terminal of the diode being coupled to a first terminal of the OTP element, the OTP element being programmable by conducting a current flowing through the OTP element and the diode; a plurality of local wordlines, each coupled to a plurality of the OTP cells via the second terminal of the diodes and having a first resistivity; a plurality of global wordlines, each coupled to at least one of the local wordlines and having a second resistivity; and a plurality of bitlines, each coupled to a plurality of the OTP cells via a second terminal of the OTP element.

As a One-Time Programmable (OTP) memory, another embodiment can, for example, include at least: a plurality of OTP cells, each including (i) a polysilicon segment as OTP element, and (ii) a diode as program selector constructed from a polysilicon structure having a first terminal from a first region with a first type of dopant, and a second terminal from a second region with a second type of dopant, the first terminal of the diode being coupled to a first terminal of the OTP element, the OTP element being programmable by conducting a current flowing through the OTP element and the diode, the polysilicon segment being formed in or on the polysilicon structure; a plurality of local wordlines, each coupled to a plurality of the OTP cells via the second terminal of the diodes and having a first resistivity; a plurality of global wordlines, each coupled to at least one of the local wordlines and having a second resistivity; and a plurality of bitlines, each coupled to a plurality of the OTP cells via a second terminal of the OTP element.

As an electronics system, one embodiment of the invention can, for example, include at least a processor, and at least one OTP memory operatively connected to the processor. The OTP memory can include a plurality of OTP cells, each including an OTP element and a diode as program selector constructed from a polysilicon structure having a first terminal from a first region with a first type of dopant, and a second terminal from a second region with a second type of dopant, the first terminal of the diode being coupled to a first terminal of the OTP element, the OTP element being programmable by conducting a current flowing through the OTP element and the diode. The OTP memory can also include at least: a plurality of local wordlines, each coupled to a plurality of the OTP cells via the second terminal of the diodes and having a first resistivity; a plurality of global wordlines, each coupled to at least one of the local wordlines and having a second resistivity; and a plurality of bitlines, each coupled to a plurality of the OTP cells via a second terminal of the OTP element.

As a method for operating an OTP memory, one embodiment of the invention can, for example, include at least: providing a plurality of OTP cells, each including an OTP element and a diode as program selector constructed from a polysilicon structure having a first terminal from a first region with a first type of dopant and a second terminal from a second region with a second type of dopant, the first terminal of the diode being coupled to the first terminal of the OTP element, the OTP element being programmable by conducting a current flowing through the OTP element and the program selector; providing a plurality of local wordlines, each coupled to a plurality of the OTP cells via the second terminal of the diodes and having a first resistivity; providing a plurality of global wordlines, each coupled to at least one of the local wordlines and having a second resistivity; providing a plurality of bitlines, each coupled to a plurality of the OTP cells via a second terminal of the OTP element; and programming at least one selected OTP cell into a different logic state applying voltages to a selected one of the global wordlines and a selected one of the bitlines to conduct a current and change the resistance of the selected OTP cell.

Other aspects and advantages of the invention will become apparent from the following detailed description taken in conjunction with the accompanying drawings which illustrate, by way of example, the principles of the invention.

BRIEF DESCRIPTION OF THE DRAWINGS

The present invention will be readily understood by the following detailed descriptions in conjunction with the accompanying drawings, wherein like reference numerals designate like structural elements, and in which.

DETAILED DESCRIPTION OF EMBODIMENTS OF THE INVENTION

Embodiments disclosed herein use a polysilicon diode as program selector for a programmable resistive device. The diode can comprise P+ and N+ implants on a polysilicon substrate. Since the P+ and N+ implants and polysilicon are readily available in standard CMOS logic processes, these devices can be formed in an efficient and cost effective manner. There are no additional masks or process steps to save costs. The programmable resistive device can also be included within an electronic system.

Figure 1:
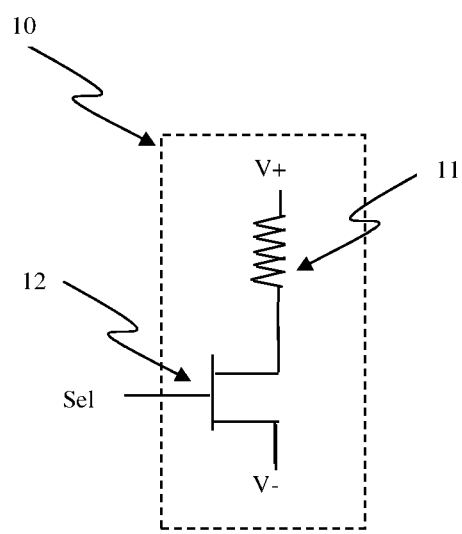
FIG. 1 shows a conventional programmable resistive memory cell.
Figure 2A:
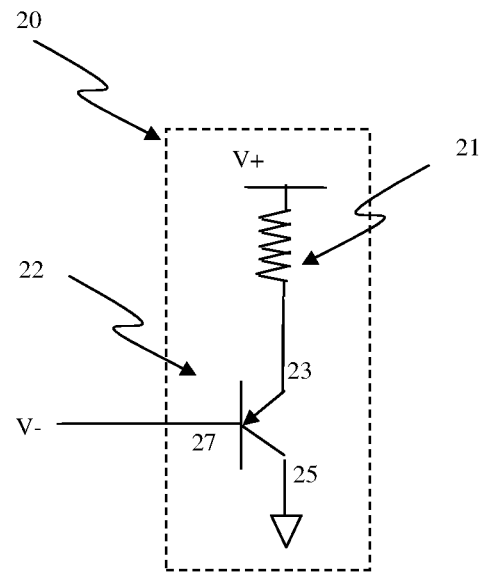
FIG. 2(a) shows another conventional programmable resistive device for Phase Change Memory (PCM) using a bipolar transistor as program selector.
Figure 2B:
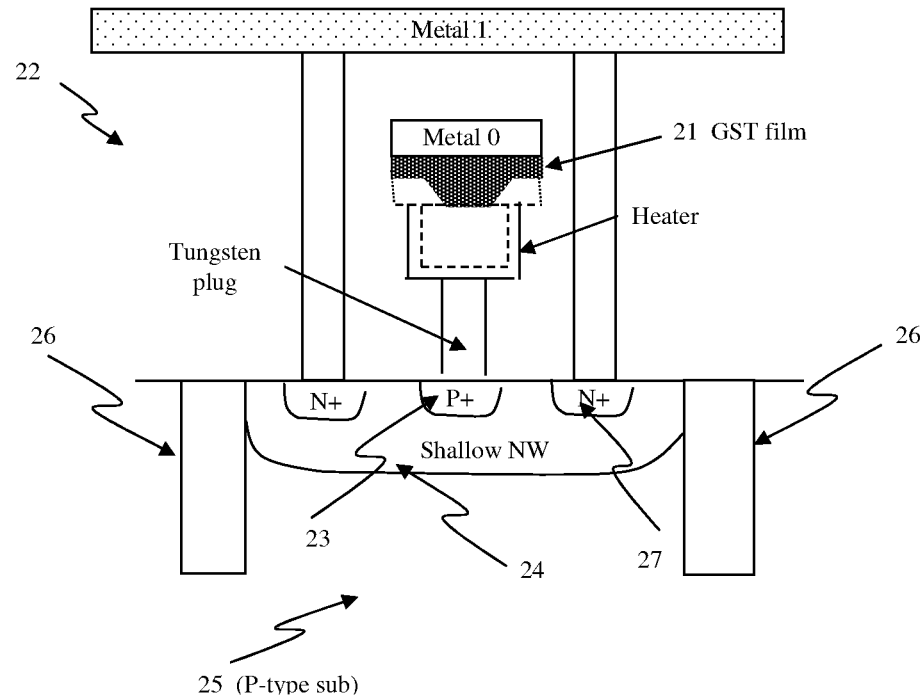
FIG. 2(b) shows a cross section of a conventional Phase Change Memory (PCM) using a bipolar transistor as program selector.
Figure 2C:
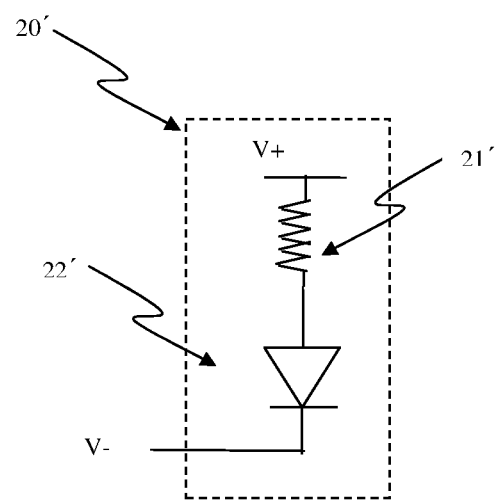
FIG. 2(c) shows another conventional Phase Change Memory (PCM) cell using a diode as program selector.
Figure 3A:
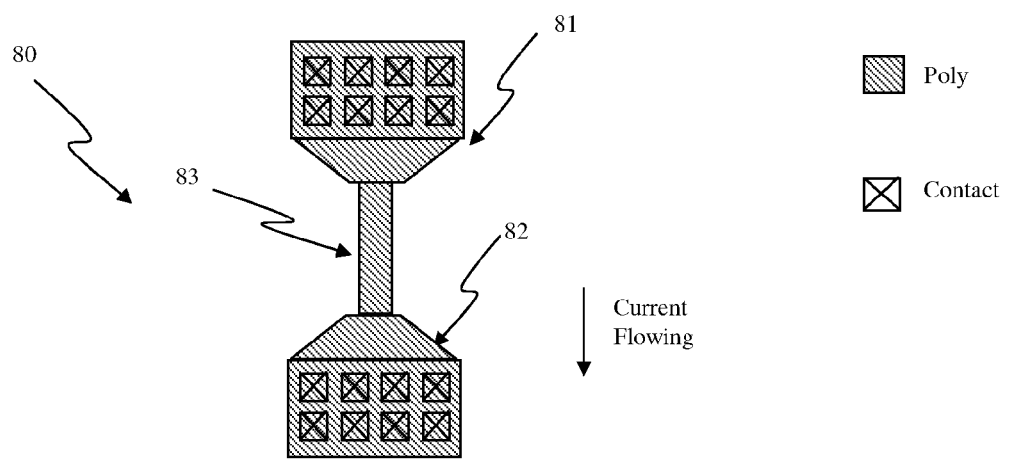
FIGS. 3(a) and 3(b) show several embodiments of an electrical fuse element, respectively, fabricated from an interconnect.
Figure 3B:
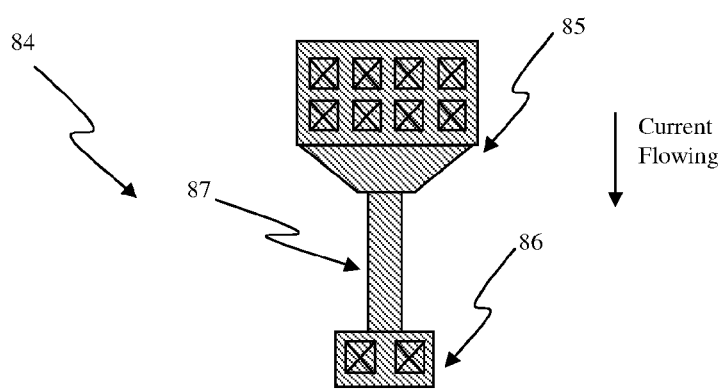
Figure 4A:
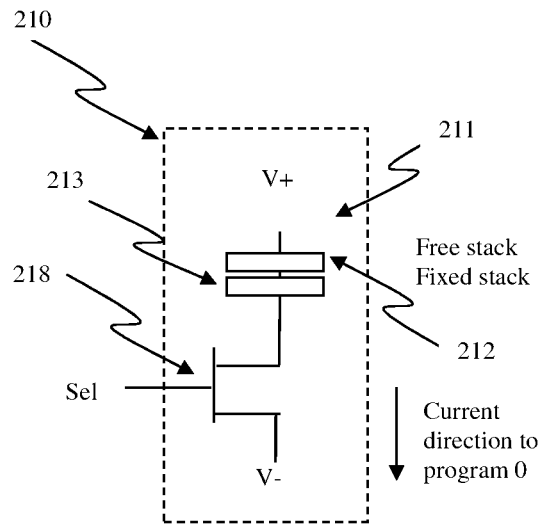
FIGS. 4(a) and 4(b) show programming a conventional MRAM cell into parallel (or state 0) and anti-parallel (or state 1) by current directions.
Figure 4B:
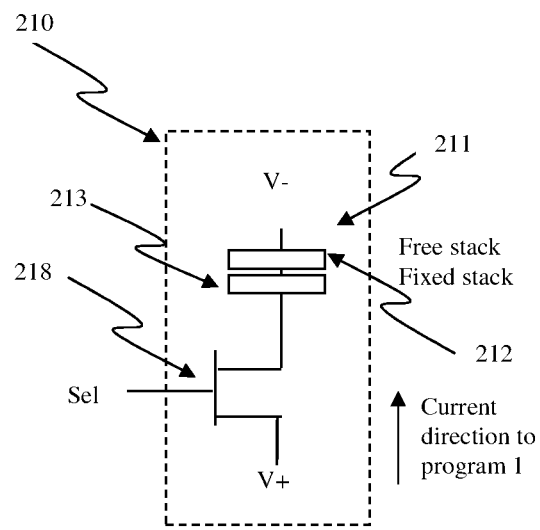
Figure 5A:
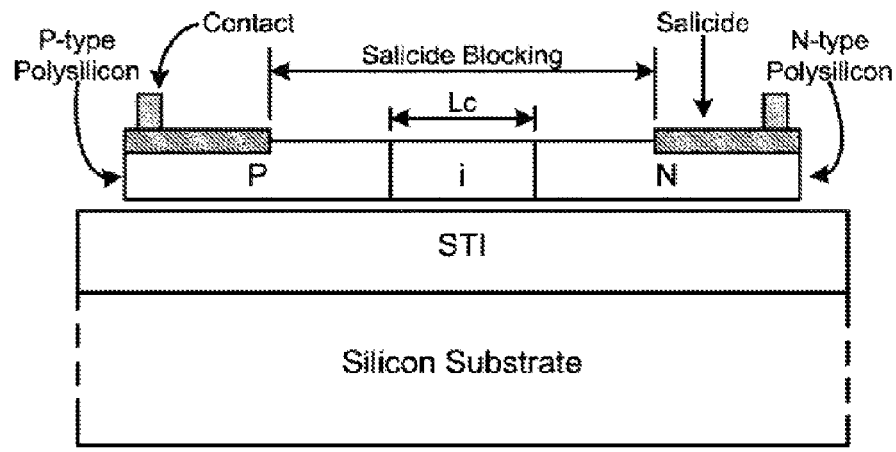
FIG. 5(a) shows a cross section of a polysilicon diode.
Figure 5B:
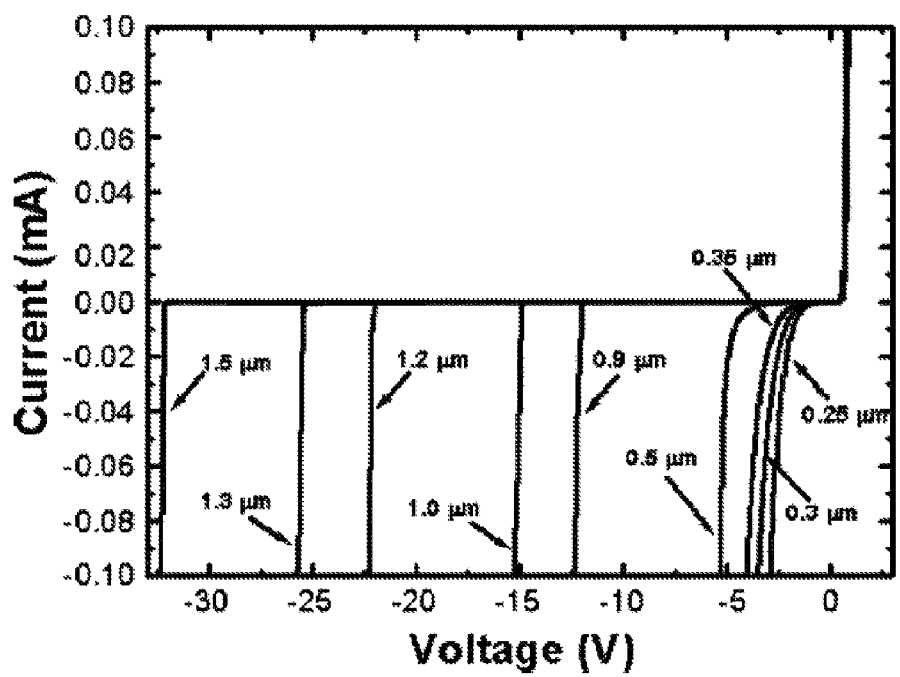
FIG. 5(b) shows current verses voltage characteristics of a polysilicon diode, such as shown in FIG. 5(a).
Figure 6A:
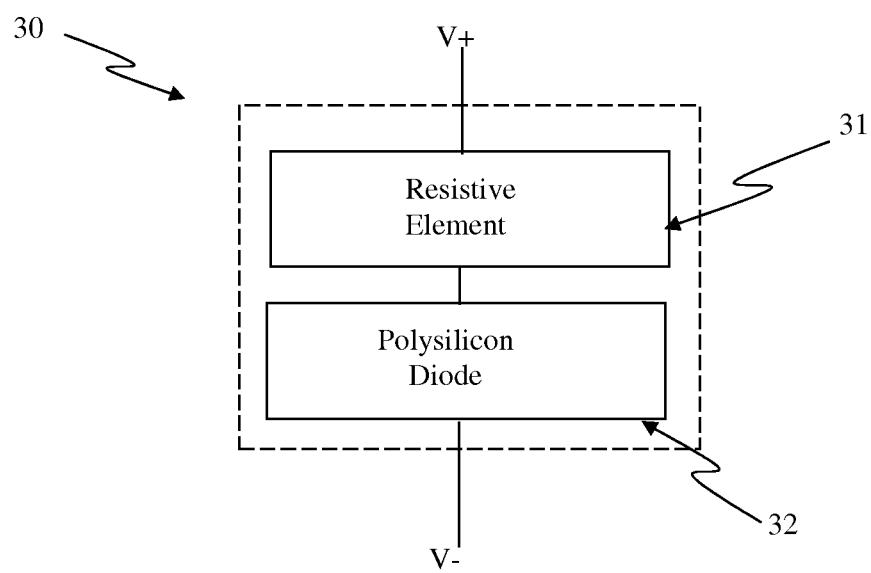
FIG. 6(a) shows a block diagram of a memory cell using a polysilicon diode as program selector according to one embodiment.

FIG. 6(a) shows a block diagram of a memory cell 30 using a polysilicon diode according to one embodiment. In particular, the memory cell 30 includes a resistive element 31 and a polysilicon diode 32. The resistive element 31 can be coupled between an anode of the polysilicon diode 32 and a positive voltage V+. A cathode of the polysilicon diode 32 can be coupled to a negative voltage V−. In one implementation, the memory cell 30 can be a fuse cell with the resistive element 31 operating as an electrical fuse. The polysilicon diode 32 can serve as a program selector. The coupling of the resistive element 31 and the polysilicon diode 32 between the supply voltages V+ and V− can be interchanged. By applying a proper voltage between V+ and V− for a proper duration of time, the resistive element 31 can be programmed into high or low resistance states, depending on voltage and duration, thereby programming the memory cell 30 to store a data value (e.g., bit of data).

Figure 6B:
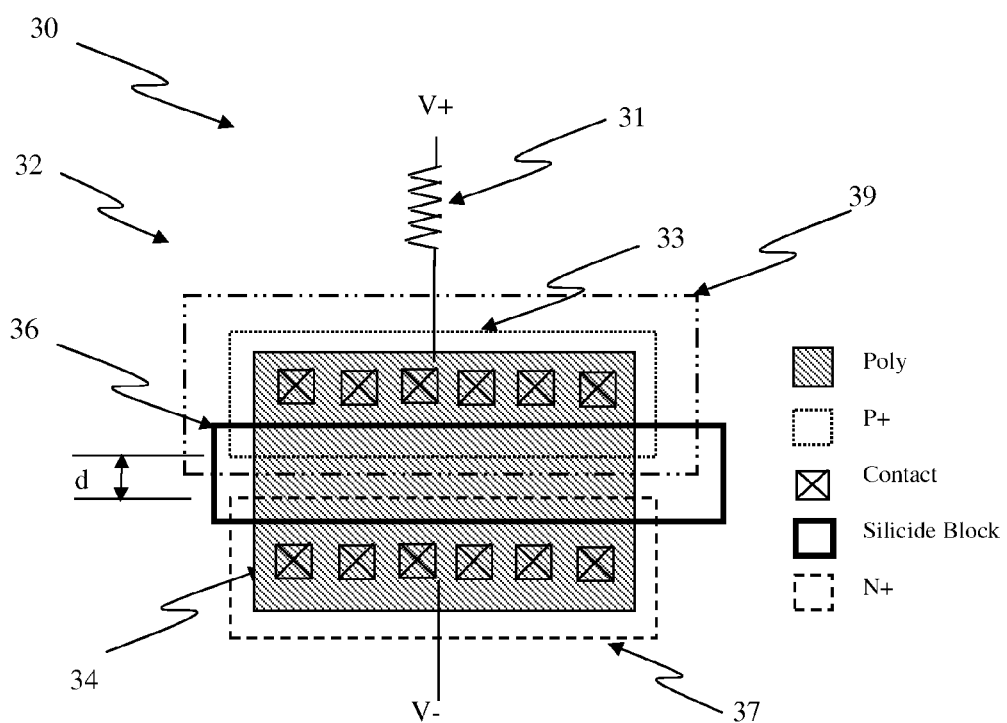
FIG. 6(b) shows a top view of a fuse cell using a polysilicon diode as program selector according to one embodiment.

FIG. 6(b) shows a top view of a fuse cell 30 using a polysilicon diode as program selector according to one embodiment. The fuse cell 30 include an electrical fuse element 31 coupled to a first supply voltage V+ and to a diode 32. The diode 32 serves as the program selector for the fuse cell 30. The diode 32 is built on a piece of polysilicon 34, i.e., polysilicon substrate. The P+ and N+ implants 33 and 37 are used to create source or drain of a PMOS or NMOS device, respectively, and thus form the P and N terminals of the diode 32 on the polysilicon 34. A Silicide Block Layer (SBL) 36 blocks silicide formation on the top of polysilicon surface to prevent P and N terminals of the diode 32 from shorting. A space d between P+ 33 and N+ 37 can be used to adjust breakdown voltage and leakage current. A layer 39 is optional to introduce NLDD, PLDD, NMOS Vt, PMOS Vt or others implants over the intrinsic dopant level into the area between N+ and P+ implant layers 37 and 33 to further control the diode's turn-on resistance. The area implanted by the optional layers 39 can be generated from standard CMOS masks by operations on layer database without any additional costs.

Figure 7A:
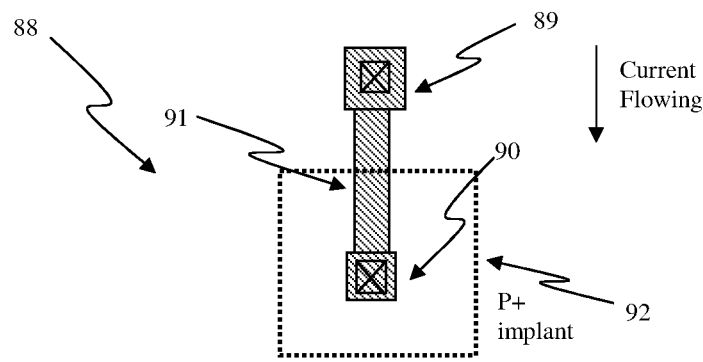
FIG. 7(a) shows an electrical fuse element according to one embodiment.

FIG. 7(a) shows an electrical fuse element 88 according to one embodiment. The electrical fuse element 88 can, for example, by used as the electrical fuse element 31 illustrated in FIGS. 6(a) and 6(b). The electrical fuse element 88 includes an anode 89, a cathode 90, and a body 91. In this embodiment, the electrical fuse element 88 is a bar shape with a small anode 89 and cathode 90 to reduce area. The anode 89 and cathode 90 may protrude from the body 91 to make contacts. The contact number can be one (1) for both the anode 89 and the cathode 90 so that the area can be very small. However, the contact area for anode 89 is often made larger so that the anode 89 can resist electro-migration more than the cathode 90. The fuse body 91 can have about 1-5 squares, namely, the length to width ratio is about 1-to-5, to optimize cell area and program current. The fuse element 88 has a P+ implant 92 covering half of the body 91 and the cathode 90, while an N+ implant over the rest of area. This embodiment makes the fuse element 88 behaves like a reverse biased diode to increase resistance after being programmed, when the silicide on top is depleted by electro-migration, ion diffusion, silicide decomposition, and other effects.

The above scheme can be realized for those fuse elements consisting of polysilicon, silicided polysilicon, or other CMOS gate material so that P+ and N+ implants can create a diode. For example, if a metal-gate CMOS has a sandwich structure of polysilicon between metal alloy layers, the metal alloy layers may be blocked by masks generated from the layout database to create a diode on the fuse element.

Figure 7B:
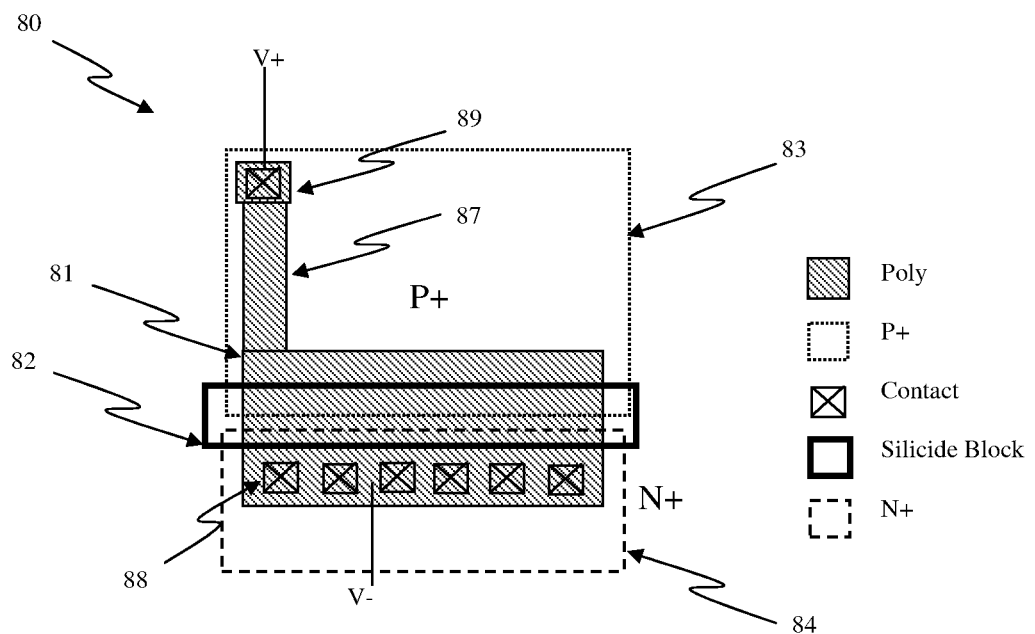
FIGS. 7(b), (c), and (d) show a top view of electrical fuse cells using polysilicon as fuse elements and polysilicon diodes according to various embodiments.
Figure 7C:
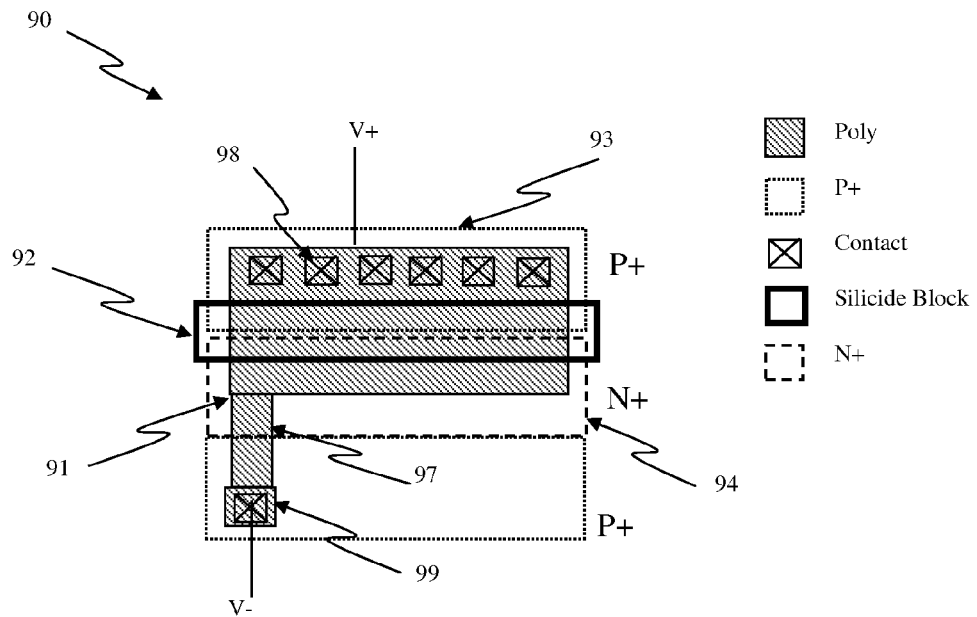
Figure 7D:
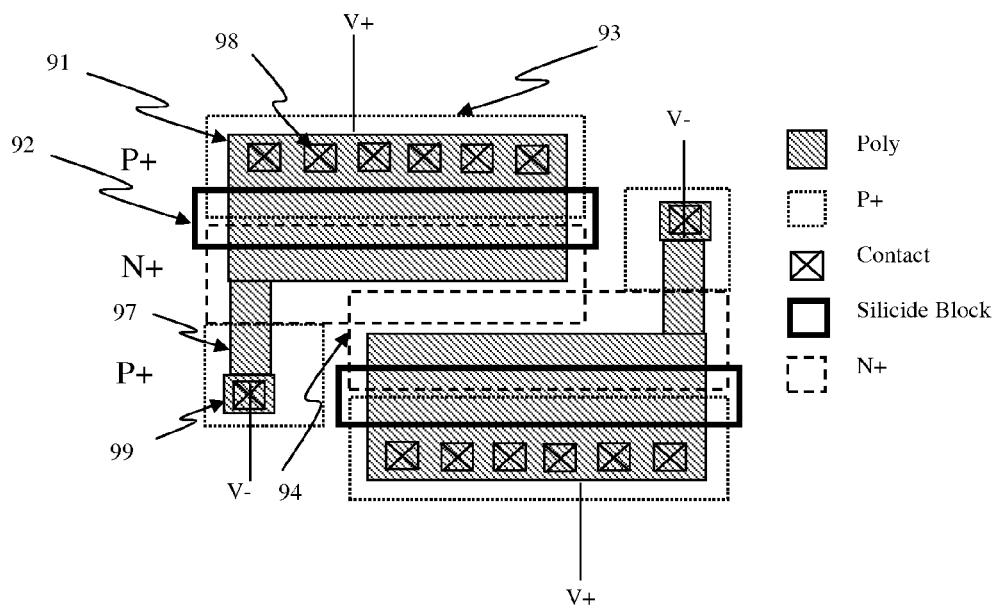

FIGS. 7(b), 7(c), and 7(d) show a top view of electrical fuse cells using polysilicon as fuse elements and polysilicon diodes according to various embodiments. Since the fuse element is fabricated from a polysilicon and the diode is built on a polysilicon substrate, the fuse element and the diode can be integrally formed. By integrally forming the fuse element and the diode, programmable resistive cells that are compact can be formed because redundant contacts and spacing can be avoided.

FIG. 7(b) shows a one-piece polysilicon electrical fuse cell 80 having a fuse element with anode 89, body 87, and a polysilicon diode 81 according to one embodiment. The anode 89, the body 87 and a P terminal of the polysilicon diode 81 are covered by a P+ implant 83, while the cathode 88 (the N terminal of the polysilicon diode 81) is covered by an N+ implant 84. Silicide Block Layer 82 can be provided over at least adjacent portions of the P+ implant 83 and the N+ implant 84 to block silicide grown on the top of polysilicon to prevent N and P terminals from shorting. The anode 89 is coupled to V+ and the cathode 88 is coupled to V−. When a high voltage is applied to V+ and a low voltage to V−, a current flows from the anode 89 through body 87 to the P terminal of the polysilicon diode 81 and then to the N terminal 88 of the polysilicon diode 81. In this embodiment, the body 87 of fuse element has a P+ implant 83.

FIG. 7(c) shows another one-piece polysilicon electrical fuse cell 90 having a diode 91 and a fuse element with a body 97 and a cathode 99 according to one embodiment. The P terminal of the diode 91 is coupled to a supply voltage V+. The N terminal of the diode 91 is coupled to the body 97 of the fuse element, which is then coupled to another supply voltage V− through the cathode 99. The P terminal 98 of the diode 91, lower half of the body 97, and the cathode 99 are covered by a P+ implant 93, while the N terminal of the diode 91 and the upper portion (e.g., half) of the body 97 are covered by an N+ implant 94. A silicide Block Layer 92 can block silicide grown on top of polysilicon to prevent the N and P terminals from shorting. When a high voltage is applied to V+ and a low voltage to V−, a current flows from the P terminal 98 of the polysilicon diode 91 through the N terminal of the polysilicon diode 91 and the body 97 to the cathode 99. In this embodiment, the body 97 has N+/P+ implants covering respective portions (e.g., approximately half N+ and half P+). When the silicide on the top of the polysilicon diode 91 is depleted, the body 97 behaves like a reverse biased diode to increase the post-program resistance. Besides, the cathode 99 has a smaller area than the anode, i.e., the P terminal 98 of the polysilicon diode 91, which serves to enhance electro-migration.

FIG. 7(d) shows a top view of a pair of staggered one-piece electrical fuse cells according to one embodiment. Like the polysilicon electrical fuse cell 90, each of the electrical fuse cells in the pair are formed of a polysilicon resistive element (e.g., fuse element) and a polysilicon diode. The second electrical fuse cell is rotated 180-degrees and placed adjacent the first electrical fuse cell so that the large anode and small cathode are adjacent next to each other for a compact (or dense) arrangement that consumed a relatively small area.

Figure 8A:
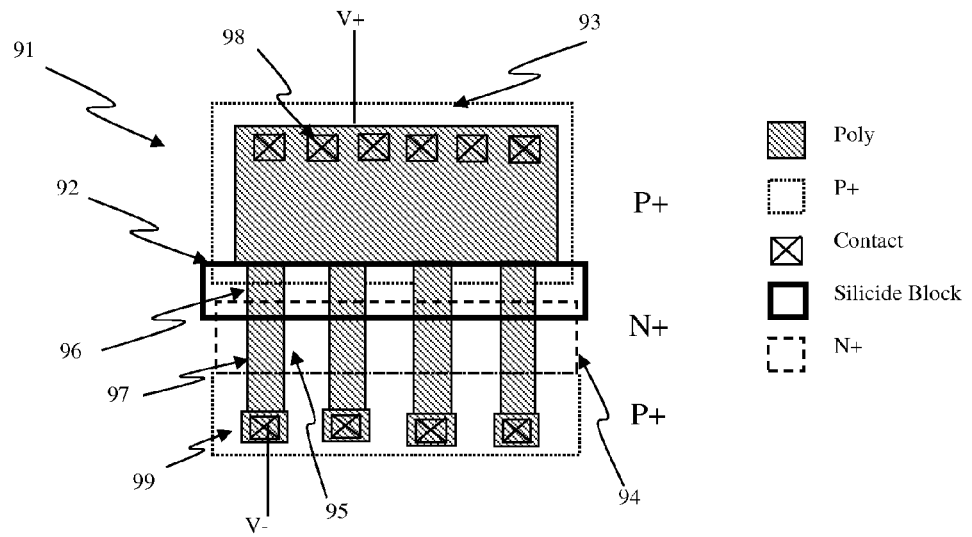
FIG. 8(a) shows a top view of a polysilicon electrical fuse cell having a common P terminal as anode shared by 4 polysilicon diodes with four fuse elements in accordance with one embodiment.

If the program current is not very high, the size of the one-piece electrical fuse cells can be further reduced. FIG. 8(a) shows a top view of a polysilicon electrical fuse cell 91 having a common P terminal 98 (implanted by P+ 93) as anode shared by 4 polysilicon diodes 96 for use with four fuse elements 95 in accordance with one embodiment. The SBL 92 blocks silicide formation on the top of the polysilicon diode 96 to separate P terminal 98 and N terminal of diodes 96 for each electrical fuse cell. A polysilicon diode 96 which serves as program selector is coupled to a portion of polysilicon covered by an N+ 94 as the N terminal, which is further coupled to a body 97 and to a cathode 99. The P terminal 98 is coupled to a high voltage supply V+ and each cathode 99 is coupled to a low voltage supply V−. By applying proper voltages to V+ and V−, a current will flow to change the resistance of the body 97 accordingly.

Figure 8B:
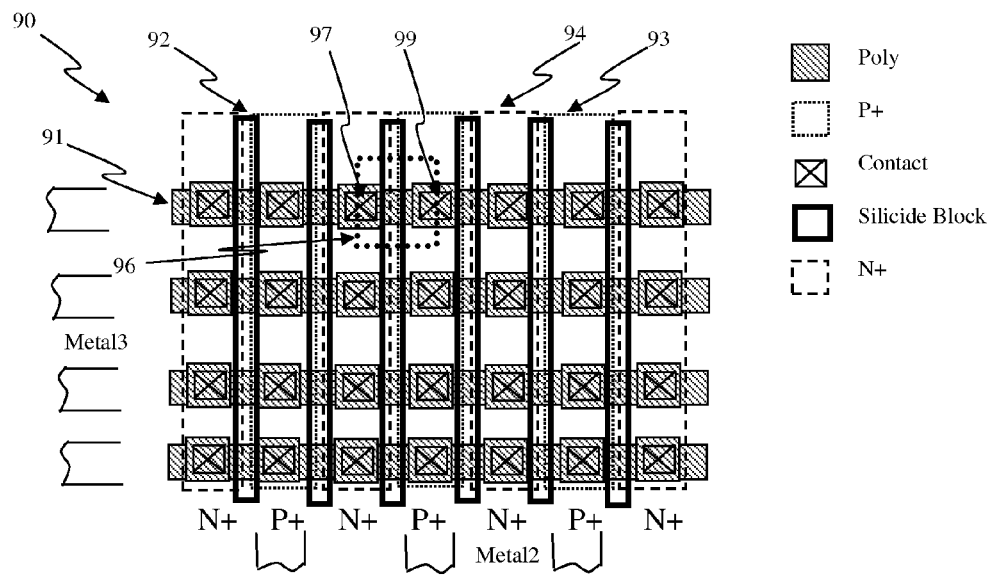
FIG. 8(b) shows a top view of a 4×3 array of via1 fuses built on polysilicon in accordance with one embodiment.

FIG. 8(b) shows a top view of a 4×3 array of via1 fuses 90 built on polysilicon in accordance with one embodiment. The array of via1 fuses 90 has four rows of polysilicon diode 91, each has alternative N+ contacts 97 and P+ contacts 99 covered by N+ implant 94 and P+ implant 93, respectively, with metal1 on top. The P+ contacts 99 and N+ contacts 97, which are separated by a SBL 92 act as the P and N terminals of diodes. The P+ contacts 99 in the same columns are connected by a metal2 running vertically as bitlines. Similarly, the N+ contacts 97 in the same rows are connected by a metal3 running horizontally as wordlines. A particular programmable resistive cell 96 can be programmed by applying a high voltage to a selected bitline and a low voltage or ground to a selected wordline to conduct a current flowing from metal2 bitline, via1, metal1, contact, polysilicon, through the selected diode and metal3 to ground. If the metal1, metal2, and metal3 have higher threshold to blow up, either via1 (connect between metal1 and metal2) or contact (connect between metal1 and polysilicon) will be programmed. To ensure via1 be programmed, the metals are preferably made wider and the numbers of via2 and contacts are preferably more than one. In one embodiment, the via1 can be built on the top of a P+ contact 99 to make a unit cell very small. Those skilled in the art understand that in other embodiments the via1 fuses can be extended to contact, via2, various other types of contact/via fuses or metal schemes may be used, and the numbers of rows and column may vary, the rows and columns are interchangeable.

Figure 8C:
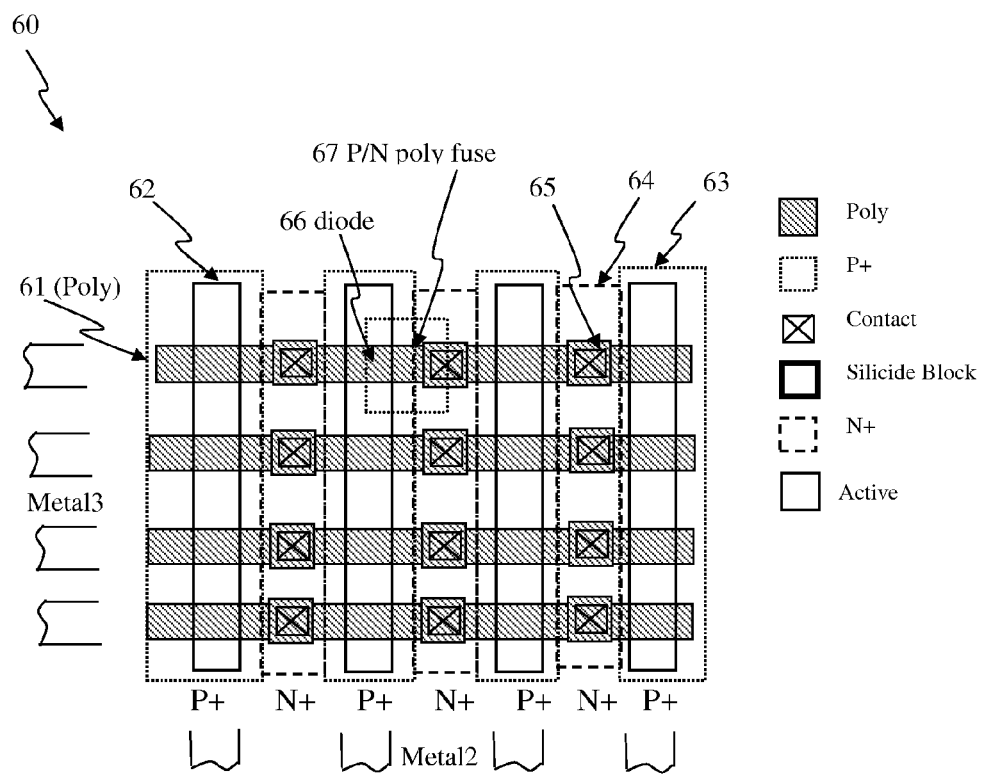
FIG. 8(c) shows a top view of an array of polysilicon fuses with a diode constructed from a P+ polysilicon and an N-type buried layer at cross points according to one embodiment.

FIG. 8(c) shows a top view 60 of a 4×3 array of polysilicon fuses with a diode constructed from a P+ polysilicon 61 and an N-type buried layer 62 at cross points according to one embodiment. The buried layer 62 is an active region with an implant before the N+ or P+ implants 64 and 63 for sources or drains of CMOS. Therefore, the buried layer 62 can be used as an interconnect underneath and can be crossed by the P+ polysilicon 61 provided above. In this embodiment, the buried layer 62 is implanted with an N-type dopant after active-region isolation is fabricated. The gate oxide grown on top of the buried layer 62 is stripped before the P+ polysilicon 61 is deposited. The polysilicon is partly implanted by a P-type dopant as the P terminal of a diode, and partly implanted by an N-type dopant as an N-type polysilicon fuse, though a silicide on top connects the two parts. As a result, a very compact P/N polysilicon fuse with a P-type polysilicon and N-type bulk silicon as two terminals of a diode is constructed. Metal 2 straps the buried layer 62, (not shown in FIG. 8(c)), running in the vertical direction as a bitline, and metal 3 straps the polysilicon through contacts 65 running in the horizontal direction as a wordline.

Figure 9A:
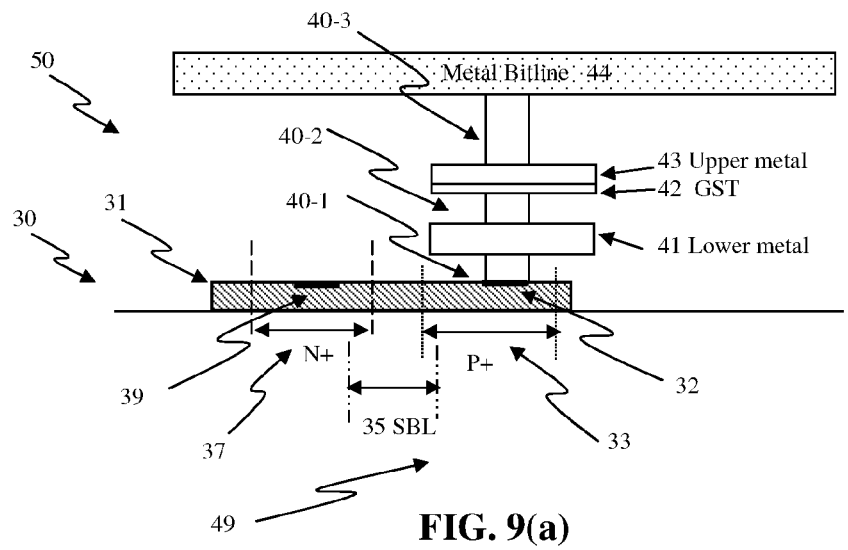
FIG. 9(a) shows a cross section of a programmable resistive device cell using phase-change material as a resistive element, with buffer metals and a polysilicon diode, according to one embodiment.

FIG. 9(a) shows a cross section of a programmable resistive device cell 50 using phase-change material as a resistive element 42, with buffer metals 41 and 43, and a polysilicon diode 30 on a silicon substrate with a dielectric 49, according to one embodiment. The polysilicon diode 30 has a P+ implant 33 and N+ implant 37 on a polysilicon substrate 31 as P and N terminals through anode contact 32 and cathode contact 39. A SBL 35 separates the P+ implant 33 from the N+ implant 37. The anode 32 of the polysilicon diode 30 is coupled to a lower metal 41 as a buffer layer through a contact plug 40-1. The lower metal 41 is then coupled to a thin film of phase-change material 42 (e.g., PCM film) and an upper metal buffer layer 43 through a contact plug 40-2. The upper metal is coupled to another metal 44 to act as a bitline (BL) through a plug 40-3. The PCM film 42 can have a chemical composition of Germanium (Ge), Antimony (Sb), and/or Tellurium (Te), such as $Ge_xSb_yTe_z$ (x, y, and z are any arbitrary numbers) or, more particularly, $Ge_2Sb_2Te_5$. (GST-225). The PCM film 42 can be doped with at least one or more of Indium (In), Tin (Sn), or Selenium (Se) to enhance performance. The PCM structure can be substantially planar, which means the PCM film area is larger than the film contact area coupled to the program selector (polysilicon diode 30), or the height from the surface of the silicon substrate to the film is much smaller than the dimensions of the film parallel to silicon substrate. In this embodiment, the active area of PCM film 42 (e.g., GST film) is much larger than the contact area so that the programming characteristics can be more uniform and reproducible. The GST film 42 is not a vertical structure and does not sit on top of a tall contact, which is more suitable for embedded PCM applications, especially when the polysilicon diode 30 is used as program selector to make the cell size very small. For those skilled in the art understand that the structure and fabrication processes may vary and that the structures of GST film and buffer metals described above are for illustrative purpose.

Figure 9B:
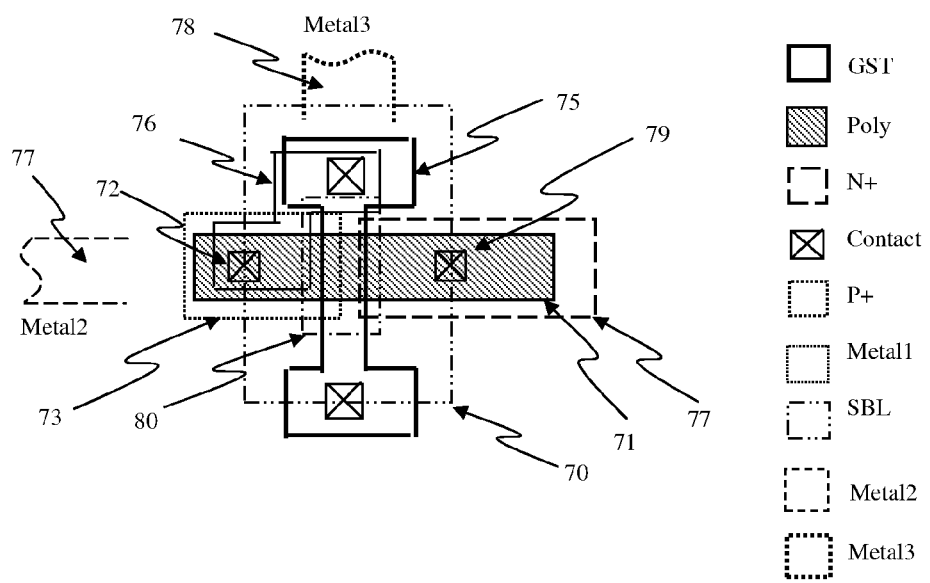
FIG. 9(b) shows a top view of a PCM cell with a polysilicon diode as program selector having a cell boundary in accordance with one embodiment.

FIG. 9(b) shows a top view of a PCM cell using a polysilicon diode as program selector with a cell boundary 70 in accordance with one embodiment. The PCM cell has a polysilicon diode 71 and a phase-change material 75. The polysilicon diode 71 has an anode 72 and a cathode 79 covered by P+ and N+ implants 73 and 77, respectively. A SBL 80 blocks silicide formation on the top of polysilicon diode 71 to prevent the anode 72 from shorting to the cathode 79. The anode 72 is coupled to the phase-change film 75 through a metal1 76. The phase-change film 75 is further coupled to a metal3 bitline (BL) 78 running vertically. The cathode 79 of the polysilicon diode 71 is connected by a metal2 wordline (WL) 77 running horizontally. By applying a proper voltage between the bitline 78 and the wordline 77 for a suitable duration, the phase-change film can be programmed into a 0 or 1 state accordingly. Since programming the phase-change film is based on raising the temperature rather than electromigration as with an electrical fuse, the phase-change film (e.g., GST film) can be symmetrical in area for both anode and cathode. Those skilled in the art understand that the phase-change film, structure, layout style, and metal schemes may vary and that the above description is for illustrative purpose.

Programming a phase-change memory, such as a phase-change film, depends on the physical properties of the phase-change film, such as glass transition and melting temperatures. To reset, the phase-change film needs to be heated up beyond the melting temperature and then quenched. To set, the phase-change film needs to be heated up between melting and glass transition temperatures and then annealed. A typical phase-change film has glass transition temperature of about 200° C. and melting temperature of about 600° C. These temperatures determine the operation temperature of a phase-change memory because the resistance state may change after staying in a particular temperature for a long time. However, most applications require retaining data for 10 years for the operation temperature from 0 to 85° C. or even from −40 to 125° C. To maintain cell stability over the device's lifetime and over such a wide temperature range, periodic reading and then writing back data into the same cells can be performed. The refresh period can be quite long, e.g., longer than a second, such as days, weeks, or even months. The refresh mechanism can be generated inside the memory or triggered from outside the memory. The long refresh mechanism can serve to maintain cell stability be applied to other emerging memories such as RRAM, CBRAM, and MRAM, etc.

Figure 10:
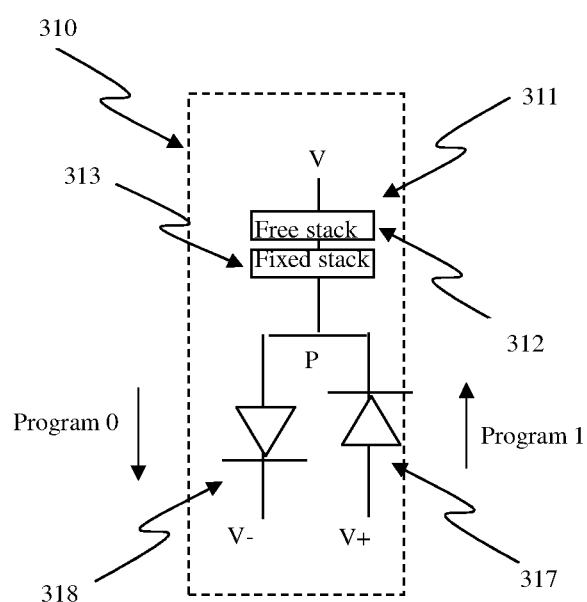
FIG. 10 shows one embodiment of an MRAM cell using diodes as program selectors in accordance with one embodiment.

FIG. 10 shows one embodiment of an MRAM cell 310 using diodes 317 and 318 as program selectors in accordance with one embodiment. The MRAM cell 310 in FIG. 10 is a three-terminal MRAM cell. The MRAM cell 310 has an MTJ 311, including a free layer stack 312 and a fixed layer stack 313 with a dielectric film in between, and the two diodes 317 and 318. The free layer stack 312 is coupled to a supply voltage V, and coupled to the fixed layer stack 313 through a metal oxide such as $Al_2O_3$ or MgO. The diode 317 has the N terminal coupled to the fixed layer stack 313 and the P terminal coupled to V+ for programming a 1. The diode 318 has the P terminal coupled to the fixed layer stack 313 and the N terminal coupled to V− for programming a 0. If V+ voltage is higher than V, a current flows from V+ to V to program the MTJ 311 into state 1. Similarly, if V− voltage is lower than V, a current flows from V to V− to program the MTJ 311 into state 0. During programming, the other diode is supposedly cutoff. For reading, V+ and V− can be both set to 0V and the resistance between node V and V+/V− can be sensed to determine whether the MTJ 311 is in state 0 or 1.

Figure 11A:
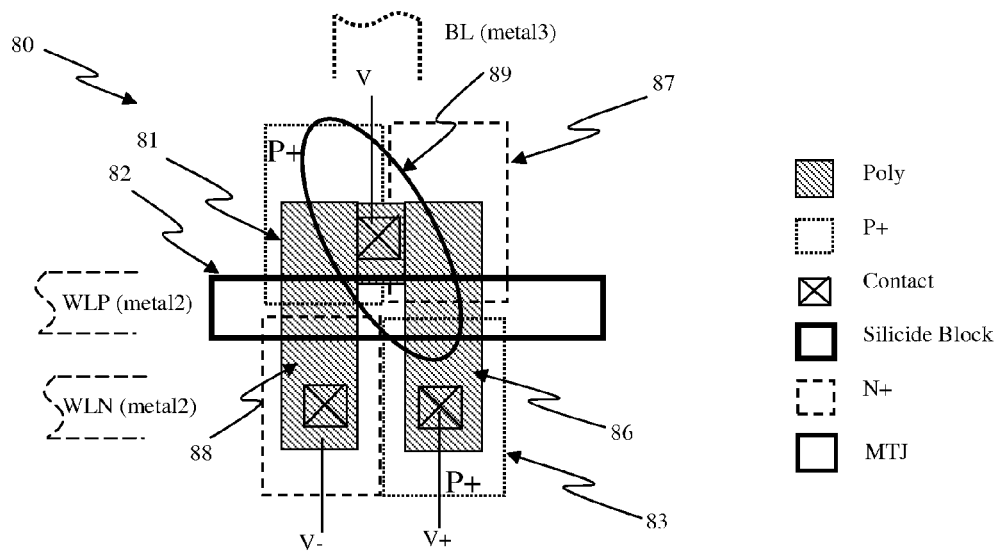
FIG. 11(a) shows a top view of an MRAM cell with an MTJ as a resistive element and with polysilicon diodes and as program selectors in accordance with one embodiment.

FIG. 11(a) shows a top view of an MRAM cell 80 with an MTJ 89 as a resistive element and with polysilicon diodes 86 and 88 as program selectors in accordance with one embodiment. The MTJ 89 has a slant ellipse shape with a free layer stack on top, a fixed layer stack underneath, and a dielectric in between to constitute a magnetic tunneling junction. The MTJ 89 is coupled to a metal3 bitline on top running vertically. Program-1 diode 86 and program-0 diode 88 are polysilicon diodes built on two sections (e.g., rectangles) of polysilicon 81 and are placed side by side and connected at one end, i.e., the N terminal of the diode 86 is connected to the P terminal of the diode 88. A P+ implant 83 and an N+ implant 87 define the P and N terminals of the diodes 86 and 88. A SBL 82 can be provided to prevent shorting. The program-1 diode 86 has the P terminal coupled to a supply voltage V+ and has the N terminal coupled to the fixed stack of MTJ 89. The program-0 diode 88 has the N terminal coupled to a supply voltage V− and has the P terminal coupled to the fixed stack of MTJ 89. The V+ and V− voltages of each MRAM cell 80 are connected as metal2 wordlines, WLP and WLN, running horizontally.

Figure 11B:
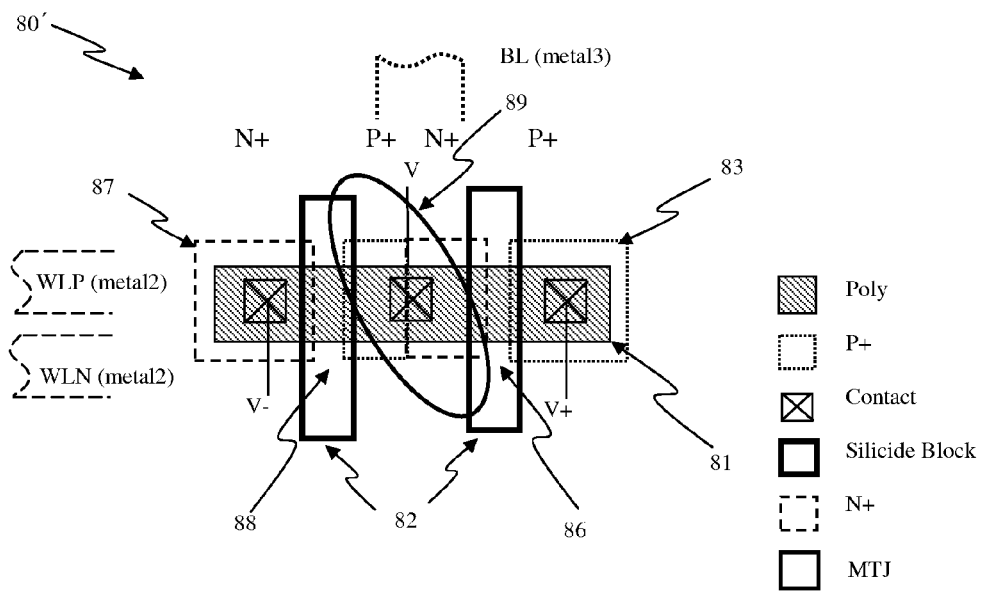
FIG. 11(b) shows another top view of a MRAM cell with the MTJ as a resistive element and with the polysilicon diodes as program selectors in accordance with another embodiment.

FIG. 11(b) shows another top view of a MRAM cell 80' with the MTJ 89 as a resistive element and with the polysilicon diodes 86 and 88 as program selectors in accordance with another embodiment. The MTJ 89 has a slant ellipse shape with a free layer stack on top, a fixed layer stack underneath, and a dielectric in between to constitute a magnetic tunneling junction. The MTJ 89 is coupled to a metal3 bitline on top running vertically. The Program-1 diode 86 and the program-0 diode 88 are connected back to back in a one-piece polysilicon section 81 (e.g., rectangle). Namely, the N terminal of the diode 86 is connected to the P terminal of the diode 88. A P+ implant 83 and an N+ implant 87 define the P and N terminals of the diodes 86 and 88. The SBL 82 has two sections provided to prevent shorting. The program-1 diode 86 has the P terminal coupled to a supply voltage V+ and the N terminal coupled to the fixed stack of MTJ 89. The program-0 diode 88 has the N terminal coupled to a supply voltage V− and the P terminal coupled to the fixed stack of MTJ 89. The V+ and V− voltages of each MRAM cell 80' are connected in metal2 wordlines, WLP and WLN, running horizontally. The top views shown in FIGS. 11(a) and (b) are for illustrative purposes and those skilled in the art understand that there are many ways of constructing polysilicion diodes coupled with a MTJ and metal schemes.

Figure 11C:
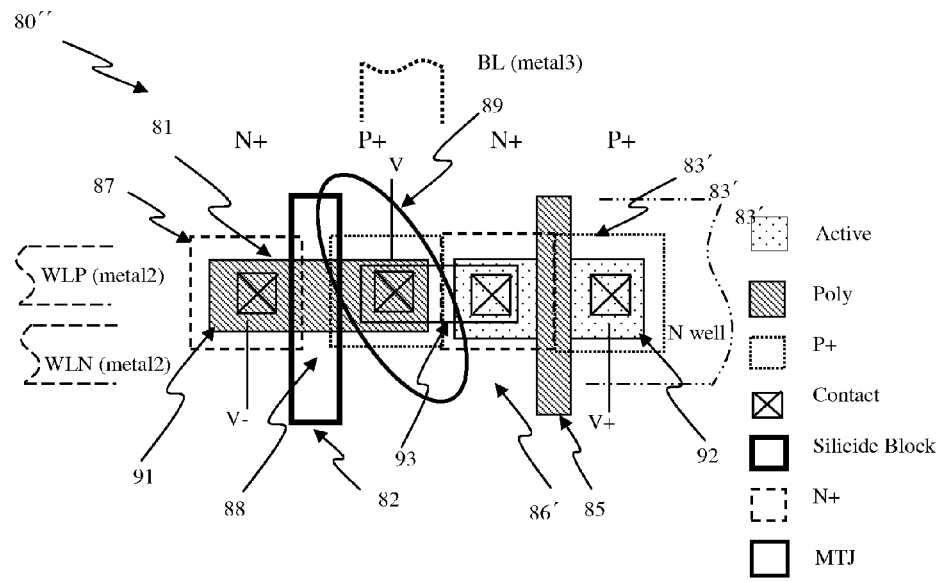
FIG. 11(c) shows another top view of a MRAM cell by using one polysilicon diode and one junction diode in accordance with one embodiment.
Figure 11D:
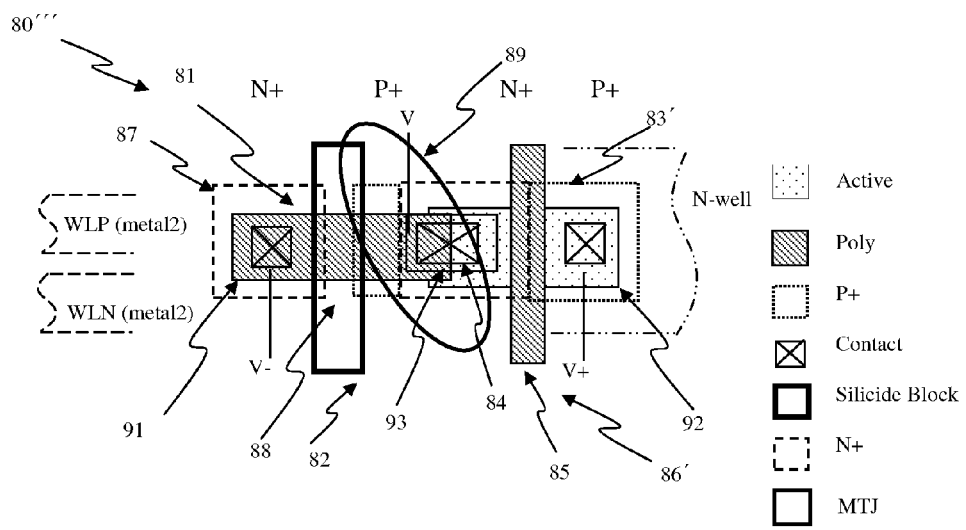
FIG. 11(d) shows another top view of a MRAM cell by using one polysilicon diode and one junction diode with an abutted contact in accordance with another embodiment.

FIG. 11(c) shows another top view of a MRAM cell 80" by using one polysilicon diode 88 and one junction diode 86' in accordance with one embodiment. The P+ implant 83' and N+ implant 87 define the P and the N terminals of diodes the 88 and 86' over a polysilicon section 91 and an active region 92, respectively. The junction diode 86' is housed in an N well for CMOS devices, and has the P terminal coupled to a supply voltage V+ and the N terminal coupled to the P terminal of the polysilicon diode 88 and then to another supply voltage V through the MTJ 89 and the metal1 93. A dummy CMOS gate 85 can separate the P and N terminals of the junction diode 86. Similarly, the polysilicon diode 88 has the N terminal coupled to a supply voltage V− and the P terminal coupled to the N terminal of the junction diode 86' and to a supply voltage V through the MTJ 89 and the metal1 93. The SBL 82 separates the P and N terminals of the polysilicon diode 88. The supply voltage V is further coupled to a metal3 bitline running vertically, while the supply voltages V+ and V− are coupled to metal2 wordlines, WLP and WLN, running horizontally.

FIG. 11(*d*) shows another top view of a MRAM cell 80''' by using one polysilicon diode 88 and one junction diode 86' with an abutted contact 84 in accordance with another embodiment. The P+ implant 83' and the N+ implant 87 define the P and N terminals of the diodes 88 and 86' over a polysilicon section 91 and an active region 92, respectively. The junction diode 86' is housed in an N well for CMOS devices, and has the P terminal coupled to a supply voltage V+ and the N terminal coupled to the P terminal of the polysilicon diode 88 and to another supply voltage V through the MTJ 89 and the metal1 93. The dummy CMOS gate 85 can separate the P and N terminals of the junction diode 86'. Similarly, the polysilicon diode 88 has the N terminal coupled to a supply voltage V− and the P terminal coupled to the N terminal of the junction diode 86' and to a supply voltage V through the MTJ 89 and the metal1 93. The SBL 82 separates the P and N terminals of the polysilicon diode 88. The supply voltage V is further coupled to a metal3 bitline running vertically, while the supply voltage V+ and V− are coupled to metal2 wordlines, WLP and WLN, running horizontally. A contact to couple the N terminal of the junction diode 86' and the P terminal of the polysilicon diode 88 is through an abutted contact 84. The polysilicon 91 overlaps into the action region 92 with a metal1 93 on top to connect polysilicon and active region in a single contact 84. Hence, two contacts are merged into one and thus polysilicon-to-active spacing can be saved to reduce area and costs, thereby rendering this embodiment particularly efficient. Using of junction diode and polysilicon diodes in FIGS. 11(*c*) and 11(*d*) as program-1 and program-0 diodes, respectively, can be interchangeable. Those skilled in the art understand that various embodiments of mixing different kinds of diodes in various configurations for memory are possible and that they are still within the scope of this invention.

Figures 12A, 12B:
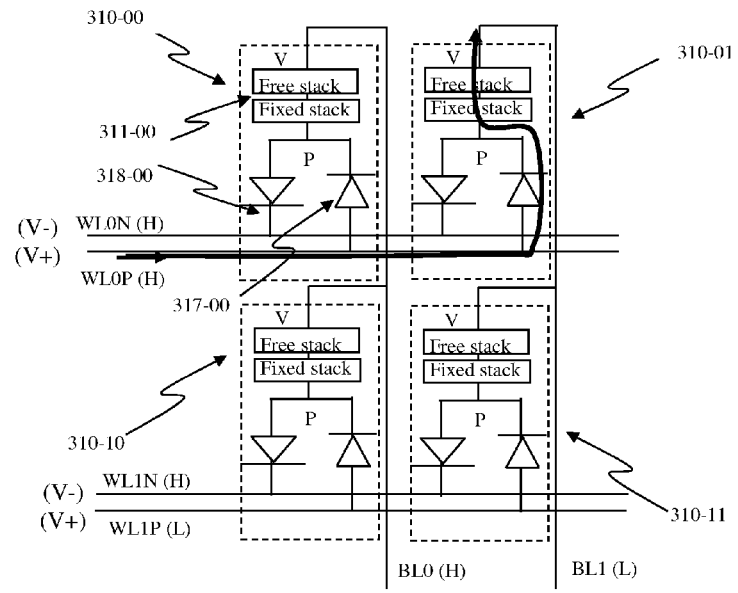
FIG. 12(a) shows one embodiment of a three-terminal 2×2 MRAM cell array using diodes as program selectors and the condition to program the upper-right cell into 1 in accordance with one embodiment.
FIG. 12(b) shows alternative conditions to program the upper-right cell into 1 in a 2×2 MRAM array in accordance with one embodiment.

FIG. 12(*a*) shows one embodiment of a three-terminal 2×2 MRAM cell array using diodes 317 and 318 as program selectors and the condition to program 1 in a cell in accordance with one embodiment. Cells 310-00, 310-01, 310-10, and 310-11 are organized as a two-dimensional array. The cell 310-00 has a MTJ 311-00, a program-1 diode 317-00, and a program-0 diode 318-00. The MTJ 311-00 is coupled to a supply voltage V at one end, to the N terminal of the program-1 diode 317-00 and to the P terminal of the program-0 diode 318-00 at the other end. The P terminal of the program-1 diode 317-00 is coupled to a supply voltage V+. The N terminal of the program-0 diode 318-00 is coupled to another supply voltage V−. The other cells 310-01, 310-10, and 310-11 are similarly coupled. The voltage Vs of the cells 310-00 and 310-10 in the same columns are connected to BL0. The voltage Vs of the cells 310-01 and 310-11 in the same column are connected to BL1. The voltages V+ and V− of the cells 310-00 and 310-01 in the same row are connected to WL0P and WL0N, respectively. The voltages V+ and V− of the cells 310-10 and 310-11 in the same row are connected to WL1P and WL1N, respectively. To program a 1 into the cell 310-01, WL0P is set high and BL1 is set low, while setting the other BL and WLs at proper voltages as shown in FIG. 12(*a*) to disable the other program-1 and program-0 diodes. The bold line in FIG. 12(*a*) shows the direction of current flow.

FIG. 12(*b*) shows alternative program-1 conditions for the cell 310-01 in a 2×2 MRAM array in accordance with one embodiment. For example, to program a 1 into cell 310-01, set BL1 and WL0P to low and high, respectively. If BL0 is set to high in condition 1, the WL0N and WL1N can be either high or floating, and WL1P can be either low or floating. The high and low voltages of an MRAM in today's technologies are about 2-3V for high voltage and 0 for low voltage, respectively. If BL0 is floating in condition 2, WL0N and WL1N can be high, low, or floating, and WL1P can be either low or floating. In a practical implementation, the floating nodes are usually coupled to very weak devices to a fixed voltage to prevent leakage. One embodiment of the program-1 condition is shown in FIG. 12(*a*) without any nodes floating.

Figures 13A, 13B:
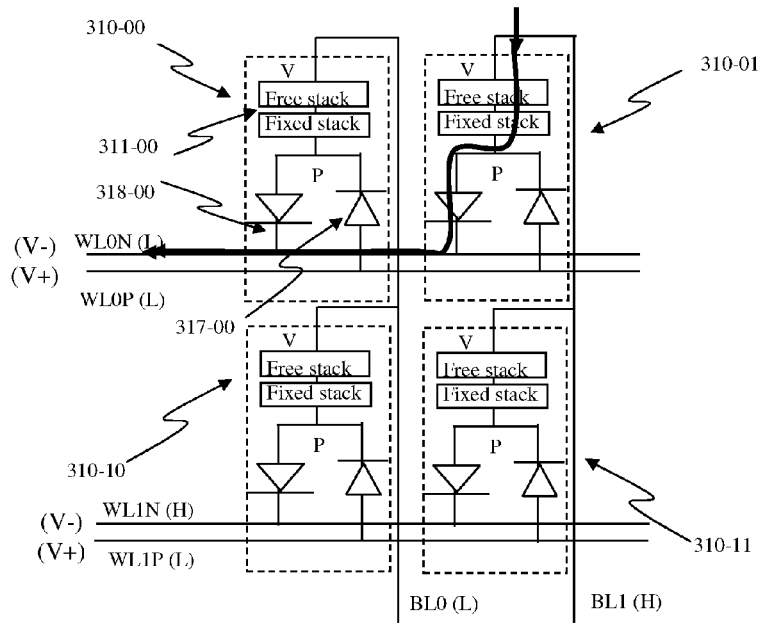
FIG. 13(a) shows one embodiment of a three-terminal 2×2 MRAM cell array using diodes as program selectors and the condition to program the upper-right cell into 0 in accordance with one embodiment.
FIG. 13(b) shows alternative conditions to program the upper-right cell into 0 in a 2×2 MRAM array in accordance with one embodiment.

FIG. 13(*a*) shows one embodiment of a three-terminal 2×2 MRAM cell array with MTJ 311 and diodes 317 and 318 as program selectors and the condition to program 0 in a cell in accordance with one embodiment. The cells 310-00, 310-01, 310-10, and 310-11 are organized as a two-dimensional array. The cell 310-00 has a MTJ 311-00, a program-1 diode 317-00, and a program-0 diode 318-00. The MTJ 311-00 is coupled to a supply voltage V at one end, to the N terminal of program-1 diode 317-00 and to the P terminal of program-0 diode 318-00 at the other end. The P terminal of the program-1 diode 317-00 is coupled to a supply voltage V+. The N terminal of the program-0 diode 318-00 is coupled to another supply voltage V−. The other cells 310-01, 310-10, and 310-11 are similarly coupled. The voltage Vs of the cells 310-00 and 310-10 in the same columns are connected to BL0. The voltage Vs of the cells 310-01 and 310-11 in the same column are connected to BL1. The voltages V+ and V− of the cells 310-00 and 310-01 in the same row are connected to WL0P and WL0N, respectively. The voltages V+ and V− of the cells 310-10 and 310-11 in the same row are connected to WL1P and WL1N, respectively. To program a 0 into the cell 310-01, WL0N is set low and BL1 is set high, while setting the other BL and WLs at proper voltages as shown in FIG. 13(*a*) to disable the other program-1 and program-0 diodes. The bold line in FIG. 13(*a*) shows the direction of current flow.

FIG. 13(*b*) shows alternative program-0 conditions for the cell 310-01 in a 2×2 MRAM array in accordance with one embodiment. For example, to program a 0 into cell 310-01, set BL1 and WL0N to high and low, respectively. If BL0 is set to low in condition 1, the WL0P and WL1P can be either low or floating, and WL1N can be either high or floating. The high and low voltages of an MRAM in today's technologies are about 2-3V for high voltage and 0 for low voltage, respectively. If BL0 is floating in condition 2, WL0P and WL1P can be high, low, or floating, and WL1N can be either high or floating. In a practical implementation, the floating nodes are usually coupled to very weak devices to a fixed voltage to prevent leakage. One embodiment of the program-0 condition is as shown in FIG. 13(*a*) without any nodes floating.

The cells in 2×2 MRAM arrays in FIGS. 12(*a*), 12(*b*), 13(*a*) and 13(*b*) are three-terminal cells, namely, cells with V, V+, and V− nodes. However, if the program voltage VDDP is less than twice a diode's threshold voltage Vd, i.e.

Figure 14A:
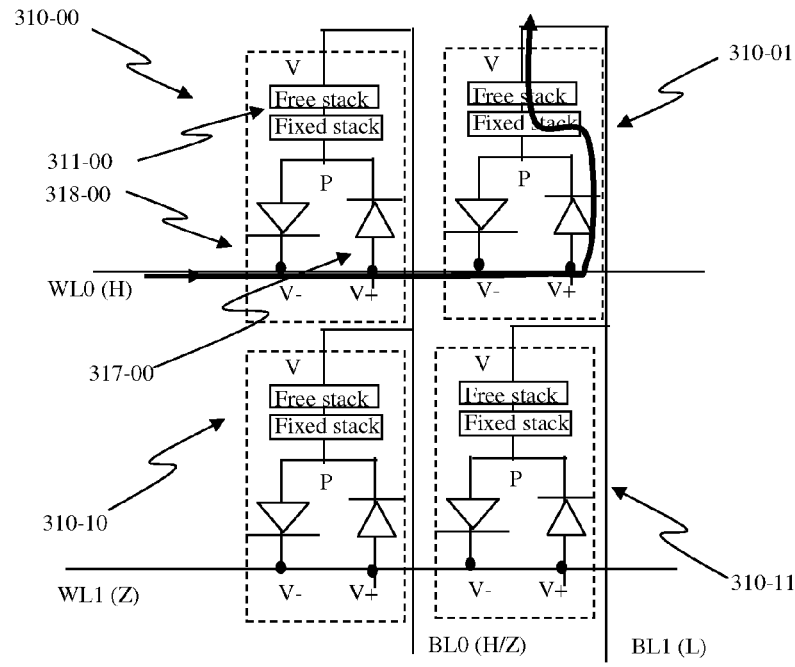
FIGS. 14(a) and 14(b) show one embodiment of programming 1 and 0 into the upper-right cell, respectively, in a two-terminal 2×2 MRAM cell array in accordance with one embodiment.
Figure 14B:
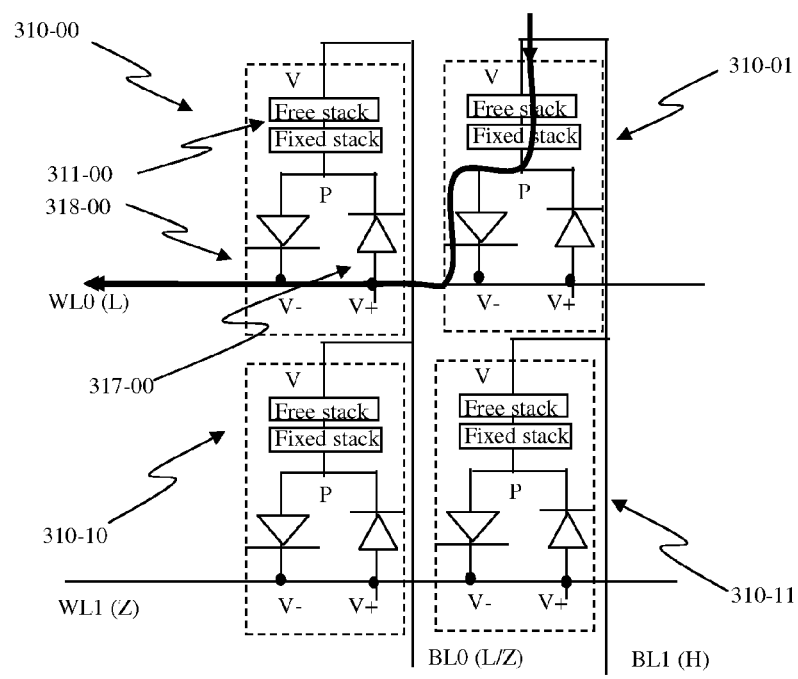

VDDP<2*Vd, the V+ and V− nodes of the same cell can be connected together as a two-terminal cell. Since Vd is about 0.6-0.7V at room temperature, this two-terminal cell works if the program high voltage is less than 1.2V and low voltage is 0V. This is a common voltage configuration of MRAM arrays for advanced CMOS technologies that has supply voltage of about 1.0V. FIGS. 14(a) and 14(b) show schematics for programming a 1 and 0, respectively, in a two-terminal 2×2 MRAM array.

FIGS. 14(a) and 14(b) show one embodiment of programming 1 and 0, respectively, in a two-terminal 2×2 MRAM cell array in accordance with one embodiment. The cells 310-00, 310-01, 310-10, and 310-11 are organized in a two-dimensional array. The cell 310-00 has the MTJ 311-00, the program-1 diode 317-00, and the program-0 diode 318-00. The MTJ 311-00 is coupled to a supply voltage V at one end, to the N terminal of program-1 diode 317-00 and the P terminal of program-0 diode 318-00 at the other end. The P terminal of the program-1 diode 317-00 is coupled to a supply voltage V+. The N terminal of the program-0 diode 318-00 is coupled to another supply voltage V−. The voltages V+ and V− are connected together in the cell level if VDDP<2*Vd can be met. The other cells 310-01, 310-10 and 310-11 are similarly coupled. The voltages Vs of the cells 310-00 and 310-10 in the same columns are connected to BL0. The voltage Vs of the cells 310-01 and 310-11 in the same column are connected to BL1. The voltages V+ and V− of the cells 310-00 and 310-01 in the same row are connected to WL0. The voltages V+ and V− of the cells 310-10 and 310-11 in the same row are connected to WL1.

To program a 1 into the cell 310-01, WL0 is set high and BL1 is set low, while setting the other BL and WLs at proper voltages as shown in FIG. 14(a) to disable other program-1 and program-0 diodes. The bold line in FIG. 14(a) shows the direction of current flow. To program a 0 into the cell 310-01, WL0 is set low and BL1 is set high, while setting the other BL and WLs at proper voltages as shown in FIG. 14(b) to disable the other program-1 and program-0 diodes. The bold line in FIG. 14(b) shows the direction of current flow.

The embodiments of constructing MRAM cells in a 2×2 array as shown in FIGS. 12(a)-14(b) are for illustrative purposes. Those skilled in the art understand that the number of cells, rows, or columns in a memory can be constructed arbitrarily and rows and columns are interchangeable.

Figure 15:
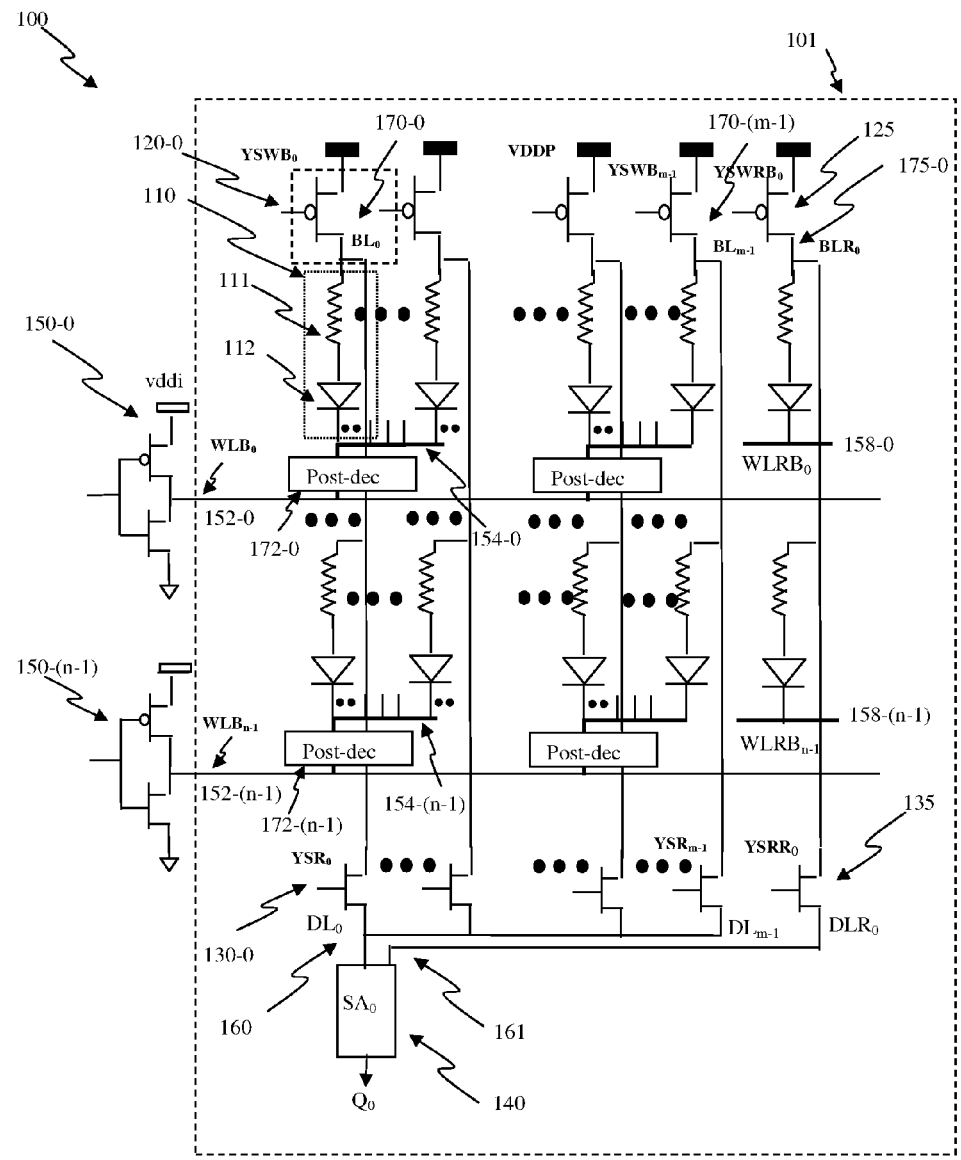
FIG. 15 shows a portion of a programmable resistive memory constructed by an array of n-row by (m+1)-column non-MRAM cells and n wordline drivers in accordance with one embodiment.

The programmable resistive devices can be used to construct a memory in accordance with one embodiment. FIG. 15 shows a portion of a programmable resistive memory 100 constructed by an array 101 of n-row by (m+1)-column non-MRAM cells 110 and n wordline drivers 150-$i$, where $i=0, 1, \ldots, n-1$, in accordance with one embodiment. The memory array 101 has m normal columns and one reference column for one shared sense amplifier 140 for differential sensing. Each of the memory cells 110 has a resistive element 111 coupled to the P terminal of a diode 112 as program selector and to a bitline BLj 170-$j$ ($j=0, 1, \ldots m-1$) or reference bitline BLR0 175-0 for those of the memory cells 110 in the same column. The N terminal of the diode 112 is coupled to a wordline WLBi 152-$i$ through a local wordline LWLBi 154-$i$, where $i=0, 1, \ldots, n-1$, for those of the memory cells 110 in the same row. Each wordline WLBi is coupled to at least one local wordline LWLBi, where $i=0, 1, \ldots, n-1$. The LWLBi 154-$i$ is generally constructed by a high resistivity material, such as N well or polysilicon, to connect cells, and then coupled to the WLBi (e.g., a low-resistivity metal WLBi) through conductive contacts or vias, buffers, or post-decoders 172-$i$, where $i=0, 1, \ldots, n-1$. Buffers or post-decoders 172-$i$ may be needed when using diodes as program selectors because there are currents flowing through the WLBi, especially when one WLBi drives multiple cells for program or read simultaneously in other embodiments. The wordline WLBi is driven by the wordline driver 150-$i$ with a supply voltage vddi that can be switched between different voltages for program and read. Each BLj 170-$j$ or BLR0 175-0 is coupled to a supply voltage VDDP through a Y-write pass gate 120-$j$ or 125 for programming, where each BLj 170-$j$ or BLR0 175-0 is selected by YSWBj ($j=0, 1, \ldots, m-1$) or YSWRB0, respectively. The Y-write pass gate 120-$j$ ($j=0, 1, \ldots, m-1$) or 125 can be built by PMOS, though NMOS, diode, or bipolar devices can be employed in some embodiments. Each BL or BLR0 is coupled to a dataline DL or DLR0 through a Y-read pass gate 130-$j$ or 135 selected by YSRj ($j=0, 1, \ldots, m-1$) or YSRR0, respectively. In this portion of memory array 101, m normal datalines DLj ($j=0, 1, \ldots, m-1$) are connected to an input 160 of a sense amplifier 140. The reference dataline DLR0 provides another input 161 for the sense amplifier 140 (no multiplex is generally needed in the reference branch). The output of the sense amplifiers 140 is Q0.

To program a cell, the specific WLBi and YSWBj are turned on and a high voltage is supplied to VDDP, where $i=0, 1, \ldots n-1$ and $j=0, 1, \ldots, m-1$. In some embodiments, the reference cells can be programmed to 0 or 1 by turning on WLRBi, and YSWRB0, where $i=0, 1, \ldots, n-1$. To read a cell, a data column 160 can be selected by turning on the specific WLBi and YSRj, where $i=0, 1, \ldots, n-1$, and $j=0, 1, \ldots, m-1$, and a reference cell coupled to the reference dataline DLR0 161 for the sense amplifier 140 can be selected to sense and compare the resistance difference between BLs and ground, while disabling all YSWBj and YSWRB0 where $j=0, 1, \ldots, m-1$.

Figure 16A:
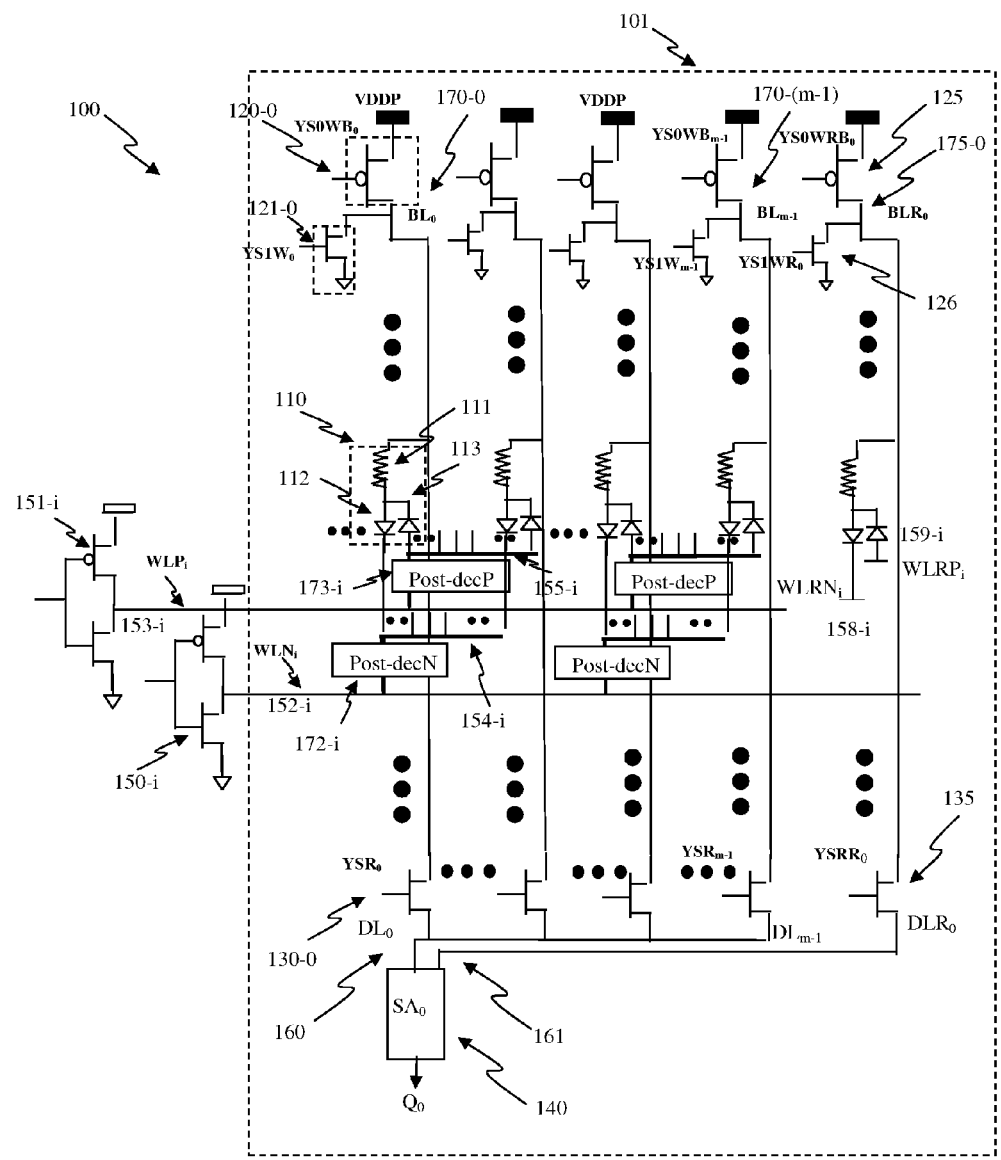
FIG. 16(a) shows a portion of a programmable resistive memory constructed by an array of 3-terminal MRAM cells according to one embodiment.

The programmable resistive devices can be used to construct a memory in accordance with one embodiment. FIG. 16(a) shows a portion of a programmable resistive memory 100 constructed by an array 101 of 3-terminal MRAM cells 110 in n rows and m+1 columns and n pairs of wordline drivers 150-$i$ and 151-$i$, where $i=0, 1, \ldots, n-1$, according to one embodiment. The memory array 101 has m normal columns and one reference column for one shared sense amplifier 140 for differential sensing. Each of the memory cells 110 has a resistive element 111 coupled to the P terminal of a program-0 diode 112 and N terminal of a program-1 diode 113. The program-0 diode 112 and the program-1 diode 113 serve as program selectors. Each resistive element 111 is also coupled to a bitline BLj 1701 ($j=0, 1, \ldots m-1$) or reference bitline BLR0 175-0 for those of the memory cells 110 in the same column. The N terminal of the diode 112 is coupled to a wordline WLNi 152-$i$ through a local wordline LWLNi 154-$i$, where $i=0, 1, \ldots, n-1$, for those of the memory cells 110 in the same row. The P terminal of the diode 113 is coupled to a wordline WLPi 153-$i$ through a local wordline LWLPi 155-$i$, where $i=0, 1, \ldots, n-1$, for those cells in the same row. Each wordline WLNi or WLPi is coupled to at least one local wordline LWLNi or LWLPi, respectively, where $i=0, 1, \ldots, n-1$. The LWLNi 154-$i$ and LWLPi 155-$i$ are generally constructed by a high resistivity material, such as N well or polysilicon, to connect cells, and then coupled to the WLNi or WLPi (e.g., low-resistivity metal WLNi or WLPi) through conductive contacts or vias, buffers, or post-decoders 172-$i$ or 173-$i$ respectively, where $i=0, 1, \ldots, n-1$. Buffers or post-decoders 172-$i$ or 173-$i$ may be needed when using diodes as program selectors because there are currents flowing through WLNi or WLPi, especially when one WLNi or WLPi drivers multiple cells for program or read simultaneously in some embodiments. The wordlines WLNi and WLPi are driven by wordline drivers 150-*i* and 151-*i*, respectively, with a supply voltage vddi that can be switched between different voltages for program and read. Each BLj 170-*j* or BLR0 175-0 is coupled to a supply voltage VDDP through a Y-write-0 pass gate 120-0 or 125 to program 0, where each BLj 1701 or BLR0 175-0 is selected by YS0WBj (j=0, 1, . . . , m−1) or YS0WRB0, respectively. Y-write-0 pass gate 120-*j* or 125 can be built by PMOS, though NMOS, diode, or bipolar devices can be employed in other embodiments. Similarly, each BLj 170-*j* or BLR0 175-0 is coupled to a supply voltage 0V through a Y-write-1 pass gate 121-*j* or 126 to program 1, where each BLj 1701 or BLR0 175-0 is selected by YS1Wj (j=0, 1, . . . , m−1) or YS1WR0, respectively. Y-write-1 pass gate 121-*j* or 126 is can be built by NMOS, though PMOS, diode, or bipolar devices can be employed in other embodiments. Each BL or BLR0 is coupled to a dataline DL or DLR0 through a Y-read pass gate 1301 or 135 selected by YSRj (j=0, 1, . . . , m−1) or YSRR0, respectively. In this portion of memory array 101, m normal datalines DLj (j=0, 1, . . . , m−1) are connected to an input 160 of a sense amplifier 140. Reference dataline DLR0 provides another input 161 for the sense amplifier 140, except that no multiplex is generally needed in a reference branch. The output of the sense amplifier 140 is Q0.

To program a 0 into a cell, the specific WLNi, WLPi and BLj are selected as shown in FIG. 13(*a*) or 13(*b*) by wordline drivers 150-*i*, 151-*i*, and Y-pass gate 1201 by YS0WBj, respectively, where i=0, 1, . . . n−1 and j=0, 1, . . . , m−1, while the other wordlines and bitlines are also properly set. A high voltage is applied to VDDP. In some embodiments, the reference cells can be programmed into 0 by setting proper voltages to WLRNi 158-*i*, WLRPi 159-*i* and YS0WRB0, where i=0, 1, . . . , n−1. To program a 1 to a cell, the specific WLNi, WLPi and BLj are selected as shown in FIG. 12(*a*) or 12(*b*) by wordline driver 150-*i*, 151-*i*, and Y-pass gate 121-*j* by YS1Wj, respectively, where i=0, 1, . . . n−1 and j=0, 1, . . . , m−1, while the other wordlines and bitlines are also properly set. In some embodiments, the reference cells can be programmed to 1 by setting proper voltages to WLRNi 158-*i*, WLRPi 159-*i* and YS1WR0, where i=0, 1, . . . , n−1. To read a cell, a data column 160 can be selected by turning on the specific WLNi, WLPi and YSRj, where i=0, 1, . . . , n−1, and j=0, 1, . . . , m−1, and a reference cell coupled to the reference dataline DLR 161 for the sense amplifier 140 to sense and compare the resistance difference between BLs and ground, while disabling all YS0WBj, YS0WRB0, YS1Wj and YS1WR0, where j=0, 1, . . . , m−1.

Figure 16B:
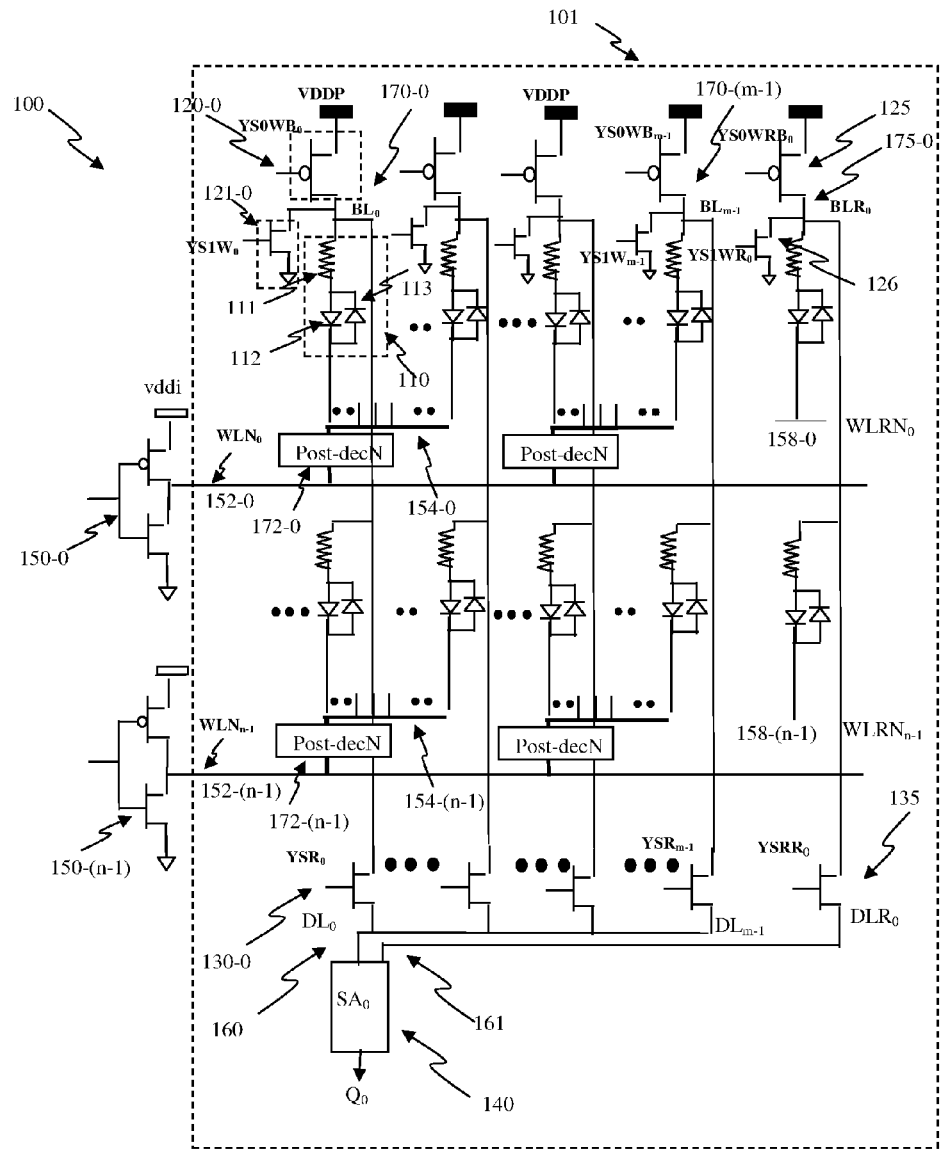
FIG. 16(b) shows another embodiment of constructing a portion of MRAM memory with 2-terminal MRAM cells.

Another embodiment of constructing an MRAM memory with 2-terminal MRAM cells is shown in FIG. 16(*b*), provided the voltage difference VDDP, between high and low states, is less than twice of the diode's threshold voltage Vd, i.e., VDDP<2*Vd. As shown in FIG. 16(*b*), two wordlines per row WLNi 152-*i* and WLPi 153-*i* in FIG. 16(*a*) can be merged into one wordline driver WLNi 152-*i*, where i=0, 1, . . . , n−1. Also, the local wordlines LWLNi 154-*i* and LWLP 155-*i* per row in FIG. 16(*a*) can be merged into one local wordline LWLNi 154-*i*, where i=0, 1, . . . , n−1, as shown in FIG. 16(*b*). Still further, two wordline drivers 150-*i* and 151-*i* in FIG. 16(*a*) can be merged into one, i.e., wordline driver 150-*i*. The BLs and WLNs of the unselected cells are applied with proper program 1 and 0 conditions as shown in FIGS. 14(*a*) and 14(*b*), respectively. Since half of wordlines, local wordlines, and wordline drivers can be eliminated in this embodiment, cell and macro areas can be reduced substantially.

Figure 17A:
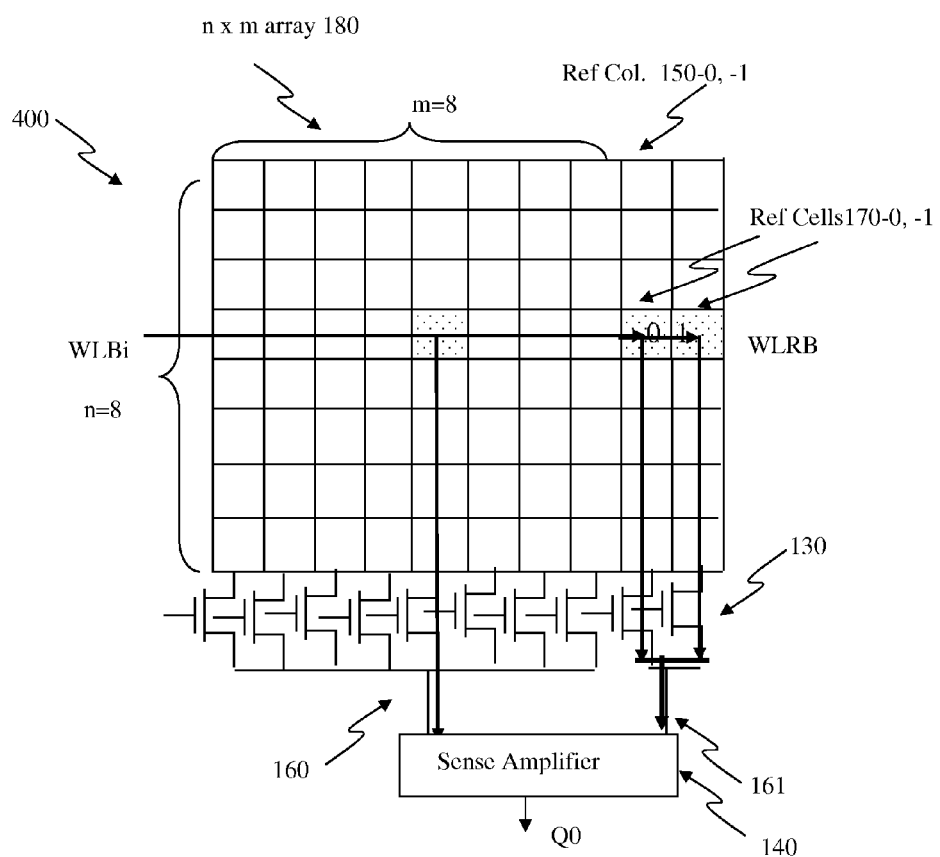
FIGS. 17(a), 17(b), and 17(c) show three other embodiments of constructing reference cells for differential sensing.
Figure 17B:
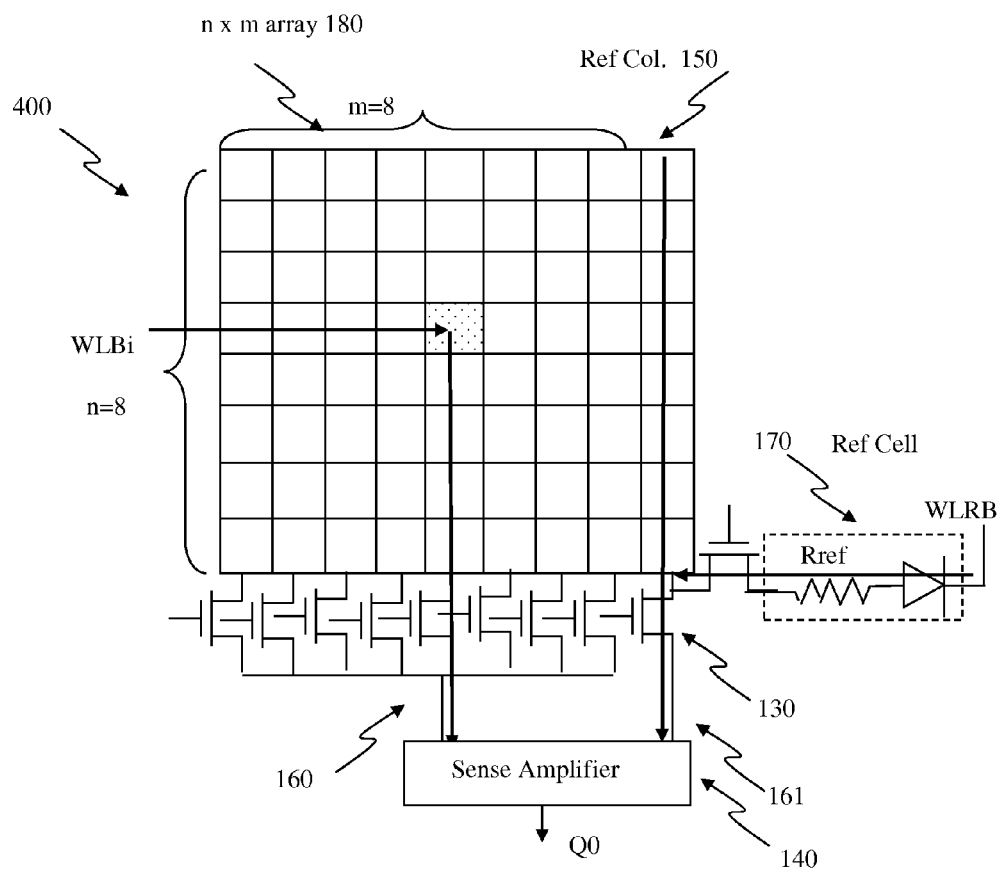
Figure 17C:
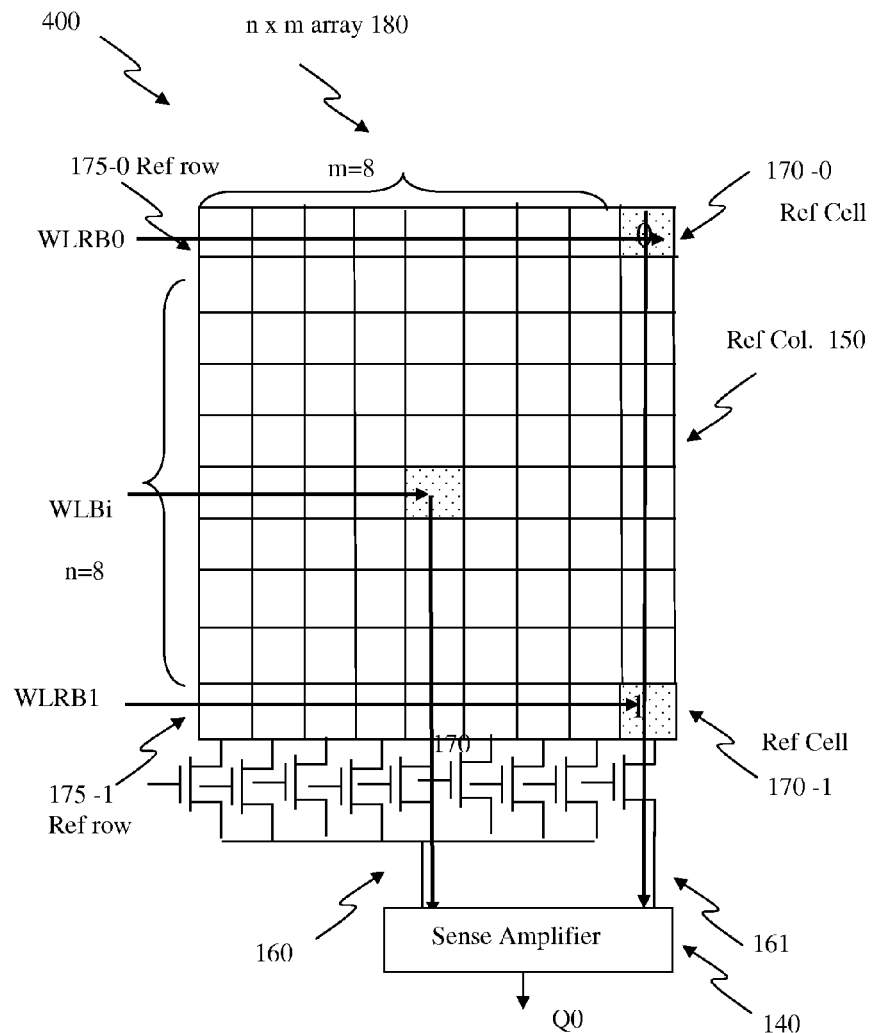

Differential sensing is a common for programmable resistive memory, though single-end sensing can be used in other embodiments. FIGS. 17(*a*), 17(*b*), and 17(*c*) show three other embodiments of constructing reference cells for differential sensing. In FIG. 17(*a*), a portion of memory 400 has a normal array 180 of n×m cells, two reference columns 150-0 and 150-1 of n×1 cells each storing all data 0 and 1 respectively, m+1 Y-read pass gates 130, and a sense amplifier 140. As an example, n=8 and m=8 are used to illustrate the concept. There are n wordlines WLBi and n reference wordlines WLRBi for each row, where i=0, 1, . . . , n−1. When a wordline WLBi is turned on to access a row, a corresponding reference wordline WLRBi (i=0, 1, . . . , n−1) is also turned on to activate two reference cells 170-0 and 170-1 in the same row to provide mid-level resistance after proper scaling in the sense amplifier. The selected dataline 160 along with the reference dataline 161 are input to a sense amplifier 140 to generate an output Q0. In this embodiment, each WLRBi and WLBi (i=0, 1, . . . , n−1) are hardwired together and every cells in the reference columns need to be pre-programmed before read.

FIG. 17(*b*) shows another embodiment of using a reference cell external to a reference column. In FIG. 17(*b*), a portion of memory 400 has a normal array 180 of n×m cells, a reference column 150 of n×1 cells, m+1 Y-read pass gates 130, and a sense amplifier 140. When a wordline WLBi (i=0, 1, . . . , n−1) is turned on, none of the cells in the reference column 150 are turned on. An external reference cell 170 with a pre-determined resistance is turned on instead by an external reference wordline WLRB. The selected dataline 160 and the reference dataline 161 are input to a sense amplifier 140 to generate an output Q0. In this embodiment, all internal reference wordlines WLRBi (i=0, 1, . . . , n−1) in each row are tied together to a high voltage to disable the diodes in the reference column. The reference column 150 provides a loading to match with that of the normal columns.

FIG. 17(*c*) shows another embodiment of constructing reference cells for differential sensing. In FIG. 17(*c*), a portion of memory 400 has a normal array 180 of n×m cells, one reference column 150 of n×1, two reference rows 175-0 and 175-1 of 1×m cells, m+1 Y-read pass gates 130, and a sense amplifier 140. As an example, n=8 and m=8 are used to illustrate the approach. There are n wordlines WLBi and 2 reference wordlines WLRB0 175-0 and WLRB1 175-1 on top and bottom of the array, where i=0, 1, . . . , n−1. When a wordline WLBi (i=0, 1, . . . , n−1) is turned on to access a row, the reference wordline WLRB0 and WLRB1 are also turned on to activate two reference cells 170-0 and 170-1 in the upper and lower right corners of the array 180, which store data 0 and 1 respectively. The selected dataline 160 along with the reference dataline 161 are input to a sense amplifier 140 to generate an output Q0. In this embodiment, all cells in the reference column 150 are disabled except that the cells 170-0 and 170-1 on top and bottom of the reference column 150. Only two reference cells are used for the entire n×m array that needs to be pre-programmed before read.

For those programmable resistive devices that have a very small resistance ratio between states 1 and 0, such as 2:1 ratio in MRAM, FIGS. 17(*a*) and 17(*c*) are desirable embodiments, depending on how many cells are suitable for one pair of reference cells. Otherwise, FIG. 17(*b*) is a desirable embodiment for electrical fuse or PCM that has resistance ratio of more than about 10.

FIGS. 15, 16(*a*), 16(*b*), 17(*a*), 17(*b*), and 17(*c*) show only a few embodiments of a portion of programmable resistive memory in a simplified manner. The memory array 101 in FIGS. 15, 16(*a*), and 16(*b*) can be replicated s times to read or program s-cells at the same time. In the case of differential sensing, the number of reference columns to normal columns may vary and the physical location can also vary relative to the normal data columns. Rows and columns are interchangeable. The numbers of rows, columns, or cells likewise may vary. For those skilled in the art understand that the above descriptions are for illustrative purpose. Various embodiments of array structures, configurations, and circuits are possible and are still within the scope of this invention.

The portions of programmable resistive memories shown in FIGS. 15, 16(a), 16(b), 17(a), 17(b) and 17(c) can include different types of resistive elements. The resistive element can be an electrical fuse including a fuse fabricated from an interconnect, contact/via fuse, contact/via anti-fuse, or gate oxide breakdown anti-fuse. The interconnect fuse can be formed from silicide, metal, metal alloy, or some combination thereof, or can be constructed from a CMOS gate. The resistive element can also be fabricated from phase-change material, MTJ, etc. For the electrical fuse fabricated from an interconnect, contact, or via fuse, programming requirement is to provide a sufficiently high current, about 4-20 mA range, for a few microseconds to blow the fuse by electro-migration, heat, ion diffusion, or some combination thereof. For anti-fuse, programming requirement is to provide a sufficiently high voltage to breakdown the dielectrics between two ends of a contact, via or CMOS gate. The required voltage is about 6-7V for a few millisecond to consume about 10 uA of current in today's technologies. Programming Phase-Change Memory (PCM) requires different voltages and durations for 0 and 1. Programming to a 1 (or to reset) requires a high and short voltage pulse applied to the phase-change film. Alternatively, programming to a 0 (or to set) requires a low and long voltage pulse applied to the phase change film. The reset needs about 3V for 50 ns and consumes about 300 uA, while set needs about 2V for 300 ns and consumes about 100 uA. For MRAM, the high and low program voltages are about 2-3V and 0V, respectively, and the current is about +/−100-200 uA.

Figure 18A:
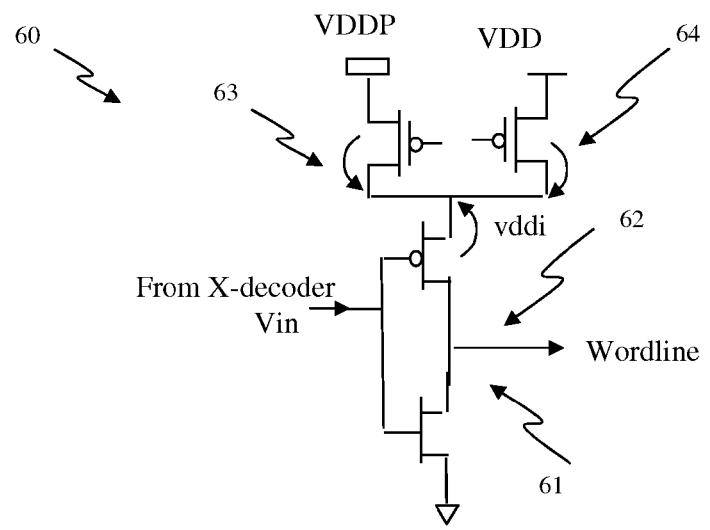
FIG. 18(a) shows a schematic of a wordline driver circuit according to one embodiment.

Most programmable resistive devices have a higher voltage VDDP (~2-3V) for programming than the core logic supply voltage VDD (~1.0V) for reading. FIG. 18(a) shows a schematic of a wordline driver circuit 60 according to one embodiment. The wordline driver includes devices 62 and 61, as shown as the wordline driver 150 in FIGS. 15, 16(a) and 16(b). The supply voltage vddi is further coupled to either VDDP or VDD through power selectors 63 and 64 (e.g., PMOS power selectors) respectively. The input of the wordline driver Vin is from an output of an X-decoder. In some embodiments, the power selectors 63 and 64 are implemented as thick oxide I/O devices to sustain high voltage. The bodies of power selector 63 and 64 can be tied to vddi to prevent latchup.

Figure 18B:
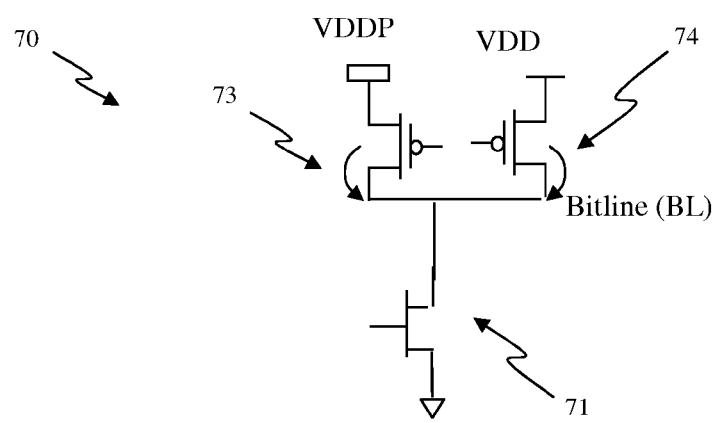
FIG. 18(b) shows a schematic of a bitline circuit according to one embodiment.

Similarly, bitlines tend to have a higher voltage VDDP (~2-3V) for programming than the core logic supply voltage VDD (~1.0V) for reading. FIG. 18(b) shows a schematic of a bitline circuit 70 according to one embodiment. The bitline circuit 70 includes a bitline (BL) coupled to VDDP and VDD through power selectors 73 and 74 (e.g., PMOS power selectors), respectively. If the bitline needs to sink a current such as in an MRAM, an NMOS pulldown device 71 can be provided. In some embodiments, the power selectors 73 and 74 as well as the pulldown device 71 can be implemented as thick-oxide I/O devices to sustain high voltage. The bodies of power selector 73 and 74 can be tied to vddi to prevent latchup.

Figure 18C:
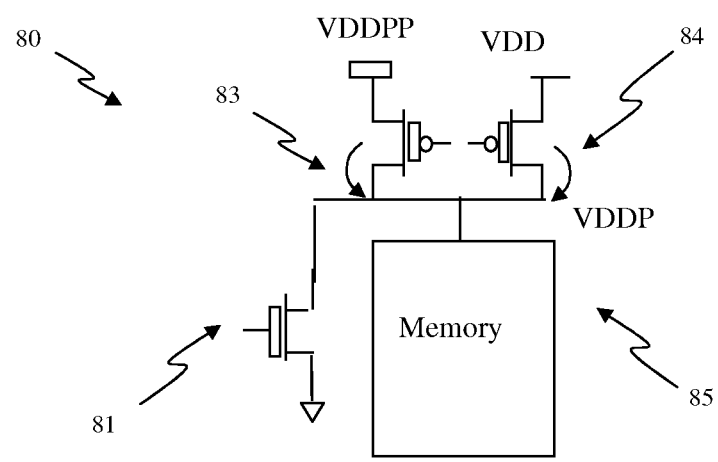
FIG. 18(c) shows a portion of memory with an internal power supply VDDP coupled to an external supply VDDPP and a core logic supply VDD through power selectors.

Using diodes as program selectors may have high leakage current if a memory size is very large. Power selectors for a memory can help reducing leakage current by switching to a lower supply voltage or even turning off when a portion of memory is not in use. FIG. 18(c) shows a portion of memory 85 with an internal power supply VDDP coupled to an external supply VDDPP and a core logic supply VDD through power selectors 83 and 84. VDDP can even be coupled to ground by an NMOS pulldown device 81 to disable this portion of memory 85, if this portion of memory is temporarily not in use.

Figure 19A:
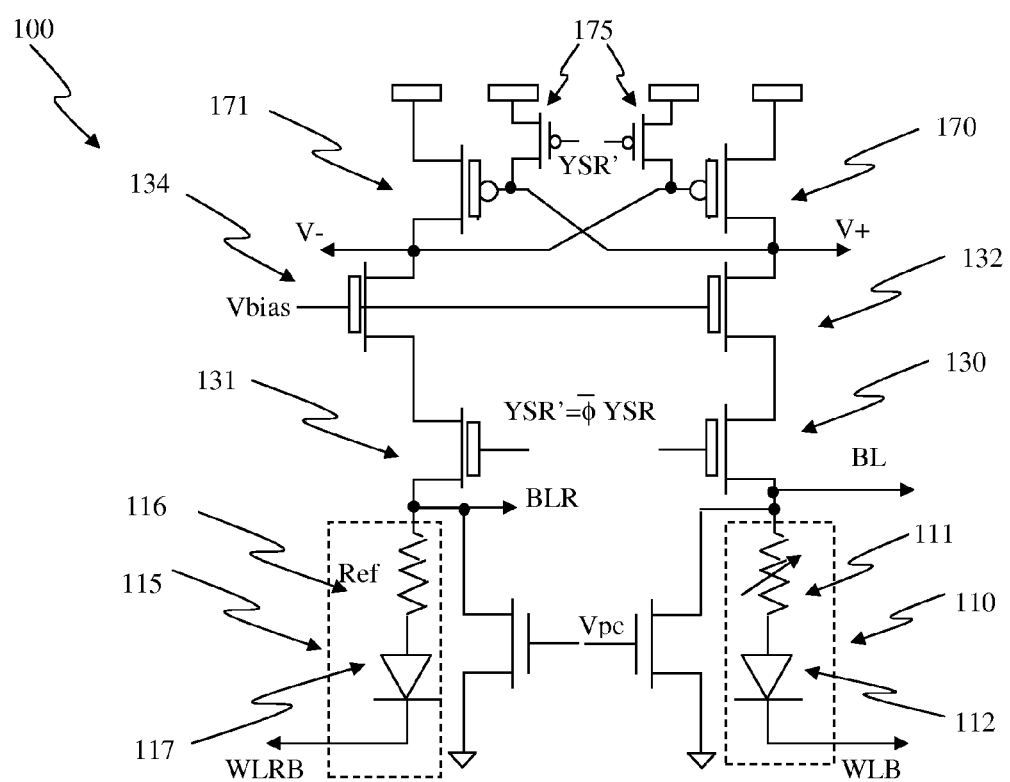
FIG. 19(a) shows one embodiment of a schematic of a pre-amplifier according to one embodiment.
Figure 19B:
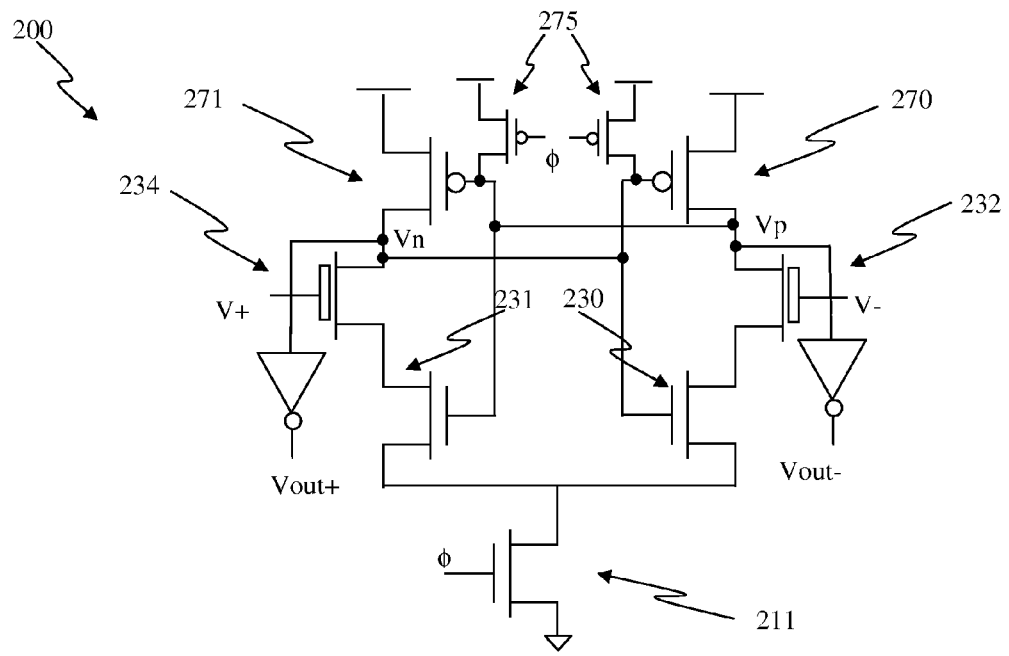
FIG. 19(b) shows one embodiment of a schematic of an amplifier according to one embodiment.
Figure 20A:
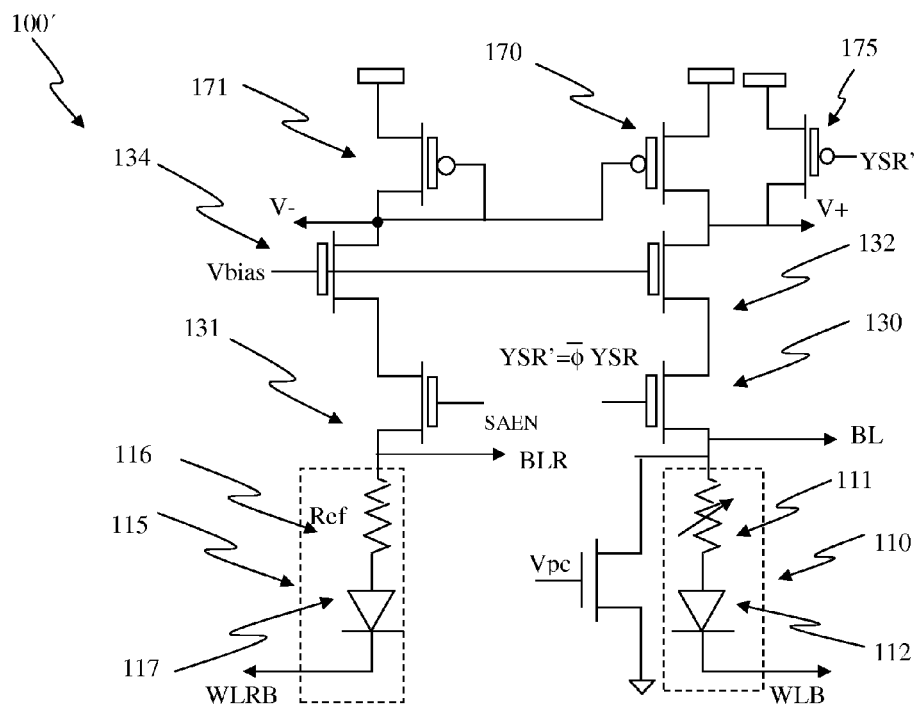
FIG. 20(a) shows another embodiment of a pre-amplifier, similar to the pre-amplifier in FIG. 18(a).

FIGS. 19(a) and 20(a) only show two of many pre-amplifier embodiments. Similarly, FIGS. 19(b), 20(b) and 20(c) only show several of many amplifier and level shifter embodiments. Various combinations of pre-amplifiers, level shifters, and amplifiers in core logic or I/O devices can be constructed differently, separately or mixed.

FIG. 19(a) shows one embodiment of a schematic of a pre-amplifier 100 according to one embodiment. The pre-amplifier 100 needs special considerations because the supply voltage VDD for core logic devices is about 1.0V that does not have enough head room to turn on a diode to make sense amplifiers functional, considering a diode's threshold is about 0.7V. One embodiment is to use another supply VDDR, higher than VDD, to power at least the first stage of sense amplifiers. The programmable resistive cell 110 shown in FIG. 19(a) has a resistive element 111 and a diode 112 as program selector, and can be selected for read by asserting YSR' to turn on a gate of a NMOS 130 (NMOS device) and wordline bar WLB. The pre-amplifier 100 also has a reference cell 115 including a reference resistive element 116 and a reference diode 117. The reference cell 115 can be selected for differential sensing by asserting YSR' to turn on a gate of a NMOS 131 and reference wordline WLRB. The resistance Ref of the reference resistive element 116 can be set at a resistance half-way between minimum of state 1 and maximum of state 0 resistance.

The drains of NMOS 130 and 131 are coupled to sources of NMOS 132 and 134, respectively. The gates of 132 and 134 are biased at a fixed voltage Vbias. The channel width to length ratios of NMOS 132 and 134 can be relatively large to clamp the voltage swings of bitline BL and reference bitline BLR, respectively. The drain of NMOS 132 and 134 are coupled to drains of PMOS 170 and 171, respectively. The drain of PMOS 170 is coupled to the gate of PMOS 171 and the drain of PMOS 171 is coupled to the gate of PMOS 170. The outputs V+ and V− of the pre-amplifier 100 are drains of PMOS 170 and PMOS 171 respectively. The sources of PMOS 170 and PMOS 171 are coupled to a read supply voltage VDDR. The outputs V+ and V− are pulled up by a pair of PMOS 175 to VDDR when the pre-amplifier 100 is disabled. VDDR is about 2-3V (which is higher than about 1.0V VDD of core logic devices) to turn on the diode selectors 112 and 117 in the programmable resistive cell 110 and the reference cell 115, respectively. The CMOS 130, 131, 132, 134, 170, 171, and 175 can be embodied as thick-oxide I/O devices to sustain high voltage VDDR. In another embodiment, the read selectors 130 and 131 can be PMOS devices.

FIG. 19(b) shows one embodiment of a schematic of an amplifier 200 according to one embodiment. In another embodiment, the outputs V+ and V− of the pre-amplifier 100 in FIG. 19(a) can be coupled to gates of NMOS 234 and 232, respectively, of the amplifier 200. The NMOS 234 and 232 can be relatively thick oxide I/O devices to sustain the high input voltage V+ and V− from a pre-amplifier. The sources of NMOS 234 and 232 are coupled to drains of NMOS 231 and 230, respectively. The sources of NMOS 231 and 230 are coupled to a drain of an NMOS 211. The gate of NMOS 211 is coupled to a clock φ to turn on the amplifier 200, while the source of NMOS 211 is coupled to ground. The drains of NMOS 234 and 232 are coupled to drains of PMOS 271 and 270, respectively. The sources of PMOS 271 and 270 are coupled to a core logic supply VDD. The gates of PMOS 271 and NMOS 231 are connected and coupled to the drain of PMOS 270, as a node Vp. Similarly, the gates of PMOS 270 and NMOS 230 are connected and coupled to the drain of PMOS 271, as a node Vn. The nodes Vp and Vn are pulled up by a pair of PMOS 275 to VDD when the amplifier 200 is disabled when φ goes low. The output nodes Vout+ and Vout− are coupled to nodes Vn and Vp through a pair of inverters as buffers.

Figure 19C:
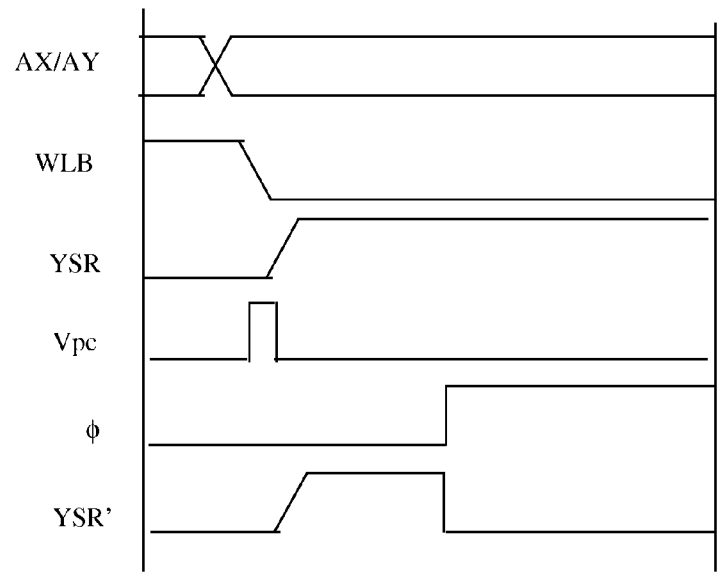
FIG. 19(c) shows a timing diagram of the pre-amplifier and the amplifier in FIGS. 19(a) and 19(b), respectively.

FIG. 19(c) shows a timing diagram of the pre-amplifier 100 and the amplifier 200 in FIGS. 19(a) and 19(b), respectively. The X- and Y-addresses AX/AY are selected to read a cell. After some propagation delays, a cell is selected for read by turning WLB low and YSR high to thereby select a row and a column, respectively. Before activating the pre-amplifier 100, a pulse Vpc is generated to precharge DL and DLR to ground. The pre-amplifier 100 would be very slow if the DL and DLR voltages are high enough to turn off the cascode devices (e.g., NMOS 132 and 134). After the pre-amplifier outputs V+ and V− are stabilized, the clock φ is set high to turn on the amplifier 200 and to amplify the final output Vout+ and Vout− into full logic levels.

FIG. 20(a) shows another embodiment of a pre-amplifier 100', similar to the pre-amplifier 100 in FIG. 18(a). The reference branch is turned on by a level signal to enable a sense amplifier, SAEN, rather than cycle by cycle in FIG. 19(a). The PMOS pull-ups 171 and 170 in FIG. 20(a) are configured as current mirror loads, rather than a pair of cross-coupled PMOS in FIG. 19(a). In this embodiment, the number of the reference branches can be shared at the expense of increasing power consumption.

Figure 20B:
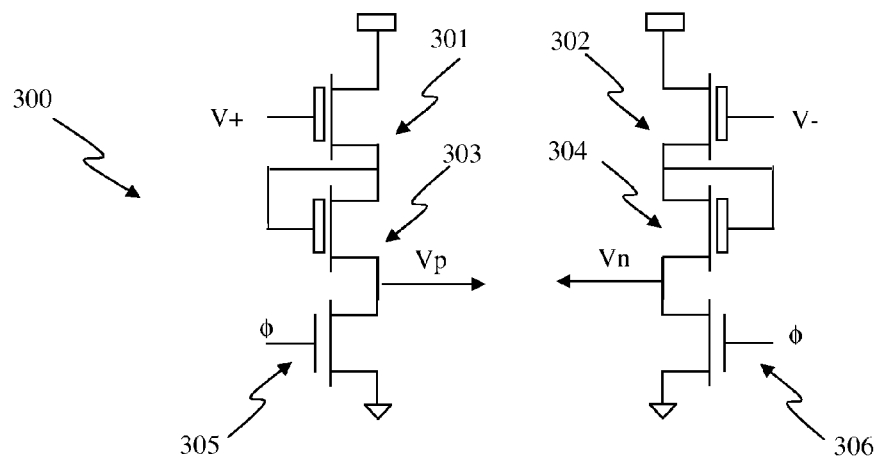
FIG. 20(b) shows level shifters according to one embodiment.

FIG. 20(b) shows level shifters 300 according to one embodiment. The V+ and V− from the pre-amplifier 100, 100' outputs in FIG. 19(a) or FIG. 20(a) are coupled to gates of NMOS 301 and 302, respectively. The drains of NMOS 301 and 302 are coupled to a supply voltage VDDR. The sources of NMOS 301 and 302 are coupled to drains of NMOS 303 and 304, respectively, which have gates and drains connected as diodes to shift the voltage level down by one Vtn, the threshold voltage of an NMOS. The sources of NMOS 303 and 304 are coupled to pulldown devices NMOS 305 and 306, respectively. The gates of NMOS 305 and 306 can be turned on by a clock φ. The NMOS 301, 302, 303 and 304 can be thick-oxide I/O devices to sustain high voltage VDDR. The NMOS 303 and 304 can be cascaded more than once to shift V+ and V− further to proper voltage levels Vp and Vn. In another embodiment, the level shifting devices 303 and 304 can be built using PMOS devices.

Figure 20C:
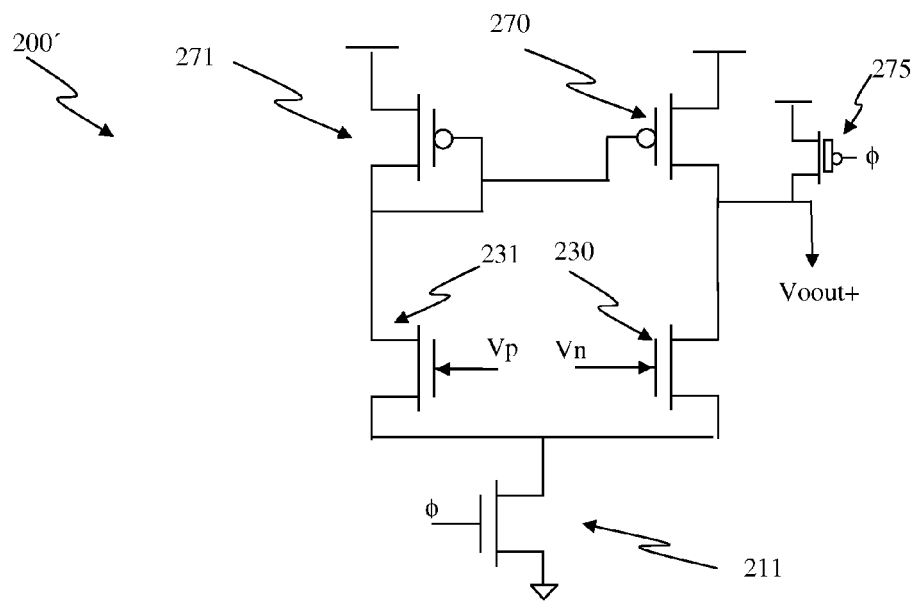
FIG. 20(c) shows another embodiment of an amplifier with current-mirror loads.

FIG. 20(c) shows another embodiment of an amplifier 200' with current-mirror loads having PMOS 270 and 271. The inputs Vp and Vn of the amplifier 200' are from the outputs Vp and Vn of the level shifter 300 in FIG. 20(b) can be coupled to gates of NMOS 231 and 230, respectively. The drains of NMOS 231 and 230 are coupled to drains of NMOS 271 and 270 which provide current-mirror loads. The drain and gate of PMOS 271 are connected and coupled to the gate of PMOS 270. The sources of NMOS 231 and 230 are coupled to the drain of an NMOS 211, which has the gate coupled to a clock signal φ and the source to ground. The clock signal φ enables the amplifier 200. The drain of PMOS 270 provides an output Vout+. The PMOS pullup 275 keeps the output Vout+ at logic high level when the amplifier 200' is disabled.

Figure 21A:
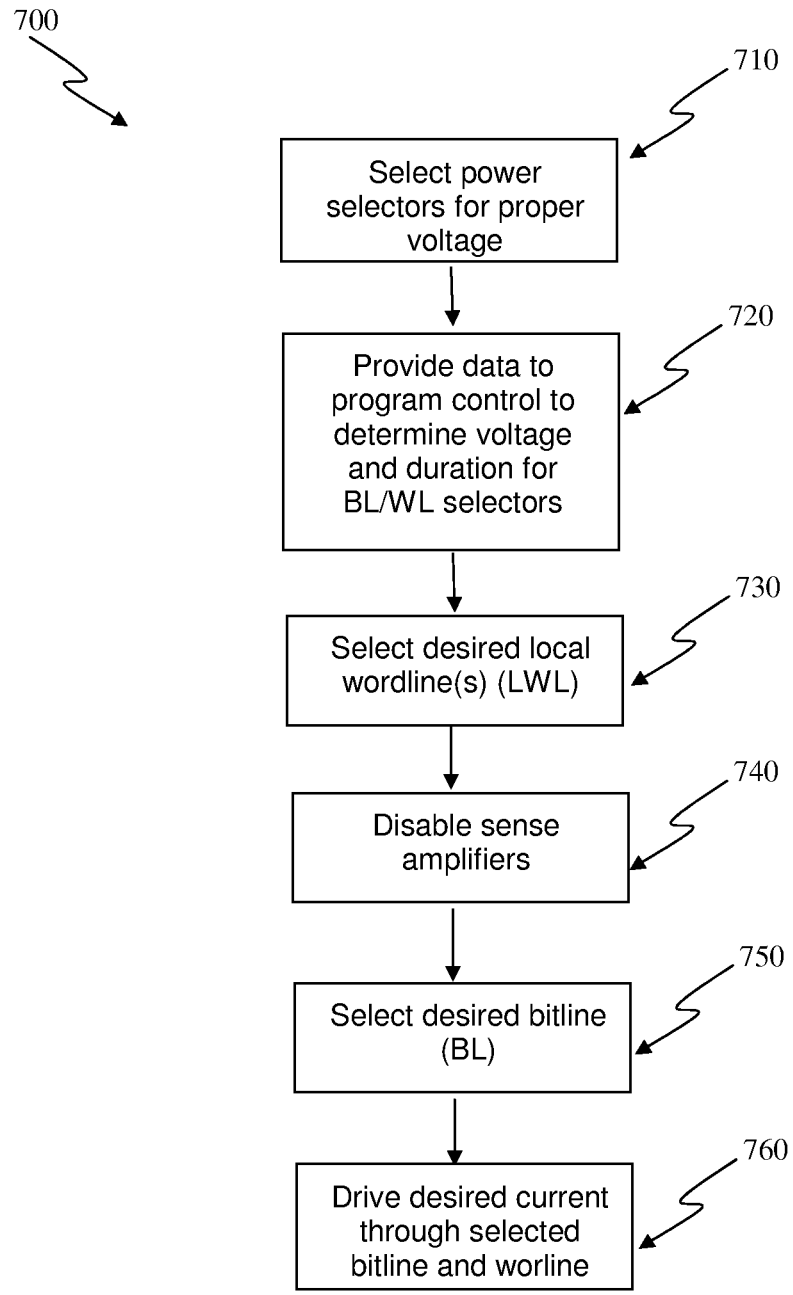
FIG. 21(a) depicts a method of programming a programmable resistive memory in a flow chart according to one embodiment.
Figure 21B:
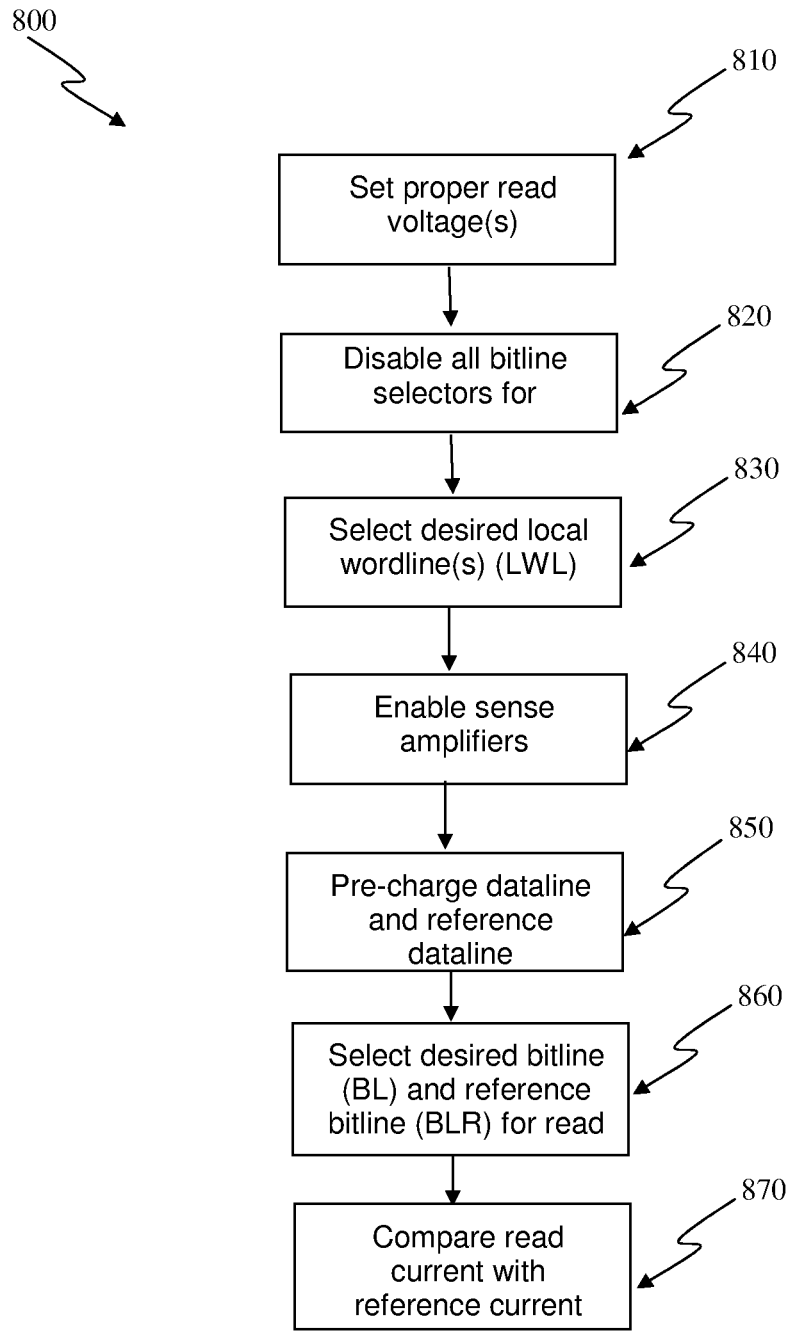
FIG. 21(b) depicts a method of reading a programmable resistive memory in a flow chart according to one embodiment.

FIGS. 21(a) and 21(b) show a flow chart depicting embodiments of a program method 700 and a read method 800, respectively, for a programmable resistive memory in accordance with certain embodiments. The methods 700 and 800 are described in the context a programmable resistive memory, such as the programmable resistive memory 100 in FIGS. 15, 16(a) and 16(c). In addition, although described as a flow of steps, one of ordinary skilled in the art will recognize that at least some of the steps may be performed in a different order, including simultaneously, or skipped.

FIG. 21(a) depicts a method 700 of programming a programmable resistive memory in a flow chart according to one embodiment. In the first step 710, proper power selectors can be selected so that high voltages can be applied to the power supplies of wordline drivers and bitlines. In the second step 720, the data to be programmed in a control logic (not shown in FIGS. 15, 16(a), and 16(b)) can be analyzed, depending on what types of programmable resistive devices. For electrical fuse, this is a One-Time-Programmable (OTP) device such that programming always means blowing fuses into a non-virgin state and is irreversible. Program voltage and duration tend to be determined by external control signals, rather than generated internally from the memory. For PCM, programming into a 1 (to reset) and programming into a 0 (to set) require different voltages and durations such that a control logic determines the input data and select proper power selectors and assert control signals with proper timings. For MRAM, the directions of current flowing through MTJs are more important than time duration. A control logic determines proper power selectors for wordlines and bitlines and assert control signals to ensure a current flowing in the desired direction for desired time. In the third step 730, a cell in a row can be selected and the corresponding local wordline can be turned on. In the fourth step 740, sense amplifiers can be disabled to save power and prevent interference with the program operations. In the fifth step 750, a cell in a column can be selected and the corresponding Y-write pass gate can be turned on to couple the selected bitline to a supply voltage. In the last step 760, a desired current can be driven for a desired time in an established conduction path to complete the program operations. For most programmable resistive memories, this conduction path is from a high voltage supply through a bitline select, resistive element, diode as program selector, and an NMOS pulldown of a local wordline driver to ground. Particularly, for programming a 1 to an MRAM, the conduction path is from a high voltage supply through a PMOS pullup of a local wordline driver, diode as program selector, resistive element, and bitline select to ground.

FIG. 21(b) depicts a method 800 of reading a programmable resistive memory in a flow chart according to one embodiment. In the first step 810, proper power selectors can be selected to provide supply voltages for local wordline drivers, sense amplifiers, and other circuits. In the second step 820, all Y-write pass gates, i.e. bitline program selectors, can be disabled. In the third step 830, desired local wordline(s) can be selected so that the diode(s) as program selector(s) have a conduction path to ground. In the fourth step 840, sense amplifiers can be enabled and prepared for sensing incoming signals. In the fifth step 850, the dataline and the reference dataline can be pre-charged to the V− voltage of the programmable resistive device cell. In the sixth step 860, the desired Y-read pass gate can be selected so that the desired bitline is coupled to an input of the sense amplifier. A conduction path is thus established from the bitline to the resistive element in the desired cell, diode(s) as program selector(s), and the pulldown of the local wordline driver(s) to ground. The same applies for the reference branch. In the last step 870, the sense amplifiers can compare the read current with the reference current to determine a logic output of 0 or 1 to complete the read operations.

Figure 22:
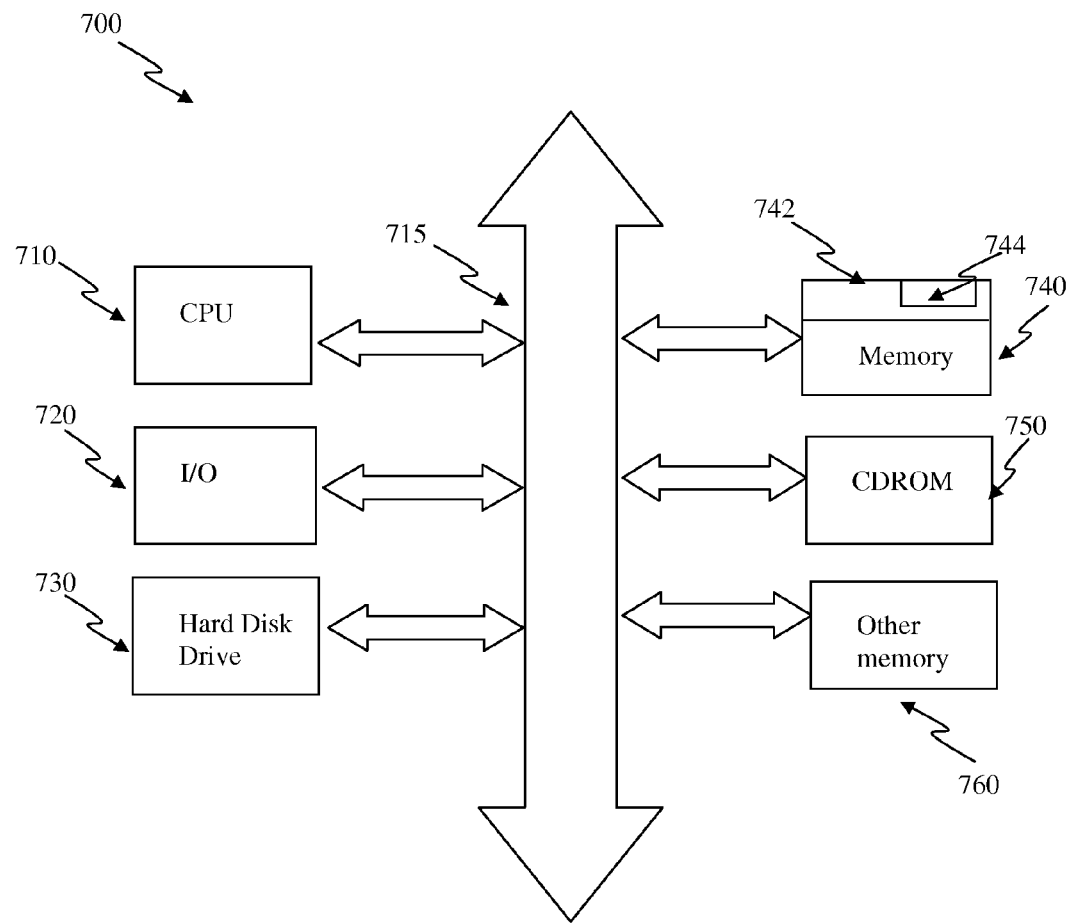
FIG. 22 shows a processor system according to one embodiment.

FIG. 22 shows a processor system 700 according to one embodiment. The processor system 700 can include a programmable resistive device 744, such as in a cell array 742, in memory 740, according to one embodiment. The processor system 700 can, for example, pertain to a computer system. The computer system can include a Central Process Unit (CPU) 710, which communicate through a common bus 715 to various memory and peripheral devices such as I/O 720, hard disk drive 730, CDROM 750, memory 740, and other memory 760. Other memory 760 is a conventional memory such as SRAM, DRAM, or flash, typically interfaces to CPU 710 through a memory controller. CPU 710 generally is a microprocessor, a digital signal processor, or other programmable digital logic devices. Memory 740 is preferably constructed as an integrated circuit, which includes the memory array 742 having at least one programmable resistive device 744. The memory 740 typically interfaces to CPU 710 through a memory controller. If desired, the memory 740 may be combined with the processor, for example CPU 710, in a single integrated circuit.

Embodiments of the invention can be implemented in a part or all of an integrated circuit in a Printed Circuit Board (PCB), or in a system. The programmable resistive device can be fuse, anti-fuse, or emerging nonvolatile memory. The fuse can be silicided or non-silicided polysilicon fuse, metal fuse, contact fuse, or via fuse. The anti-fuse can be a gate-oxide breakdown anti-fuse, contact or via anti-fuse with dielectrics in-between. The emerging nonvolatile memory can be Magnetic RAM (MRAM), Phase Change Memory (PCM), Conductive Bridge RAM (CBRAM), or Resistive RAM (RRAM). Though the program mechanisms are different, their logic states can be distinguished by different resistance values.

The above description and drawings are only to be considered illustrative of exemplary embodiments, which achieve the features and advantages of the present invention. Modifications and substitutions of specific process conditions and structures can be made without departing from the spirit and scope of the present invention.

The many features and advantages of the present invention are apparent from the written description and, thus, it is intended by the appended claims to cover all such features and advantages of the invention. Further, since numerous modifications and changes will readily occur to those skilled in the art, it is not desired to limit the invention to the exact construction and operation as illustrated and described. Hence, all suitable modifications and equivalents may be resorted to as falling within the scope of the invention.

What is claimed is:

1. A One-Time Programmable (OTP) memory, comprising:
   a plurality of OTP cells, each including an OTP element and a diode as program selector constructed from a polysilicon structure having a first terminal from a first region with a first type of dopant, and a second terminal from a second region with a second type of dopant, the first terminal of the diode being coupled to a first terminal of the OTP element, the OTP element being programmable by conducting a current flowing through the OTP element and the diode;
   a plurality of local wordlines, each coupled to a plurality of the OTP cells via the second terminal of the diodes and having a first resistivity;
   a plurality of global wordlines, each coupled to at least one of the local wordlines and having a second resistivity; and
   a plurality of bitlines, each coupled to a plurality of the OTP cells via a second terminal of the OTP element.

2. A OTP memory as recited in claim 1, wherein the OTP element is an electrical fuse constructed from a CMOS gate.

3. A OTP memory as recited in claim 1, wherein the OTP element is an electrical fuse constructed from a polysilicon or silicided polysilicon.

4. A OTP memory as recited in claim 3, wherein the OTP element is built on the polysilicon structure of the diode.

5. A OTP memory as recited in claim 1, wherein the OTP element is an electrical fuse constructed from at least silicide, metal, or metal alloy.

6. A OTP memory as recited in claim 1, wherein the OTP element is a conductive contact or via.

7. A OTP memory as recited in claim 1, wherein the local wordline is at least partially formed of polysilicon.

8. A OTP memory as recited in claim 1, wherein the global wordline is constructed of metal.

9. A OTP memory as recited in claim 1, wherein the global wordline is coupled to the local wordline through at least one of conductive via or contact.

10. A OTP memory as recited in claim 1, wherein the bitline is coupled to a first supply voltage and the global wordline is coupled to a second supply voltage during program or read, and wherein the voltage between the first and the second supply voltages has a larger magnitude and longer duration for program than read.

11. A OTP memory as recited in claim 1, wherein the OTP memory further comprises:
    a plurality of write bitline selectors to select at least one of the bitlines coupled to a first supply voltage line; and
    a plurality of wordline drivers to select at least one of the local wordlines coupled to a second supply voltage line to conduct a current during program of the at least one of the OTP cells.

12. A OTP memory as recited in claim 1, wherein the OTP memory further comprises:
    a plurality of read bitline selectors to select at least one of the bitlines coupled to a sense amplifier; and
    a plurality of wordline drivers to select at least one of the local wordlines coupled to a supply voltage to conduct a current through the sense amplifier during read of the at least one of the OTP cells.

13. A One-Time Programmable (OTP) memory, comprising:
    a plurality of OTP cells, each including (i) a polysilicon segment as OTP element, and (ii) a diode as program selector constructed from a polysilicon structure having a first terminal from a first region with a first type of dopant, and a second terminal from a second region with a second type of dopant, the first terminal of the diode being coupled to a first terminal of the OTP element, the OTP element being programmable by conducting a current flowing through the OTP element and the diode, the polysilicon segment being formed in or on the polysilicon structure;
    a plurality of local wordlines, each coupled to a plurality of the OTP cells via the second terminal of the diodes and having a first resistivity;
    a plurality of global wordlines, each coupled to at least one of the local wordlines and having a second resistivity; and
    a plurality of bitlines, each coupled to a plurality of the OTP cells via a second terminal of the OTP element.

14. A OTP memory as recited in claim 13, wherein polysilicon is a silicided polysilicon.

15. A OTP memory as recited in claim 13, wherein the local wordline is at least partially formed of polysilicon.

16. A OTP memory as recited in claim 13, wherein the global wordline is a metal.

17. An electronics system, comprising:
a processor; and
at least one OTP memory operatively connected to the processor, the OTP memory comprising:
- a plurality of OTP cells, each including an OTP element and a diode as program selector constructed from a polysilicon structure having a first terminal from a first region with a first type of dopant, and a second terminal from a second region with a second type of dopant, the first terminal of the diode being coupled to a first terminal of the OTP element, the OTP element being programmable by conducting a current flowing through the OTP element and the diode;
- a plurality of local wordlines, each coupled to a plurality of the OTP cells via the second terminal of the diodes and having a first resistivity;
- a plurality of global wordlines, each coupled to at least one of the local wordlines and having a second resistivity; and
- a plurality of bitlines, each coupled to a plurality of the OTP cells via a second terminal of the OTP element.

18. A method for operating an OTP memory, comprising:
providing a plurality of OTP cells, each including an OTP element and a diode as program selector constructed from a polysilicon structure having a first terminal from a first region with a first type of dopant and a second terminal from a second region with a second type of dopant, the first terminal of the diode being coupled to the first terminal of the OTP element, the OTP element being programmable by conducting a current flowing through the OTP element and the program selector;
providing a plurality of local wordlines, each coupled to a plurality of the OTP cells via the second terminal of the diodes and having a first resistivity;
providing a plurality of global wordlines, each coupled to at least one of the local wordlines and having a second resistivity;
providing a plurality of bitlines, each coupled to a plurality of the OTP cells via a second terminal of the OTP element; and
programming at least one selected OTP cell into a different logic state by applying voltages to a selected one of the global wordlines and a selected one of the bitlines to conduct a current and change the resistance of the selected OTP cell.

19. A method as recited in claim 18, wherein the OTP element is an electrical fuse constructed from a CMOS gate.

20. A memory cell as recited in claim 18, wherein the OTP element is built on the polysilicon structure of the diode.

21. A memory cell as recited in claim 18, wherein the OTP element is an anti-fuse constructed from one or more contacts or vias with dielectrics in between.

* * * * *